(12) United States Patent
Saitoh

(10) Patent No.: US 8,648,975 B2
(45) Date of Patent: Feb. 11, 2014

(54) LIQUID CRYSTAL DISPLAY DEVICE WITH POTENTIAL VARYING CAPACITANCE ELECTRODE

(75) Inventor: Yuhichi Saitoh, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/699,369

(22) PCT Filed: Apr. 12, 2011

(86) PCT No.: PCT/JP2011/059100
§ 371 (c)(1),
(2), (4) Date: Nov. 21, 2012

(87) PCT Pub. No.: WO2012/005038
PCT Pub. Date: Jan. 12, 2012

(65) Prior Publication Data
US 2013/0069921 A1    Mar. 21, 2013

(30) Foreign Application Priority Data

Jul. 9, 2010   (JP) .................................. 2010-156373

(51) Int. Cl.
*G02F 1/1343* (2006.01)
*G02F 1/136* (2006.01)
*G09G 3/36* (2006.01)
*H01L 29/04* (2006.01)

(52) U.S. Cl.
USPC ................... 349/39; 349/38; 349/42; 349/43; 345/92; 257/59; 257/72

(58) Field of Classification Search
USPC .......... 349/38–39, 41–43; 345/92; 257/59, 72
See application file for complete search history.

(56) References Cited

U.S. PATENT DOCUMENTS 8,004,626 B2 *   8/2011   Ting et al. ........................ 349/48
8,035,767 B2 *  10/2011   Kim et al. ........................ 349/48

(Continued)

FOREIGN PATENT DOCUMENTS

JP    2001-305511 A    10/2001
JP    2008-033218 A     2/2008

(Continued)

OTHER PUBLICATIONS

Official Communication issued in International Patent Application No. PCT/JP2011/059100, mailed on Jun. 21, 2011.

*Primary Examiner* — Hoan C Nguyen
(74) *Attorney, Agent, or Firm* — Keating & Bennett, LLP

(57) ABSTRACT

In a liquid crystal display device in which one pixel is divided into the plurality of subpixels, a narrow picture-frame is realized by decreasing a wiring region without reducing a display quality. One of two sub-pixel portions includes a second transistor (TB) having a gate connected to a first scanning signal line (GL) and having a source connected to a data signal line (SL), a pixel electrode (EB) connected to a drain of the second transistor (TB), a liquid crystal capacitance (ClcB) formed by a common electrode (41) and the pixel electrode (EB), a third transistor (TC) having a gate connected to a second scanning signal line (G2L) and having a source connected to a line SEL, a capacitance electrode (EC) connected to a drain of the third transistor (TC), and a capacitance (Cl) formed by the pixel electrode (EB) and the capacitance electrode (EC). A high potential and a low potential are alternately provided to the line SEL for each one frame. The second scanning signal line (G2L) is selected after the first scanning signal line (GL) is selected.

21 Claims, 49 Drawing Sheets

(56) References Cited

U.S. PATENT DOCUMENTS

| | | |
|---|---|---|
| 2008/0024689 A1* | 1/2008 | Ahn ............................ 349/43 |
| 2008/0055292 A1 | 3/2008 | Do et al. |
| 2008/0062108 A1 | 3/2008 | Kim |
| 2008/0297676 A1 | 12/2008 | Kimura |
| 2009/0268112 A1 | 10/2009 | Lu et al. |

FOREIGN PATENT DOCUMENTS

| | | |
|---|---|---|
| JP | 2008-058941 A | 3/2008 |
| JP | 2008-065334 A | 3/2008 |
| JP | 2008-287032 A | 11/2008 |
| JP | 2009-265615 A | 11/2009 |
| JP | 2010-039205 A | 2/2010 |

* cited by examiner

LIQUID CRYSTAL DISPLAY DEVICE WITH POTENTIAL VARYING CAPACITANCE ELECTRODE

TECHNICAL FIELD

The present invention relates to a liquid crystal display device, and particularly relates to a liquid crystal display device having a configuration in which one pixel is divided into a plurality of sub pixels to improve a viewing angle characteristic.

BACKGROUND ART

As one of drive methods of a liquid crystal display device, there is conventionally known a method (hereinafter, "pixel division method") of "configuring one pixel by a plurality of (typically two) sub pixels, and driving a liquid crystal such that brightness of the plurality of sub pixels becomes mutually different brightness". This pixel division method is a method employed to improve a viewing angle characteristic of the liquid crystal display device.

FIG. 49 is a diagram schematically showing an example of a circuit configuration of a conventional liquid crystal display device that employs a pixel division method. As shown in FIG. 49, a pixel formation portion 93 forming one pixel is configured by two sub-pixel portions (a first sub-pixel portion 94 and a second sub-pixel portion 95). Both of the sub-pixel portions (94, 95) include transistors (T1, T2) having gate electrodes connected to a scanning signal line GL and having source electrodes connected to a data signal line SL; pixel electrodes (E1, E2) connected to drain electrodes of the transistors (T1, T2); liquid crystal capacitances (Clc1, Clc2) formed by a common electrode 41 to which a constant potential COM is provided as a counter electrode and the pixel electrodes (E1, E2); and holding capacitances (Ccs1, Ccs2) formed by the pixel electrodes (E1, E2) and holding capacitance lines (CS1, CS2). In this configuration, when the scanning signal line GL becomes in a selection state, the transistors T1, T2 become in an on state. Since the source electrode of the transistor T1 and the source electrode of the transistor T2 are connected to the same data signal line SL, a potential of the pixel electrode E1 in the first sub-pixel portion 94 and a potential of the pixel electrode E2 in the second sub-pixel portion 95 become equal. Thereafter, when a potential of one of the holding capacitance lines CS1, CS2 is increased and when a potential of the other holding capacitance line is decreased, the potential of the pixel electrode E1 and the potential of the pixel electrode E2 vary in mutually opposite directions. As a result, the potential of the pixel electrode E1 and the potential of the pixel electrode E2 become mutually different, and brightness of the first sub-pixel portion 94 and brightness of the second sub-pixel portion 95 become mutually different.

FIG. 50 is an equivalent circuit diagram of another conventional liquid crystal display device that employs a pixel division method. As shown in FIG. 50, in this liquid crystal display device, a pixel formation portion 96 is also configured by two sub-pixel portions (a first sub-pixel portion 97 and a second sub-pixel portion 98). Both of the sub-pixel portions (97, 98) include the transistors (T1, T2), the pixel electrodes (E1, E2), the liquid crystal capacitances (Clc1, Clc2), and the holding capacitances (Ccs1, Ccs2), as common constituent elements, in a similar manner to that of the example shown in FIG. 49. In this case, the second sub-pixel portion 98 further includes a transistor T3 having a gate electrode connected to a second scanning signal line G2L and having a source electrode connected to the pixel electrode E2, a capacitance electrode E3 connected to a drain electrode of the transistor T3, and a capacitance Ccs3 formed by the capacitance electrode E3 and the holding capacitance line CS2. In this configuration, when the scanning signal line GL becomes in a selection state, a potential of the pixel electrode E1 in the first sub-pixel portion 97 and a potential of the pixel electrode E2 in the second sub-pixel portion 98 become equal. Thereafter, when the second scanning signal line G2L becomes in a selection state, the transistor T3 becomes in an on state. Accordingly, a charge shifts between the pixel electrode E2 and the capacitance electrode E3, and the potential of the pixel electrode E2 varies. As a result, the potential of the pixel electrode E1 and the potential of the pixel electrode E2 become mutually different, and brightness of the first sub-pixel portion 97 and brightness of the second sub-pixel portion 98 become mutually different.

PRIOR ART DOCUMENTS

Patent Documents

[Patent Document 1] Japanese Patent Application Laid-Open Publication No. 2008-33218
[Patent Document 2] Japanese Patent Application Laid-Open Publication No. 2008-58941
[Patent Document 3] Japanese Patent Application Laid-Open Publication No. 2008-65334

SUMMARY OF THE INVENTION

Problems to be Solved by the Invention

According to the configuration shown in FIG. 49, a predetermined number (typically 12) of holding-capacitance line trunks are formed in a peripheral region of a display panel, and holding capacitance lines arranged in a display region are collected in the holding-capacitance line trunks in the peripheral region. In the case of sharing the holding capacitance lines CS1, CS2 between pixels adjacent in a vertical direction in the figure, specifically 1080 holding capacitance lines are provided in a liquid crystal display device that has 1080 scanning signal lines GL, and the 1080 holding capacitance lines are collected in 12 holding-capacitance line trunks, for example, in the peripheral region. Incidentally, a size of a load capacitance of one holding-capacitance line trunk becomes a sum of a capacitance formed by the holding-capacitance line trunk and other electrodes and lines, and a capacitance formed by holding capacitance lines that are connected to the holding-capacitance line trunk and other electrodes and lines. That is, a size of a load capacitance of one holding-capacitance line trunk greatly depends on the number of holding capacitance lines connected to the holding-capacitance line trunk. Therefore, the load capacitance of the holding-capacitance line trunk becomes large with the increase of the number of holding capacitance lines connected to the holding-capacitance line trunk. To differentiate between a potential of the pixel electrode of the first sub-pixel portion 94 and a potential of the pixel electrode of the second sub-pixel portion 95, alternating current driving is performed as to the holding capacitance lines. That is, alternating current driving is also performed as to the holding-capacitance line trunk. Therefore, especially in a large-type liquid crystal display device, reduction of a display quality may occur due to a delay of a signal potential provided from an outside. In this respect, reduction of a wiring resistance by increasing a width (a wiring pattern width) of the holding-capacitance line trunk can be considered to prevent the delay of the signal potential. However, because a picture-frame size becomes large by increasing the width of the holding-capacitance line trunk, reduction of the size of the device cannot be realized.

According to a configuration shown in FIG. 50, a sufficient display quality cannot be maintained for the following reason. When the second scanning signal line G2L becomes in a selection state, the transistor T3 becomes in an on state, and a charge shifts between the pixel electrode E2 and the capacitance electrode E3. Thereafter, when the transistor T3 becomes in an off state, a potential of the capacitance electrode E3 is held during a period until when the transistor T3 becomes in an on state next. Incidentally, a potential provided to the pixel electrode E2 when the transistor T2 becomes in an on state is different depending on a display image. Therefore, a potential provided to the capacitance electrode E3 when the transistor T3 becomes in an on state is also different depending on a display image. That is, a potential of the capacitance electrode E3 that is held during a period from when the transistor T3 becomes in an off state until when the transistor T3 becomes in an on state is not a constant potential. Therefore, a variation of a potential of the pixel electrode E2 when the transistor T3 becomes in an on state is not constant either. Accordingly, for example, a sufficient potential difference does not occur in some cases between the pixel electrode E1 in the first sub-pixel portion 97 and the pixel electrode E2 in the second sub-pixel portion 98.

An object of the present invention is to realize a narrow picture-frame by decreasing a wiring region without reducing a display quality, in a liquid crystal display device in which one pixel is divided into a plurality of sub pixels.

Means for Solving the Problems

A first aspect of the present invention is directed to a liquid crystal display device in which a pixel formation portion forming one pixel includes a first sub-pixel portion and a second sub-pixel portion, the liquid crystal display device comprising:
a plurality of data signal lines;
a plurality of first scanning signal lines that are provided to cross the plurality of data signal lines, and are selectively driven;
a plurality of the pixel formation portions that are respectively provided to correspond to intersections of the plurality of data signal lines and the plurality of first scanning signal lines, and form a pixel matrix;
a plurality of second scanning signal lines that are provided to correspond to the plurality of first scanning signal lines, and are selectively driven;
a plurality of potential varying capacitance lines; and
a common electrode, wherein
the first sub-pixel portion includes
a first switching element having a first electrode connected to the first scanning signal line and having a second electrode connected to the data signal line, and being in an on state when the first scanning signal line is selected, and
a first pixel electrode connected to a third electrode of the first switching element and laid out such that a capacitance is formed between the first pixel electrode and the common electrode,
the second sub-pixel portion includes
a second switching element having a first electrode connected to the first scanning signal line and having a second electrode connected to the data signal line, and being in an on state when the first scanning signal line is selected,
a second pixel electrode connected to a third electrode of the second switching element and laid out such that a capacitance is formed between the second pixel electrode and the common electrode,
a third switching element having a first electrode connected to the second scanning signal line and having a second electrode connected to one of the potential varying capacitance lines, and being in an on state when the second scanning signal line is selected, and
a potential varying capacitance electrode connected to a third electrode of the third switching element and laid out such that a capacitance is formed between the potential varying capacitance electrode and the second pixel electrode, and
during each frame period, a second scanning signal line corresponding to each row in the pixel matrix is selected after a first scanning signal line corresponding to the each row is selected.

According to a second aspect of the present invention, in the first aspect of the present invention,
a different potential is provided every one frame period to the potential varying capacitance line.

According to a third aspect of the present invention, in the first aspect of the present invention,
the potential varying capacitance line is arranged to extend to a direction parallel with a direction to which the data signal line extends,
the first scanning signal line is arranged to pass between the first pixel electrode and the second pixel electrode in each row in the pixel matrix,
the second scanning signal line is arranged to pass between adjacent two rows in the pixel matrix, and
the first pixel electrode and the second pixel electrode included in a pixel formation portion in each column in the pixel matrix are laid out between the data signal line and the potential varying capacitance line.

According to a fourth aspect of the present invention, in the first aspect of the present invention,
the potential varying capacitance line is arranged to extend to a direction parallel with a direction to which the data signal line extends,
the first scanning signal line and the second scanning signal line are arranged to pass between adjacent two rows in the pixel matrix, and
the first pixel electrode and the second pixel electrode included in a pixel formation portion in each column in the pixel matrix are laid out between the data signal line and the potential varying capacitance line.

According to a fifth aspect of the present invention, in the first aspect of the present invention,
the potential varying capacitance line is arranged to extend to a direction parallel with a direction to which the first scanning signal line extends,
the first scanning signal line is arranged to pass between the first pixel electrode and the second pixel electrode in each row in the pixel matrix,
the second scanning signal line and the potential varying capacitance line are arranged to pass between adjacent two rows in the pixel matrix, and
the first pixel electrode and the second pixel electrode included in a pixel formation portion in each column in the pixel matrix are laid out between adjacent two of the data signal lines.

According to a sixth aspect of the present invention, in the fifth aspect of the present invention, the potential varying capacitance electrode included in a pixel formation portion in each row in the pixel matrix is laid out such that a capacitance is formed between the potential varying capacitance electrode and the first pixel electrode included in a pixel formation portion in the next row of the each row, in each column in the pixel matrix, a data signal line arranged at one side of the each column and a data signal line arranged at the other side in the each column are alternately connected for each one row to the second electrodes of the first switching element and the second switching element in the pixel formation portion, and a second scanning signal line corresponding to each row in the pixel matrix is selected after a first scanning signal line corresponding to the next row of the each row is selected.

According to a seventh aspect of the present invention, in the first aspect of the present invention, the data signal line includes a first data signal line and a second data signal line in each column in the pixel matrix, the potential varying capacitance line is arranged to extend to a direction parallel with a direction to which the first scanning signal line extends, the first scanning signal line is arranged to pass between the first pixel electrode and the second pixel electrode in each row in the pixel matrix, the second scanning signal line and the potential varying capacitance line are arranged to pass between adjacent two rows in the pixel matrix, the first pixel electrode and the second pixel electrode included in a pixel formation portion in each column in the pixel matrix are laid out between the first data signal line and the second data signal line, in each column in the pixel matrix, the first data signal line and the second data signal line are alternately connected for each one row to the second electrodes of the first switching element and the second switching element in the pixel formation portion, the potential varying capacitance electrode included in a pixel formation portion in each row in the pixel matrix is laid out such that a capacitance is formed between the potential varying capacitance electrode and the first pixel electrode included in a pixel formation portion in the next row of the each row, the plurality of first scanning signal lines are sequentially driven for each one set by using two first scanning signal lines as one set, and two second scanning signal lines corresponding to two first scanning signal lines that constitute each one set are selected after two first scanning signal lines that constitute a set which is driven next to the each set are selected.

According to an eighth aspect of the present invention, in the first aspect of the present invention, the potential varying capacitance line includes a first potential varying capacitance line and a second potential varying capacitance line, the first potential varying capacitance line and the second potential varying capacitance line are provided to alternately correspond to the pixel matrix for each one row or for each one column, a second potential of a relatively low level is provided to the second potential varying capacitance line when a first potential of a relatively high level is provided to the first potential varying capacitance line, and the first potential is provided to the second potential varying capacitance line when the second potential is provided to the first potential varying capacitance line.

According to a ninth aspect of the present invention, in the first aspect of the present invention, the liquid crystal display device further comprises a plurality of holding capacitance lines to which a constant potential is provided, wherein in the first sub-pixel portion, a capacitance is formed by the holding capacitance line and the first pixel electrode, and in the second sub-pixel portion, a capacitance is formed by the holding capacitance line and the second pixel electrode.

According to a tenth aspect of the present invention, in the ninth aspect of the present invention, the holding capacitance line is arranged to extend to a direction parallel with a direction to which the data signal line extends.

According to an eleventh aspect of the present invention, in the ninth aspect of the present invention, the holding capacitance line is arranged to extend to a direction parallel with a direction to which the first scanning signal line extends.

According to a twelfth aspect of the present invention, in the tenth aspect of the present invention, the potential varying capacitance line
includes a first potential varying capacitance line and a second potential varying capacitance line, and
is arranged to extend to a direction parallel with a direction to which the data signal line extends, the first potential varying capacitance line and the second potential varying capacitance line are provided to alternately correspond to the pixel matrix for each one column, a second potential of a relatively low level is provided to the second potential varying capacitance line when a first potential of a relatively high level is provided to the first potential varying capacitance line, the first potential is provided to the second potential varying capacitance line when the second potential is provided to the first potential varying capacitance line, the first scanning signal line is arranged to pass between the first pixel electrode and the second pixel electrode in each row in the pixel matrix, the second scanning signal line is arranged to pass between adjacent two rows in the pixel matrix, and the first pixel electrode and the second pixel electrode included in a pixel formation portion in each column in the pixel matrix are laid out between the data signal line and the potential varying capacitance line.

According to a thirteenth aspect of the present invention, in the tenth aspect of the present invention, the potential varying capacitance line
includes a first potential varying capacitance line and a second potential varying capacitance line, and
is arranged to extend to a direction parallel with a direction to which the data signal line extends, the first potential varying capacitance line and the second potential varying capacitance line are provided to alternately correspond to the pixel matrix for each one column, a second potential of a relatively low level is provided to the second potential varying capacitance line when a first potential of a relatively high level is provided to the first potential varying capacitance line, the first potential is provided to the second potential varying capacitance line when the second potential is provided to the first potential varying capacitance line, the first scanning signal line and the second scanning signal line are arranged to pass between adjacent two rows in the pixel matrix, and the first pixel electrode and the second pixel electrode included in a pixel formation portion in each column in the pixel matrix are laid out between the data signal line and the potential varying capacitance line.

According to a fourteenth aspect of the present invention, in the tenth aspect of the present invention, the potential varying capacitance line
includes a first potential varying capacitance line and a second potential varying capacitance line, and
is arranged to extend to a direction parallel with a direction to which the first scanning signal line extends, the first potential varying capacitance line and the second potential varying capacitance line are provided to alternately correspond to the pixel matrix for each one row, a second potential of a relatively low level is provided to the second potential varying capacitance line when a first potential of a relatively high level is provided to the first potential varying capacitance line, the first potential is provided to the second potential varying capacitance line when the second potential is provided to the first potential varying capacitance line, the first scanning signal line is arranged to pass between the first pixel electrode and the second pixel electrode in each row in the pixel matrix, the second scanning signal line and the potential varying capacitance line are arranged to pass between adjacent two rows in the pixel matrix, and the first pixel electrode and the second pixel electrode included in a pixel formation portion in each column in the pixel matrix are laid out between adjacent two of the data signal lines.

According to a fifteenth aspect of the present invention, in the tenth aspect of the present invention, the potential varying capacitance line
includes a first potential varying capacitance line and a second potential varying capacitance line, and
is arranged to extend to a direction parallel with a direction to which the first scanning signal line extends, the first potential varying capacitance line and the second potential varying capacitance line are provided to alternately correspond to the pixel matrix for each one row, a second potential of a relatively low level is provided to the second potential varying capacitance line when a first potential of a relatively high level is provided to the first potential varying capacitance line, the first potential is provided to the second potential varying capacitance line when the second potential is provided to the first potential varying capacitance line, the data signal line includes a first data signal line and a second data signal line in each column in the pixel matrix, the first scanning signal line is arranged to pass between the first pixel electrode and the second pixel electrode in each row in the pixel matrix, the second scanning signal line and the potential varying capacitance line are arranged to pass between adjacent two rows in the pixel matrix, the first pixel electrode and the second pixel electrode included in a pixel formation portion in each column in the pixel matrix are laid out between the first data signal line and the second data signal line, in each column in the pixel matrix, the first data signal line and the second data signal line are alternately connected for each one row to the second electrodes of the first switching element and the second switching element in the pixel formation portion, the potential varying capacitance electrode included in a pixel formation portion in each row in the pixel matrix is laid out such that a capacitance is formed between the potential varying capacitance electrode and the first pixel electrode included in a pixel formation portion in the next row of the each row, the plurality of first scanning signal lines are sequentially driven for each one set by using two first scanning signal lines as one set, and two second scanning signal lines corresponding to two first scanning signal lines that constitute each one set are selected after two first scanning signal lines that constitute a set which is driven next to the each set are selected.

According to a sixteenth aspect of the present invention, in the eleventh aspect of the present invention, the potential varying capacitance line
includes a first potential varying capacitance line and a second potential varying capacitance line, and
is arranged to extend to a direction parallel with a direction to which the data signal line extends, the first potential varying capacitance line and the second potential varying capacitance line are provided to alternately correspond to the pixel matrix for each one row, a second potential of a relatively low level is provided to the second potential varying capacitance line when a first potential of a relatively high level is provided to the first potential varying capacitance line, the first potential is provided to the second potential varying capacitance line when the second potential is provided to the first potential varying capacitance line, the first scanning signal line is arranged to pass between the first pixel electrode and the second pixel electrode in each row in the pixel matrix, the second scanning signal line is arranged to pass between adjacent two rows in the pixel matrix, and the first pixel electrode and the second pixel electrode included in a pixel formation portion in each column in the pixel matrix are laid out between the data signal line and the potential varying capacitance line.

According to a seventeenth aspect of the present invention, in the first aspect of the present invention, the potential varying capacitance line
includes a first potential varying capacitance line and a second potential varying capacitance line, and
is arranged to extend to a direction parallel with a direction to which the first scanning signal line extends, the first potential varying capacitance line and the second potential varying capacitance line are provided to alternately correspond to the pixel matrix for each one row, a second potential of a relatively low level is provided to the second potential varying capacitance line when a first potential of a relatively high level is provided to the first potential varying capacitance line, the first potential is provided to the second potential varying capacitance line when the second potential is provided to the first potential varying capacitance line, the first scanning signal line is arranged to pass between the first pixel electrode and the second pixel electrode in each row in the pixel matrix, the second scanning signal line and the potential varying capacitance line are arranged to pass between adjacent two rows in the pixel matrix, the first pixel electrode and the second pixel electrode included in a pixel formation portion in each column in the pixel matrix are laid out between adjacent two of the data signal lines, the potential varying capacitance electrode included in a pixel formation portion in each row in the pixel matrix is laid out such that a capacitance is formed between the potential varying capacitance electrode and the first pixel electrode included in a pixel formation portion in the next row of the each row, in each column in the pixel matrix, a data signal line arranged at one side of the each column and a data signal line arranged at the other side in the each column are alternately connected for each one row to the second electrodes of the first switching element and the second switching element in the pixel formation portion, and a second scanning signal line corresponding to each row in the pixel matrix is selected after a first scanning signal line corresponding to the next row of the each row is selected.

According to an eighteenth aspect of the present invention, in the seventeenth aspect of the present invention, the liquid crystal display device further comprises a plurality of holding capacitance lines to which a constant potential is provided, wherein in the first sub-pixel portion, a capacitance is formed by the holding capacitance line and the first pixel electrode, and in the second sub-pixel portion, a capacitance is formed by the holding capacitance line and the second pixel electrode, and the holding capacitance line is arranged to extend to a direction parallel with a direction to which the data signal line extends.

According to a nineteenth aspect of the present invention, in the first aspect of the present invention, the first switching element, the second switching element, and the third switching element are thin-film transistors made of a metal oxide semiconductor.

According to a twentieth aspect of the present invention, in the nineteenth aspect of the present invention, a driving frequency is equal to or higher than 240 Hz.

Effects of the Invention

According to the first aspect of the present invention, in each row that constitutes a pixel matrix, when a first scanning signal line is selected, a first switching element and a second switching element become in an on state. Accordingly, a potential of a first pixel electrode and a potential of a second pixel electrode become substantially equal to a potential of a data signal. That is, the potential of the first pixel electrode and the potential of the second pixel electrode become equal. Thereafter, when a second scanning signal line is selected, a third switching element becomes in an on state. Accordingly, a potential of a potential varying capacitance electrode that is connected to a third electrode of the third switching element varies according to a potential provided to a potential varying capacitance line. Because the second pixel electrode and the potential varying capacitance electrode are capacitance-coupled, the potential of the second pixel electrode also varies due to the variation of the potential of the potential varying capacitance electrode. As a result, the potential of the first pixel electrode and the potential of the second pixel electrode become different potentials. Here, even when the potential varying capacitance line is direct-current driven during each frame period, the potential of the first pixel electrode and the potential of the second pixel electrode can become different potentials as described above. Therefore, even when a width of a line trunk formed in a peripheral region of a display panel is made small, reduction of a display quality attributable to a delay of a signal potential little occurs. Thus, in a liquid crystal display device in which one pixel is divided into the plurality of sub pixels, a narrow picture-frame can be realized by decreasing a wiring region, without reducing a display quality.

According to the second aspect of the present invention, because an effect of a pixel division method is obtained during a whole frame period, a viewing angle characteristic can be improved at the maximum.

According to the third aspect of the present invention, a potential varying capacitance line is arranged to extend to a direction parallel with a direction to which a data signal line extends. Therefore, the data signal line does not cross the potential varying capacitance line, and a load of the data signal line becomes relatively small. As a result, in a liquid crystal display device in which one pixel is divided into the plurality of sub pixels, high-speed driving and a narrow picture-frame by decreasing a wiring region can be realized, without reducing a display quality.

According to the fourth aspect of the present invention, an effect similar to that of the third aspect of the present invention can be obtained.

According to the fifth aspect of the present invention, a potential varying capacitance line is arranged to extend to a direction parallel with a direction to which a first scanning signal line extends. Therefore, the first scanning signal line and a second scanning signal line do not cross the potential varying capacitance line, and loads of the first scanning signal line and the second scanning signal line become relatively small. As a result, reduction of a display quality attributable to a delay of a scanning signal can be suppressed.

According to the sixth aspect of the present invention, a capacitance is formed by a potential varying capacitance electrode in a pixel formation portion in each row in a pixel matrix and a first pixel electrode in a pixel formation portion in the next row of the each row. Further, a second scanning signal line corresponding to each row in the pixel matrix is selected after a first scanning signal line corresponding to the next row of the each row is selected. Therefore, in each row that constitutes a pixel matrix, after a potential of a first pixel electrode and a potential of a second pixel electrode become equal by selection of the first scanning signal line, the potential of the first pixel electrode varies via a capacitance by selection of a second scanning signal line corresponding to a row before the each row. Thereafter, the potential of the second pixel electrode varies by selection of a second scanning signal line corresponding to the each row. Consequently, the potential of the first pixel electrode and the potential of the second pixel electrode become different potentials. Thus, in a liquid crystal display device in which one pixel is divided into the plurality of sub pixels, an effect of viewing angle characteristic improvement can be largely obtained, and a narrow picture-frame can be realized by decreasing a wiring region, without reducing a display quality.

According to the seventh aspect of the present invention, in each pixel formation portion, after a potential of a first pixel electrode and a potential of a second pixel electrode become equal, both the potential of the first pixel electrode and the potential of the second pixel electrode vary, in a similar manner to the sixth aspect of the present invention. Therefore, in a liquid crystal display device in which one pixel is divided into the plurality of sub pixels, an effect of viewing angle characteristic improvement can be largely obtained, and a narrow picture-frame can be realized by decreasing a wiring region, without reducing a display quality. A data signal line includes a first data signal line and a second data signal line. When attention is focused on each column in a pixel matrix, pixel formation portions are alternately connected for each one row to a first data signal line and a second data signal line. Therefore, the number of pixel formation portions to which one data signal line should supply a data signal becomes a half of the number of scanning signal lines provided in the liquid crystal display device. Accordingly, the liquid crystal display device can be operated at a high speed.

According to the eighth aspect of the present invention, a direction of a potential change of a second pixel electrode by selection of a second scanning signal line can be differentiated between adjacent pixel formation portions. Accordingly, reduction of a display quality can be suppressed.

According to the ninth aspect of the present invention, in a liquid crystal display device in which a capacitance (a holding capacitance) is provided to securely hold a charge in a liquid crystal capacitance or to stabilize a field-through voltage, a narrow picture-frame can be realized by decreasing a wiring region, without reducing a display quality.

According to the tenth aspect of the present invention, a data signal line and a holding capacitance line do not cross each other, and a load of the data signal line becomes relatively small. Therefore, in a liquid crystal display device in which one pixel is divided into the plurality of sub pixels and in which a holding capacitance is provided, high-speed driving and a narrow picture-frame by decreasing a wiring region can be realized, without reducing a display quality.

According to the eleventh aspect of the present invention, a first scanning signal line and a second scanning signal line do not cross a holding capacitance line, and loads of the first scanning signal line and the second scanning signal line become relatively small. As a result, reduction of a display quality attributable to a delay of a scanning signal can be suppressed.

According to the twelfth aspect of the present invention, in a liquid crystal display device in which one pixel is divided into the plurality of sub pixels and in which a holding capacitance is provided, an effect similar to that of the third aspect of the present invention can be obtained.

According to the thirteenth aspect of the present invention, in a liquid crystal display device in which one pixel is divided into the plurality of sub pixels and in which a holding capacitance is provided, an effect similar to that of the third aspect of the present invention can be obtained.

According to the fourteenth aspect of the present invention, in a liquid crystal display device in which one pixel is divided into the plurality of sub pixels and in which a holding capacitance is provided, an effect similar to that of the fifth aspect of the present invention can be obtained.

According to the fifteenth aspect of the present invention, in a liquid crystal display device in which one pixel is divided into the plurality of sub pixels and in which a holding capacitance is provided, an effect similar to that of the seventh aspect of the present invention can be obtained.

According to the sixteenth aspect of the present invention, in a liquid crystal display device in which one pixel is divided into the plurality of sub pixels and in which a holding capacitance is provided, an effect similar to that of the first aspect of the present invention can be obtained.

According to the seventeenth aspect of the present invention, an effect similar to that of the sixth aspect of the present invention can be obtained.

According to the eighteenth aspect of the present invention, in a liquid crystal display device in which one pixel is divided into the plurality of sub pixels and in which a holding capacitance is provided, an effect similar to that of the sixth aspect of the present invention can be obtained.

According to the nineteenth aspect of the present invention, because a transistor of high mobility is used for a switching element in a pixel formation portion, in the pixel formation portion, charge to a capacitance is quickly performed. Accordingly reduction of a display quality attributable to a shortage of a charge capacity of a switching element (a transistor) can be suppressed. Further, a size of the switching element (the transistor) can be made small, and a liquid crystal display device can be made further small.

According to the twentieth aspect of the present invention, in a liquid crystal display device in which one pixel is divided into the plurality of sub pixels and high speed driving is performed, a narrow picture-frame can be realized by decreasing a wiring region, without reducing a display quality.

MODES FOR CARRYING OUT THE INVENTION

Embodiments of the present invention will be described below with reference to the accompanying drawings.

0. Introduction

First, a concept common to all embodiments described later will be described. However, as described in a seventh embodiment, holding capacitance lines CSL are not necessarily required to be included.

Figure 1:
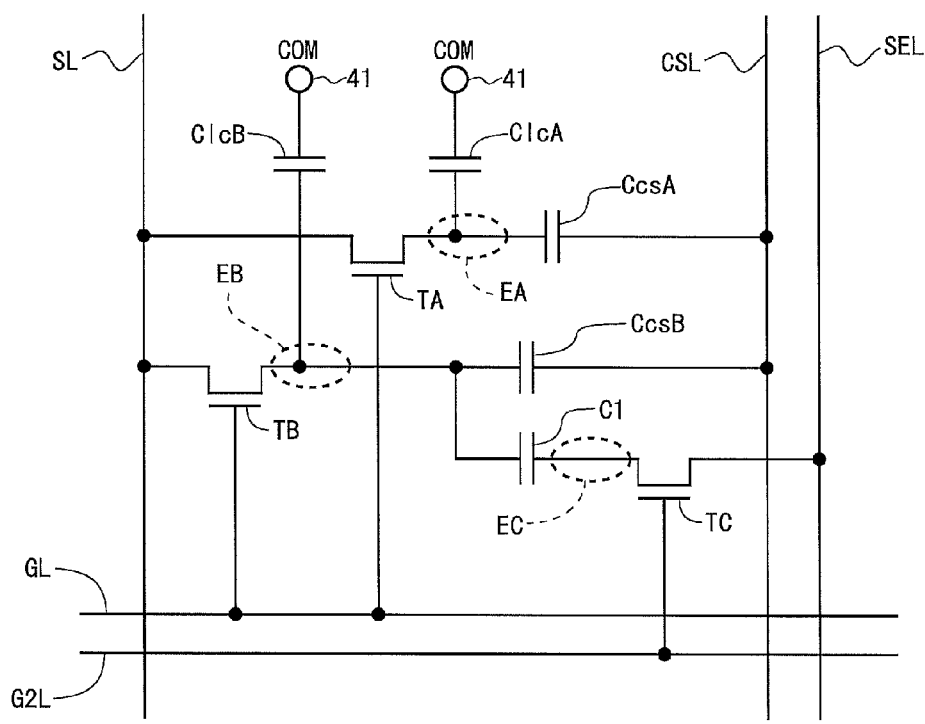
FIG. 1 is an equivalent circuit diagram for describing a concept common to all embodiments of the present invention.

FIG. 1 is an equivalent circuit diagram of each of pixel formation portions. Each pixel formation portion includes two sub-pixel portions (a first sub-pixel portion and a second sub-pixel portion). As constituent elements of the first sub-pixel portion, each pixel formation portion includes a first transistor TA which is a switching element having a gate electrode (a first electrode) connected to a first scanning signal line GL and having a source electrode (a second electrode) connected to a data signal line SL; a pixel electrode EA connected to a drain electrode (a third electrode) of the first transistor TA; a liquid crystal capacitance ClcA formed by a common electrode 41 to which a constant potential COM is provided as a counter electrode and the pixel electrode EA; and a holding capacitance CcsA formed by the pixel electrode EA and the holding capacitance line CSL. As constituent elements of the second sub-pixel portion, each pixel formation portion includes a second transistor TB which is a switching element having a gate electrode connected to the first scanning signal line GL and having a source electrode connected to the data signal line SL; a pixel electrode EB connected to a drain electrode of the second transistor TB, a liquid crystal capacitance ClcB formed by the common electrode 41 and the pixel electrode EB; a holding capacitance CcsB formed by the pixel electrode EB and the holding capacitance line CSL; a third transistor TC which is a switching element having a gate electrode connected to a second scanning signal line G2L and having a source electrode connected to a line SEL; a capacitance electrode EC connected to a drain electrode of the third transistor TC; and a capacitance C1 formed by the pixel electrode EB and the capacitance electrode EC. A constant potential (typically the same potential as the potential COM provided to the common electrode 41) is provided to the holding capacitance line CSL. A potential of a relatively high level and a potential of a relatively low level are provided to the line SEL alternately every one frame period. Note that, hereinafter, a potential that sets transistors each having a gate electrode connected to the first scanning signal line GL or the second scanning signal line G2L to an on state is called a "gate-on potential", and a potential that sets these transistors to an off state is called a "gate-off potential". The line SEL is also called a "potential varying capacitance line", the capacitance electrode EC is also called a "potential varying capacitance electrode", and the capacitance C1 is also called a "potential varying capacitance". The holding capacitance line and the potential varying capacitance line are also collectively called a "capacitance line".

In the above configuration, when a gate-on potential is provided to the first scanning signal line GL, the first transistor TA and the second transistor TB become in an on state. Accordingly, a potential of the pixel electrode EA and a potential of the pixel electrode EB become substantially equal to a potential of the data signal line SL. That is, at this time point, the potential of the pixel electrode EA and the potential of the pixel electrode EB are equal. Thereafter, a gate-off potential is provided to the first scanning signal line GL, and a gate-on potential is provided to the second scanning signal line G2L. Accordingly, the first transistor TA and the second transistor TB become in an off state, and the third transistor TC becomes in an on state. As described above, because a potential of a relatively high level and a potential of a relatively low level are provided to the potential varying capacitance line SEL alternately every one frame period, the potential of the capacitance electrode EC varies by the third transistor TC becoming in an on state. Then, the potential of the pixel electrode EB also varies due to a variation of the potential of the capacitance electrode EC. As a result, the potential of the pixel electrode EA and the potential of the pixel electrode EB become different potentials.

Thus, different potentials are provided to the pixel electrode EA of the first sub-pixel portion and the pixel electrode EB of the second sub-pixel portion. In this case, a constant potential is provided to the holding capacitance line CSL, and a constant potential is provided to the potential varying capacitance line SEL through one frame period. That is, a signal of a high frequency is not provided to the capacitance line. Therefore, reduction of a display quality attributable to a signal delay does not easily occur, and a capacitance line trunk can be realized by a thin width in a peripheral region of a display panel.

In each embodiment, a potential of the common electrode 41 and a potential of the holding capacitance line CSL are constant, however the present invention is not limited thereto. The potential of the common electrode 41 and the potential of the holding capacitance line CSL are not necessarily required to be constant, so long as a desired image display can be realized.

1. First Embodiment

<1.1 Entire Configuration>
<1.1.1 Configuration of Substrate and Others>

Figure 2:
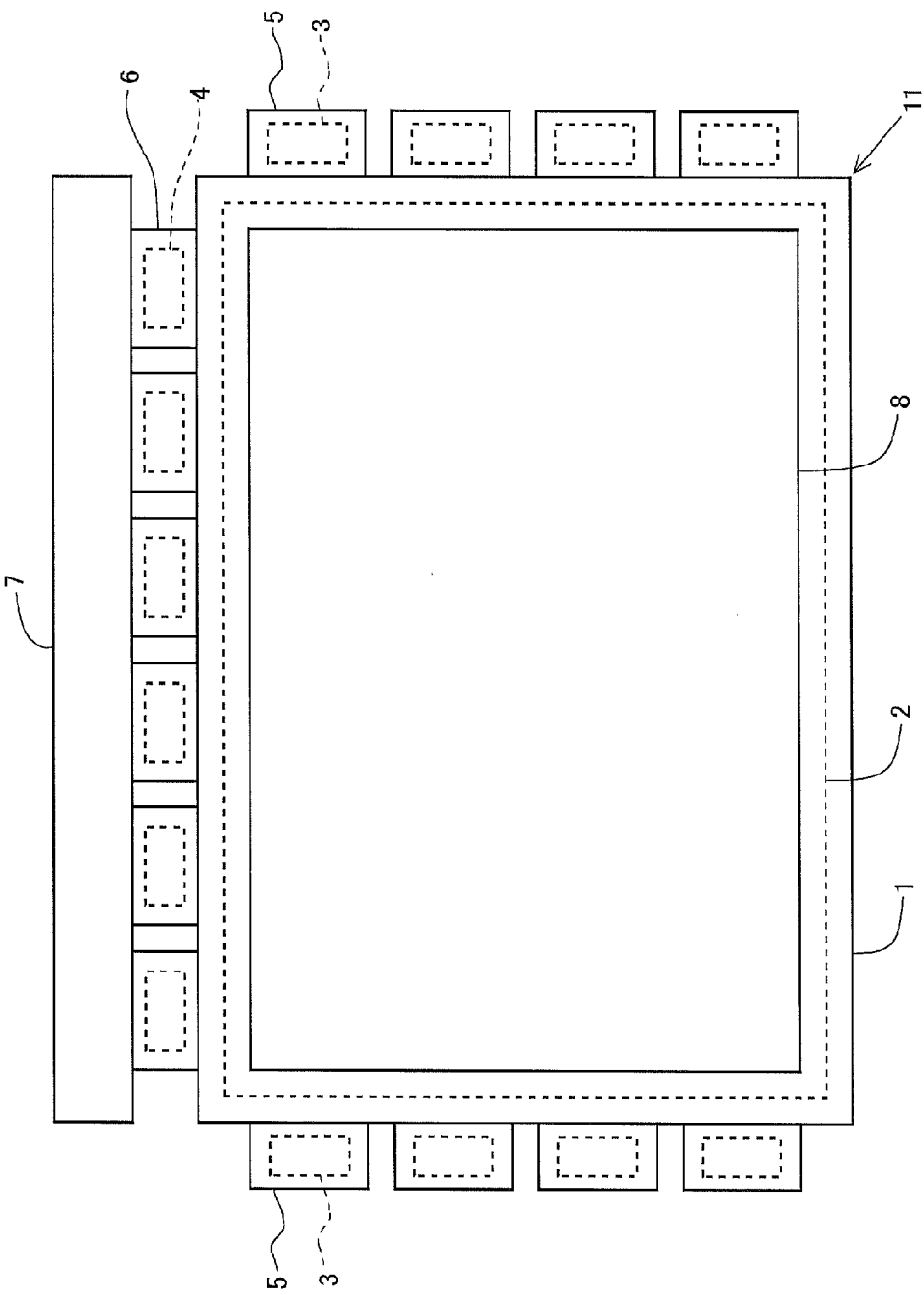
FIG. 2 is a schematic configuration diagram of a liquid crystal display device according to a first embodiment of the present invention.

FIG. 2 is a schematic configuration diagram of a liquid crystal display device according to a first embodiment of the present invention. This liquid crystal display device is configured by an active matrix substrate 1 on which TFTs and pixel electrodes are formed; a counter substrate 2 on which the common electrode 41 for applying a voltage to between the common electrode 41 and pixel electrodes with a liquid crystal layer interposed therebetween and color filters for a color image display are formed; polyimide films 5 on which gate driver ICs 3 are mounted by an SOF (System On Film) system; polyimide films 6 on which source driver ICs 4 are mounted by the SOF system; and an external substrate 7 on which a capacitance line driver and a controller that controls operations of the gate driver ICs 3 and the source driver ICs 4 are provided. A liquid crystal panel 11 that has a display region as shown by a reference character 8 is formed, by bonding the active matrix substrate 1 and the counter substrate 2 together by a sealing material. The polyimide films 5 are fitted to the active matrix substrate 1, and the polyimide films 6 are fitted to the active matrix substrate 1 and the external substrate 7. A gate driver unit described later is realized by the plurality of gate driver ICs 3, and a source driver unit described later is realized by the plurality of source driver ICs 4. Oriented films, orientation control structures, and liquid crystal materials are held between the active matrix substrate 1 and the counter substrate 2, but these are omitted in FIG. 2. In the liquid crystal display device, there are provided optical films such as polarizing films, a backlight, other optical parts, circuit parts, and bezels that hold these parts at predetermined positions, in addition to the above constituent elements. However, these parts are also omitted in FIG. 2.

In the present embodiment, the gate driver ICs 3 are provided at both end sides of the active matrix substrate 1 (at a left-side side and a right-side side of the active matrix substrate 1, in FIG. 2), however, the present invention is not limited thereto. The gate driver ICs 3 may be provided at only one end side of the active matrix substrate 1. In the present embodiment, the source driver ICs 4 are provided at only one end side of the active matrix substrate 1 (at an upper-side side of the active matrix substrate 1, in FIG. 2), however, the present invention is not limited thereto. The source driver ICs 4 may be provided at both end sides of the active matrix substrate 1.

<1.1.2 Wiring Structure on Active Matrix Substrate>

Figure 3:
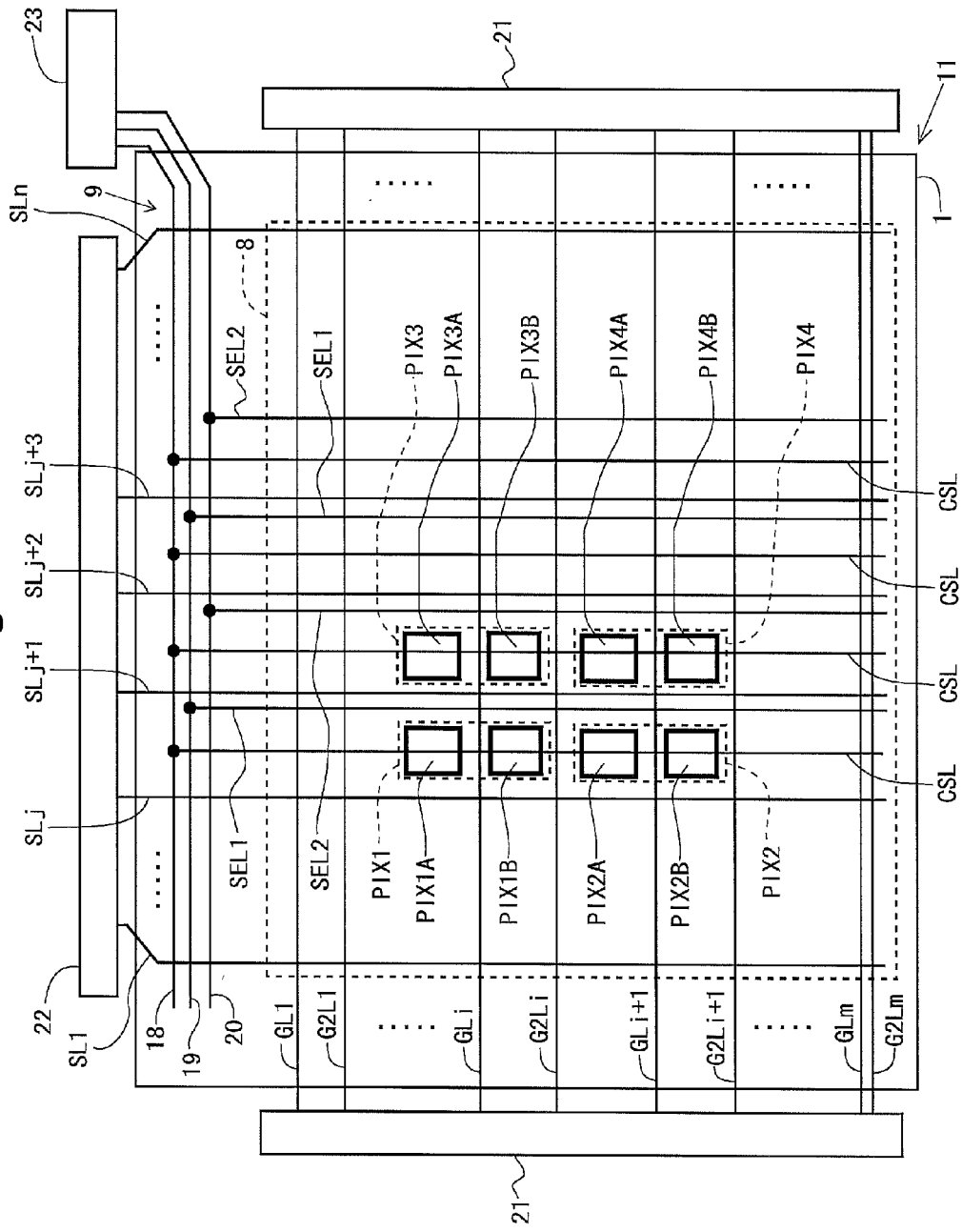
FIG. 3 is a plan view of an active matrix substrate in the first embodiment.

FIG. 3 is a plan view of the active matrix substrate 1 in the present embodiment. As shown in FIG. 3, a region on the active matrix substrate 1 that constitutes the liquid crystal panel 11 is divided into a display region 8 and a peripheral region 9. On the active matrix substrate 1, there are provided m first scanning signal lines GL1 to GLm, m second scanning signal lines G2L1 to G2Lm, n data signal lines SL1 to SLn, pixel formation portions that are provided at intersections of the first scanning signal lines and the data signal lines at one to one (that is, m×n pixel formation portions), the holding capacitance lines CSL, first potential varying capacitance lines (hereinafter, abbreviated as "first capacitance lines") SEL1, and second potential varying capacitance lines (hereinafter, abbreviated as "second capacitance lines") SEL2 that are arranged to extend in parallel with the data signal lines, and a holding-capacitance line trunk 18, a first capacitance line trunk 19, and a second capacitance line trunk 20 that are arranged mainly in a region between the display region 8 and a source driver unit 22, out of the peripheral region 9. The above m and n are set as m=1080, and n=5760, for example, but the present invention is not limited thereto.

A pixel matrix of m rows×n columns is formed by the m×n pixel formation portions. The holding capacitance lines CSL are provided to correspond to the data signal lines at one to one. The first capacitance lines SEL1 and the second capacitance lines SEL2 are provided to alternately correspond to the pixel matrix for each one column.

In FIG. 3, out of the m×n pixel formation portions, only four pixel formation portions PIX1 to PIX4 are shown. Two sub-pixel portions (a first sub-pixel portion and a second sub-pixel portion) are included in each pixel formation portion. In the present embodiment, a first sub-pixel portion and a second sub-pixel portion are laid out to sandwich a first scanning signal line. A second sub-pixel portion is laid out in a region between a first scanning signal line and a second scanning signal line.

The pixel formation portion PIX1 is provided to correspond to an intersection of an i-th row first scanning signal line GLi and a j-th column data signal line SLj. The pixel formation portion PIX2 is provided to correspond to an intersection of an (i+1)-th row first scanning signal line GLi+1 and the j-th column data signal line SLj. The pixel formation portion PIX3 is provided to correspond to an intersection of the i-th row first scanning signal line GLi and an (j+1)-th column data signal line SLj+1. The pixel formation portion PIX4 is provided to correspond to an intersection of the (i+1)-th row first scanning signal line GLi+1 and the (j+1)-th column data signal line SLj+1.

The pixel formation portion PIX1 includes a first sub-pixel portion PIX1A and a second sub-pixel portion PIX1B. The holding capacitance line CSL is arranged to be superimposed with the pixel formation portion PIX1 in a vertical direction on the active matrix substrate 1, and a capacitance is formed by the holding capacitance line CSL and an electrode in the pixel formation portion PIX1. This is similarly applied to the pixel formation portions PIX2 to PIX4.

The first scanning signal lines GL1 to GLm and the second scanning signal lines G2L1 to G2Lm are connected to a gate driver unit 21. The gate driver unit 21 provides a scanning signal to the first scanning signal lines GL1 to GLm and the second scanning signal lines G2L1 to G2Lm. A potential of the scanning signal is a gate-on potential or a gate-off potential. The data signal lines SL1 to SLn are connected to the source driver unit 22. The source driver unit 22 provides a data signal according to an image to be displayed, to the data signal lines SL1 to SLn. The holding-capacitance line trunk 18, the first capacitance line trunk 19, and the second capacitance line trunk 20 are connected to a capacitance line driver unit 23. The capacitance line driver unit 23 provides a constant potential to the holding-capacitance line trunk 18, and provides a potential of a relatively high level and a potential of a relatively low level to the first capacitance line trunk 19 and the second capacitance line trunk 20 alternately every one frame period.

<1.2. Structure of Pixel Formation Portion>
<1.2.1 Planar Structure>

Figure 4:
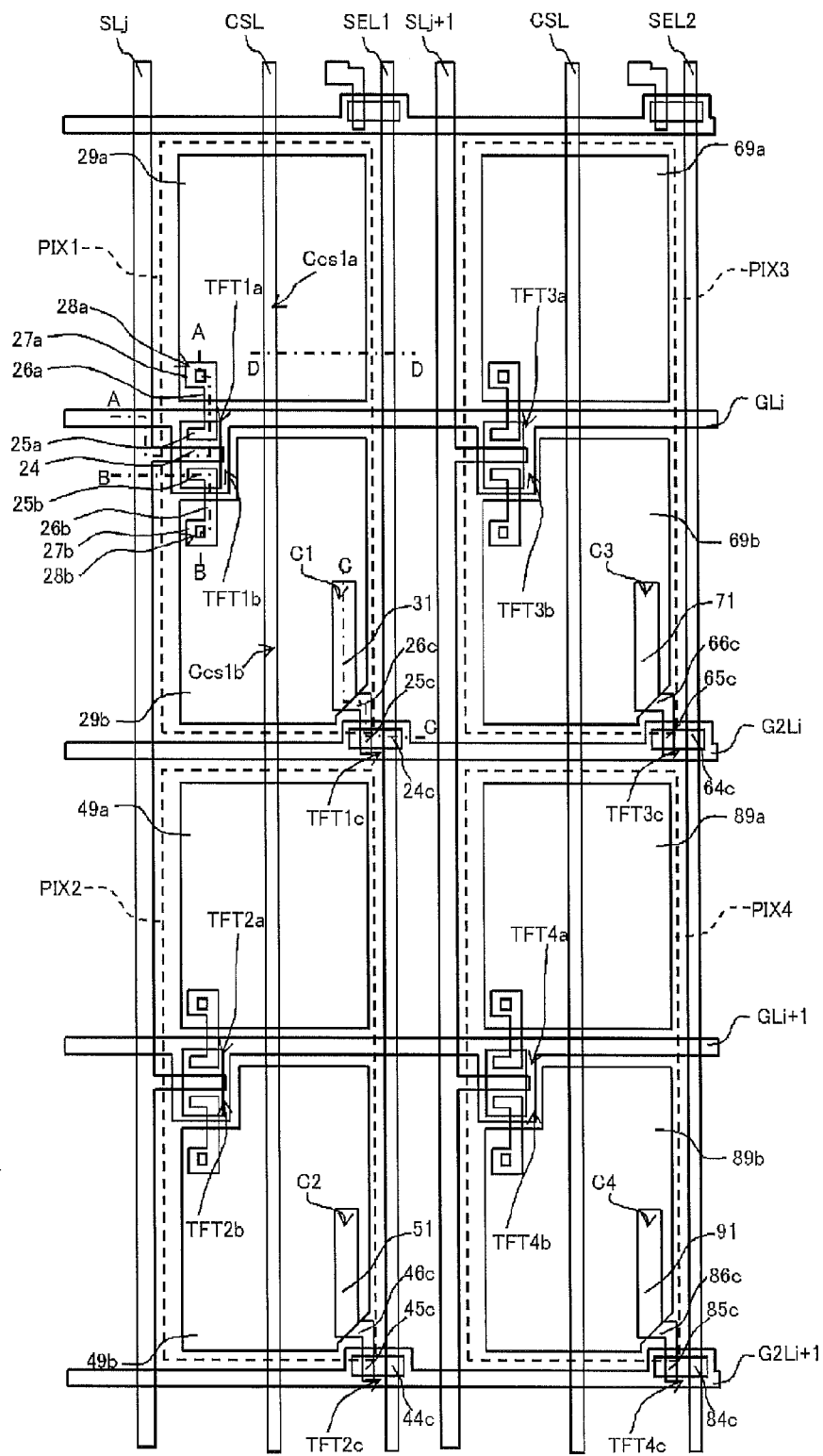
FIG. 4 is a plan view of a region in which pixel formation portions PIX1 to PIX4 are formed in the first embodiment.

FIG. 4 is a plan view of a region in which the pixel formation portions PIX1 to PIX4 are formed. As shown in FIG. 4, the data signal line SLj is arranged along one side (a left side in FIG. 4) of the pixel formation portions PIX1, PIX2, and the first capacitance line SEL1 is arranged along the other side (a right side in FIG. 4) of the pixel formation portions PIX1, PIX2. The data signal line SLj+1 is arranged along one side of the pixel formation portions PIX3, PIX4, and the second capacitance line SEL2 is arranged along the other side of the pixel formation portions PIX3, PIX4. Further, the holding capacitance lines CSL are arranged to pass on the pixel formation portions PIX1, PIX2 and on the pixel formation portions PIX3, PIX4, respectively. The first scanning signal line GLi is arranged to pass between two pixel electrodes 29a, 29b that are included in the pixel formation portion PIX1 and between two pixel electrodes 69a, 69b that are included in the pixel formation portion PIX3. The first scanning signal line GLi+1 is arranged to pass between two pixel electrodes 49a, 49b that are included in the pixel formation portion PIX2 and between two pixel electrodes 89a, 89b that are included in the pixel formation portion PIX4. Further, a second scanning signal line G2Li is arranged along one side (a lower side in FIG. 4) of the pixel formation portions PIX1, PIX3, and a second scanning signal line G2Li+1 is arranged along one side of the pixel formation portions PIX2, PIX4. Because all pixel formation portions have a similar structure, a description is made below by mainly focusing attention on only the pixel formation portion PIX1.

Figure 5:
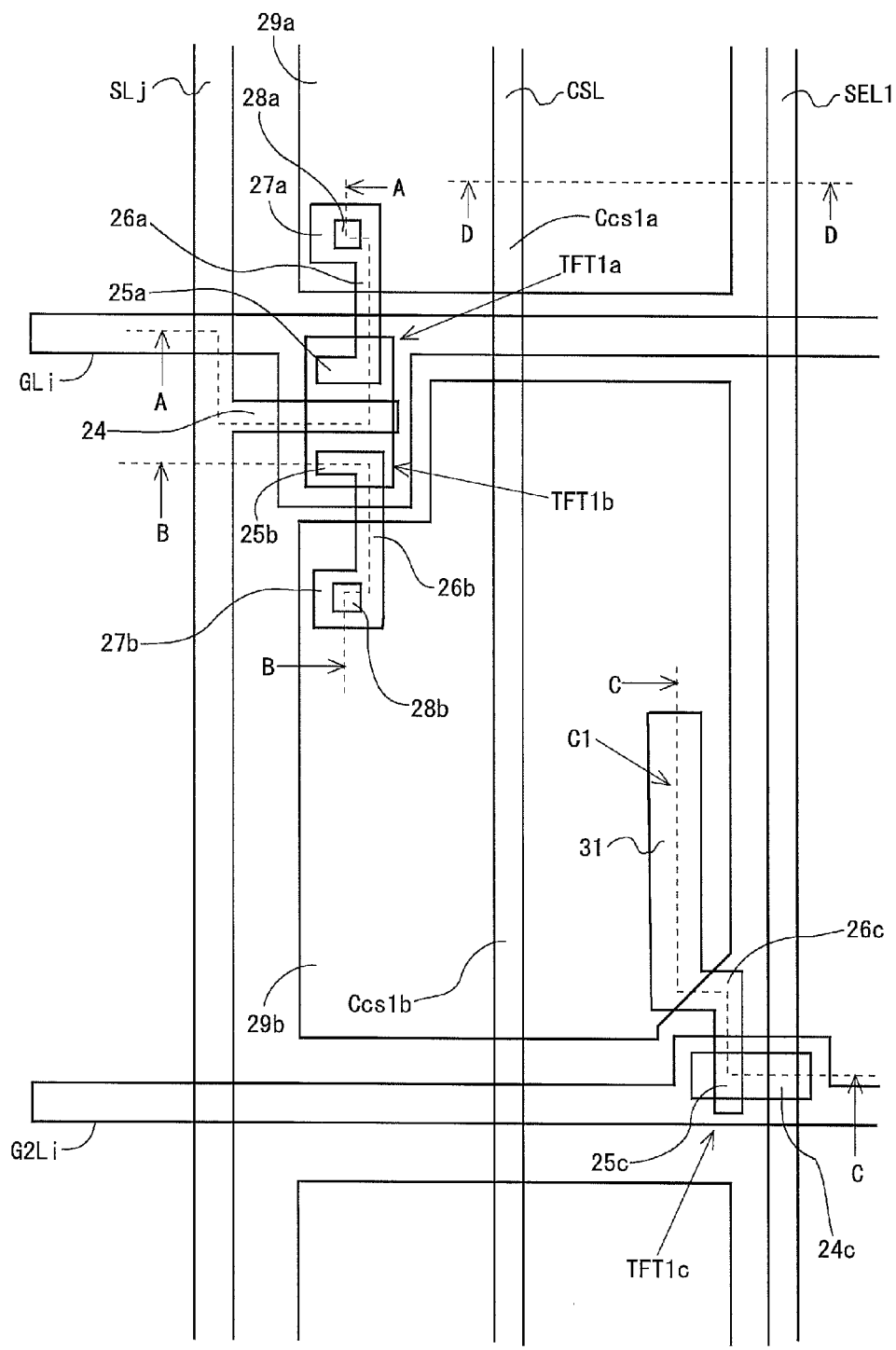
FIG. 5 is an enlarged plan view of a part of a region in which the pixel formation portion PIX1 is formed in the first embodiment.

FIG. 5 is an enlarged plan view of a part of a region in which the pixel formation portion PIX1 is formed. In the pixel formation portion PIX1, a first transistor TFT1a and a second transistor TFT1b are provided to be connected respectively to the first scanning signal line GLi. The first transistor TFT1a and the second transistor TFT1b share a source electrode 24, and the source electrode 24 is formed to extend in parallel with the first scanning signal line GLi from the data signal line SLj. A drain electrode 25a of the first transistor TFT1a is connected to an electrode 27a by a drain lead line 26a. The electrode 27a is connected to the pixel electrode 29a via a contact 28a. A drain electrode 25b of the second transistor TFT1b is connected to an electrode 27b by a drain lead line 26b. The electrode 27b is connected to the pixel electrode 29b via a contact 28b.

In the pixel formation portion PIX1, a third transistor TFT1c is provided to be connected to the second scanning signal line G2Li. A source electrode 24c of the third transistor TFT1c is formed integrally with the first capacitance line SEL1. A drain electrode 25c of the third transistor TFT1c is connected to a capacitance electrode (a potential varying capacitance electrode) 31 by a drain lead line 26c. The capacitance electrode 31 is formed to extend in parallel with the first capacitance line SEL1.

The holding capacitance line CSL and the pixel electrode 29a are laid out to be superimposed in a vertical direction on the active matrix substrate 1. Accordingly, a holding capacitance Ccs1a is formed. Similarly, the holding capacitance line CSL and the pixel electrode 29b are laid out to be superimposed in a vertical direction on the active matrix substrate 1. Accordingly, a holding capacitance Ccs1b is formed. The capacitance electrode 31 and the pixel electrode 29b are laid out to be superimposed in a vertical direction on the active matrix substrate 1. Accordingly, the potential varying capacitance C1 is formed.

<1.2.2 Cross-Sectional Structure>

Figure 6:
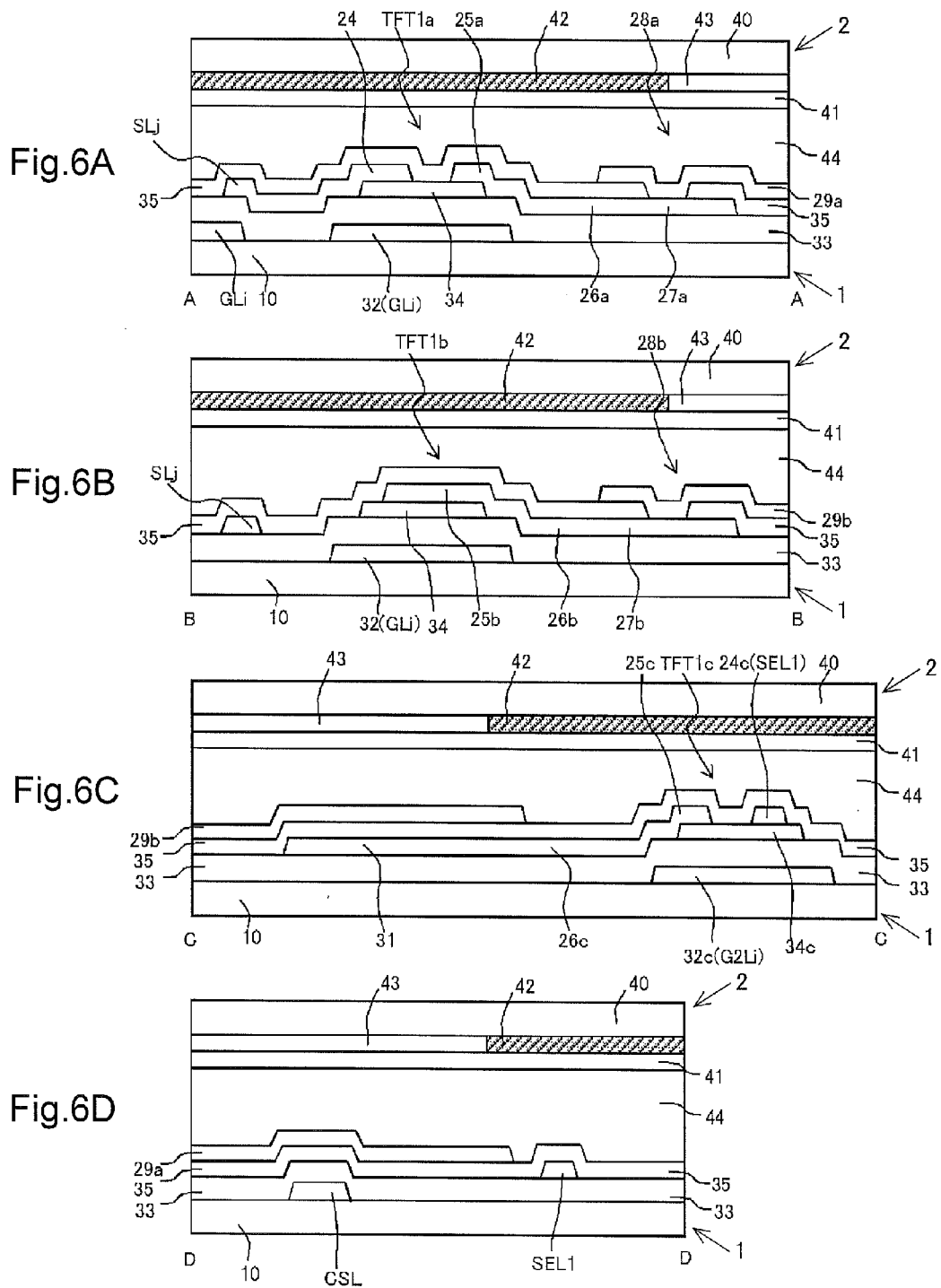
FIG. 6A is a cross-sectional view along line A-A in FIG. 5.
FIG. 6B is a cross-sectional view along line B-B in FIG. 5.
FIG. 6C is a cross-sectional view along line C-C in FIG. 5.
FIG. 6D is a cross-sectional view along line D-D in FIG. 5.

A structure of a pixel formation portion will be further described with reference to a cross-sectional view of a liquid crystal panel. FIG. 6A is a cross-sectional view along line A-A in FIG. 5. FIG. 6B is a cross-sectional view along line B-B in FIG. 5. FIG. 6C is a cross-sectional view along line C-C in FIG. 5. FIG. 6D is a cross-sectional view along line D-D in FIG. 5. The active matrix substrate 1 and the counter substrate 2 are laid out to opposed to each other with a liquid crystal layer 44 interposed therebetween.

First, a structure of an active matrix substrate 1 side will be described. On a glass substrate 10, there are formed the first scanning signal line GLi, the second scanning signal line G2Li, gate electrodes 32, 32c, and the holding capacitance lines CSL, and there is formed a gate insulation layer 33 made of nitride silicon as an inorganic material so as to cover them. In the first transistor TFT1a and the second transistor TFT1b, the gate electrode 32 is formed integrally with the first scanning signal line GLi. In the third transistor TFT1c, the gate electrode 32c is formed integrally with the second scanning signal line G2Li.

On the gate insulation layer 33 on the first transistor TFT1a and the second transistor TFT1b, there are formed a semiconductor layer 34, the source electrode 24 that is in contact with the semiconductor layer 34, and the drain electrodes 25a, 25b, and there are formed the data signal line SLj, the drain lead lines 26a, 26b, and the electrodes 27a, 27b near them. On a further upper layer, an interlayer insulation layer 35 is formed.

On the gate insulation layer 33 in the third transistor TFT1c, there are formed a semiconductor layer 34c, and the source electrode 24c and the drain electrode 25c that are in contact with the semiconductor layer 34c, and there are formed the drain lead line 26c and the capacitance electrode 31 near them. On a further upper layer, the interlayer insulation layer 35 is formed. The source electrode 24c of the third transistor TFT1c is formed integrally with the first capacitance line SEL. The semiconductor layers 34, 34c are made of an intrinsic amorphous silicon layer (an i layer), and a phosphorus-doped $n^+$-type amorphous silicon layer (an $n^+$ layer). The $n^+$ layer has a role of a contact layer for performing an electric connection between a semiconductor material of the i layer and the like and a metal material of the source electrodes 24, 24c, the drain electrodes 25a, 25b, 25c, and the like. In a region (typically a channel portion of a transistor) that is not superimposed with the source electrodes 24, 24c, and the drain electrodes 25a, 25b, 25c out of the semiconductor layers 34, 34c, the $n^+$ layer is removed by etching and the like, and this region is made of only the i layer. The interlayer insulation layer 35 is made of nitride silicon as an inorganic material.

The pixel electrodes 29a, 29b made of an ITO (Indium Tin Oxide) are formed on the interlayer insulation layer 35. Although oriented films are formed to cover the pixel electrodes 29a, 29b, the oriented films are omitted in the figure. In the contact 28a, the interlayer insulation layer 35 is hollowed out such that the pixel electrode 29a and the electrode 27a are electrically connected. Similarly, in the contact 28b, the interlayer insulation layer 35 is hollowed out such that the pixel electrode 29b and the electrode 27b are electrically connected.

Next, a structure of a counter substrate 2 side will be described. A black matrix 42 and a colored layer 43 are formed on the glass substrate 40, and the common electrode (the counter electrode) 41 is formed on a further upper layer. Although an oriented film is formed to cover the common electrode 41, the oriented film is omitted in the figure. Note that, a structure of the counter substrate 2 side in second and subsequent embodiments is similar to the structure in the present embodiment.

<1.2.3 Equivalent Circuit>

Figure 7:
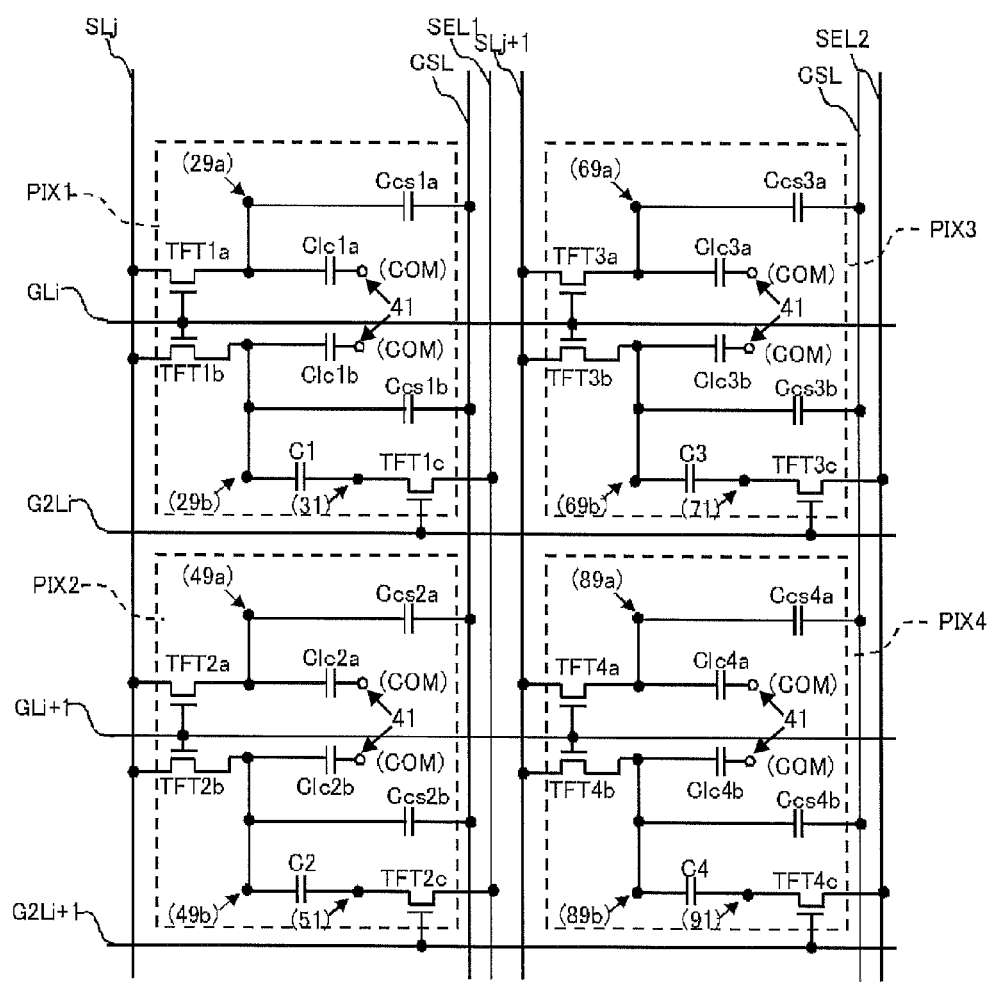
FIG. 7 is an equivalent circuit diagram of pixel formation portions in the first embodiment.

FIG. 7 is an equivalent circuit diagram of pixel formation portions in the present embodiment. The pixel formation portion PIX1 includes as constituent elements of the first sub-pixel portion PIX1A, the first transistor TFT1a having a gate electrode connected to the first scanning signal line GLi and having a source electrode connected to the data signal line SLj, the pixel electrode 29a connected to a drain electrode of the first transistor TFT1a, a liquid crystal capacitance Clc1a formed by the common electrode 41 to which a constant potential COM is provided and the pixel electrode 29a, and the holding capacitance Ccs1a formed by the pixel electrode 29a and the holding capacitance line CSL. Further, the pixel formation portion PIX1 includes as constituent elements of the second sub-pixel portion PIX1B, the second transistor TFT1b having a gate electrode connected to the first scanning signal line GLi and having a source electrode connected to the data signal line SLj, the pixel electrode 29b connected to a drain electrode of the second transistor TFT1b, a liquid crystal capacitance Clc1b formed by the common electrode 41 and the pixel electrode 29b, a holding capacitance Ccs1b formed by the pixel electrode 29b and the holding capacitance line CSL, the third transistor TFT1c having a gate electrode connected to the second scanning signal line G2Li and having a source electrode connected to the first capacitance line SEL1, the capacitance electrode 31 connected to a drain electrode of the third transistor TFT1c, and the potential varying capacitance C1 formed by the pixel electrode 29b and the capacitance electrode 31.

<1.3. Method of Manufacturing Active Matrix Substrate>

Next, an example of a method of manufacturing the active matrix substrate 1 according to the present embodiment will be described. Note that, this manufacturing method is similar to a method of manufacturing a general active matrix substrate including an amorphous silicon transistor. Therefore, in the second and subsequent embodiments, a description of the method of manufacturing the active matrix substrate 1 will be omitted.

First, titanium (Ti), aluminum (Al), titanium (Ti) are sequentially deposited on a transparent insulation substrate (the glass substrate 10 in FIG. 6A to FIG. 6D) of glass, plastics, or the like, by a sputtering method using an argon (Ar) gas, and a gate metal film as a Ti/Al/Ti laminated film is formed. At this time, a film thickness of titanium is 100 nm, for example, at both an upper layer side and a lower layer side, and a film thickness of aluminum is 300 nm, for example. A temperature of the glass substrate 10 when forming the gate metal film is 200° C. to 300° C.

Next, by a photolithography method, that is, by a method of forming a resist pattern film by a photoresist material on a film to be processed and patterning the film by using the resist pattern film as a mask, there are formed the first scanning signal line GLi, the second scanning signal line G2Li, the gate electrodes 32, 32c, and the capacitance electrode 31 from the gate metal film. For etching the gate metal film, a dry etching method mainly using a chlorine ($Cl_2$) gas, for example, is employed. After the etching, the resist pattern film is removed by using a remover containing organic alkali.

As for a material for the gate metal film, an indium tin oxide (ITO), or a single metal such as tungsten (W), copper (Cu), chrome (Cr), molybdenum (Mo), aluminum (Al), and titanium (Ti), or a material obtained by including nitrogen, oxygen, or other metal into these metals may be used besides an aluminum and a titanium. The gate metal film may be a single layer using the above material, or may have a laminated structure. For example, the first scanning signal line and the second scanning signal line may be formed by a Ti/Cu/Ti laminated film using titanium and copper, or a Mo/Cu/Mo laminated film using copper and molybdenum. For a method of forming the gate metal film, a vapor-deposition method and the like may be used besides the sputtering method. A thickness of the gate metal film is not particularly limited. A method of etching the gate metal film is not limited to the above dry etching method, and a wet etching method using an etchant such as an acid or other method may be employed.

Next, by a plasma CVD (Chemical Vapor Deposition) method or the like, there are continuously formed a first silicon nitride (SiNx) film serving as the gate insulation layer 33, an amorphous silicon film serving as the intrinsic amorphous silicon film (the i layer), and an $n^+$-type amorphous silicon film serving as the $n^+$-type amorphous silicon layer (the $n^+$ layer). At this time, a film thickness of the first silicon nitride film is 400 nm, for example, a film thickness of the amorphous silicon film is 200 nm, for example, and a film thickness of the $n^+$-type amorphous silicon film is 50 nm, for example. A temperature of the glass substrate 10 when forming these films is 200° C. to 300° C. For a film-forming gas, silane ($SiH_4$), ammonium ($NH_3$), hydrogen ($H_2$), and nitrogen ($N_2$) are used in a suitable combination.

Next, by a photolithography method, the amorphous silicon film and the $n^+$-type amorphous silicon film are patterned in a predetermined shape, and a primary-processed amorphous silicon film and a primary-processed $n^+$-type amorphous silicon film are obtained. For etching at this time, there is employed a dry etching method using a gas obtained by suitably combining a chlorine ($Cl_2$) gas, a carbon tetrachloride ($CF_2$) gas, and an oxygen ($O_2$) gas, for example. After the etching, a resist pattern film is removed by using a remover containing organic alkali. Further, by a similar photolithography method, the first silicon nitride film is patterned in a predetermined shape, and the gate insulation layer 33 is formed from the first silicon nitride film. For etching at this time, there is employed a dry etching method using a gas obtained by suitably combining a carbon tetrachloride ($CF_2$) gas and an oxygen ($O_2$) gas, and next, a resist pattern film is removed in a similar manner.

Next, by a method similar to that of forming the gate metal film, titanium (Ti), aluminum (Al), and titanium (Ti) are sequentially deposited on the gate insulation layer 33 and on the semiconductor layer 34 (made of an amorphous silicon film and an $n^+$-type amorphous silicon film), and a source metal film as a Ti/Al/Ti laminated film is formed. At this time, a film thickness of titanium is 100 nm, for example, at both an upper layer side and a lower layer side, and a film thickness of aluminum is 300 nm, for example.

Next, by a photolithography method, there are formed the source electrodes 24, 24c, the drain electrodes 25a, 25b, 25c, the holding capacitance lines CSL, the first capacitance lines SEL1, the data signal line SLj, the drain lead lines 26a, 26b, 26c, and the electrodes 27a, 27b, 27c or the like from the source metal film. For etching at this time, a method similar to that of etching the gate metal film can be used. In this case, a resist pattern film used for a process by the photolithography method is not removed and is left for the next process. As a material for the source metal film, materials other than aluminum and titanium may be employed in a similar manner to that for the gate metal film.

Next, by using the resist pattern film that is left in the preceding process as a mask, an etching process (channel etching) is performed again to the amorphous silicon film and the $n^+$-type amorphous silicon film, and the semiconductor layers 34, 34c made of the intrinsic amorphous silicon layer (the i layer) and the $n^+$-type amorphous silicon layer (the $n^+$ layer) are obtained. That is, by the dry etching method, etching is performed to a part of a surface of the amorphous silicon film and the $n^+$-type amorphous silicon film, by using as a mask the resist pattern film that is used to form patterns of the source electrodes 24, 24c, the drain electrodes 25a, 25b, 25c, the holding capacitance lines CSL, the first capacitance lines SEL1, the data signal line SLj, the drain lead lines 26a, 26b, 26c, and the electrodes 27a, 27b, 27c. Accordingly, the source electrode 24 is separated from the drain electrodes 25a, 25b, and the source electrode 24c is separated from the drain electrode 25c. For etching at this time, there is employed a dry etching method using a gas obtained by suitably combining a chlorine ($Cl_2$) gas, a carbon tetrachloride ($CF_2$) gas, and an oxygen ($O_2$) gas, for example. Note that, a main reason for performing etching to a part of the surface of the amorphous silicon film is to securely remove the $n^+$-type amorphous silicon film by over-etching.

Next, a second silicon nitride film serving as the interlayer insulation layer 35 is formed to cover the source electrode 24, 24c, the drain electrodes 25a, 25b, 25c, the holding capacitance lines CSL, the first capacitance lines SEL1, the data signal line SLj, the drain lead lines 26a, 26b, 26c, the electrodes 27a, 27b, 27c, or the like. In this case, a plasma CVD method is used. A temperature of the glass substrate 10 when forming the second silicon nitride film is 200° C. to 300° C. For a film-forming gas, silane ($SiH_4$), ammonium ($NH_3$), hydrogen ($H_2$), nitrogen ($N_2$), or the like are used in a suitable combination. A film thickness of the second silicon nitride film is 300 nm, for example.

Next, etching is performed to the second silicon nitride film serving as the interlayer insulation layer 35 to have a predetermined pattern, by a photolithography method, and the interlayer insulation layer 35 and the contacts 28a, 28b, 30 are formed. At this time, a method similar to that used to etch silicon nitride serving as the gate insulation layer 33 can be used.

Next, an ITO (Indium Tin Oxide) film, for example, is formed to have a film thickness of about 100 nm by a sputtering method or the like, on the interlayer insulation layer 35. Further, the ITO film is patterned in a predetermined shape by a photolithography method, and the pixel electrodes 29a, 29b and a connection electrode 36 are formed. For etching the ITO film, an oxalic acid (HOOC—COOH) and a ferric chloride liquid are used, for example. Lastly, a solution containing an oriented film material is coated to cover the pixel electrodes 29a, 29b by an inkjet method or the like, and an oriented film is formed. In the manner as described above, the active matrix substrate 1 to be used for the liquid crystal display device according to the present embodiment is manufactured. Note that, the interlayer insulation layer 35 may be a laminated film obtained by laminating a silicon nitride film and an organic insulation film generated by using a photosensitive material, from a glass substrate 10 side.

<1.4 Driving Method>

Figure 8:
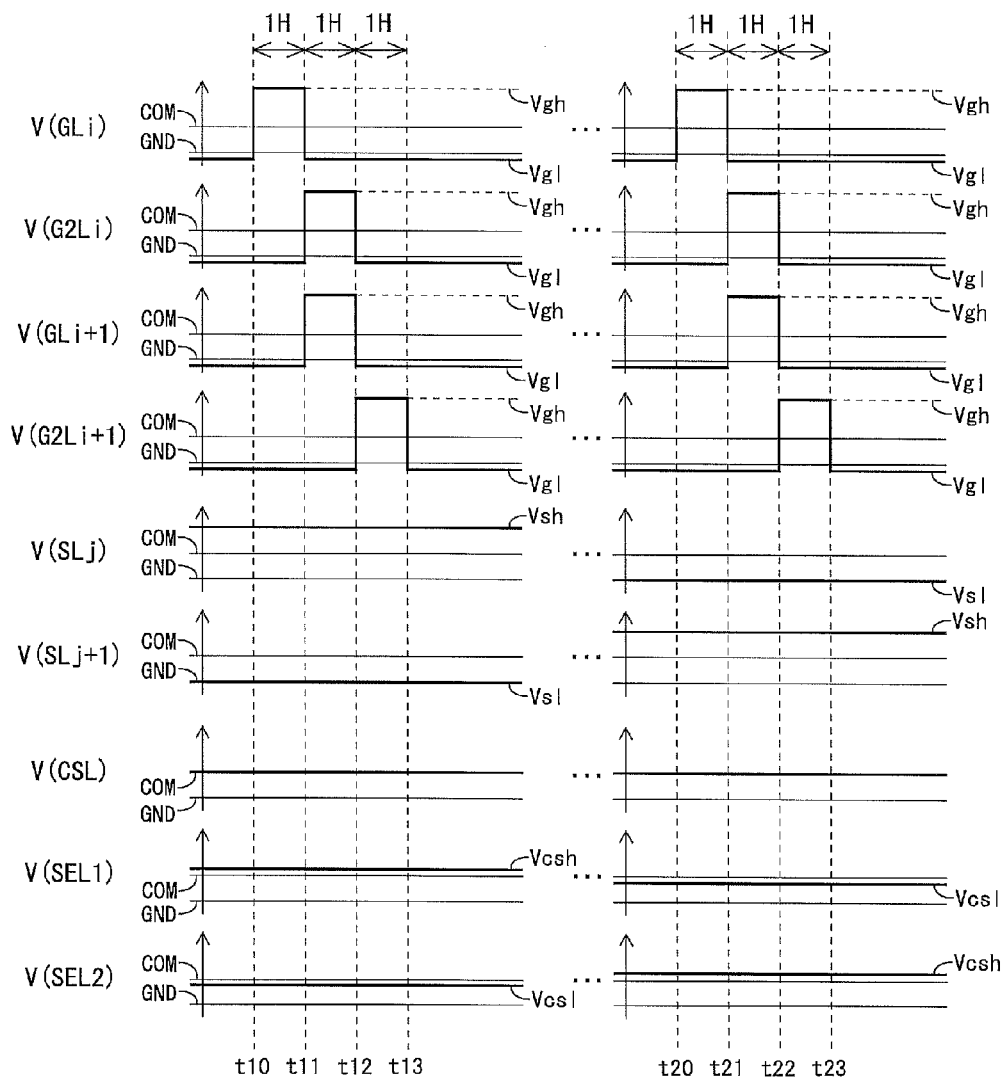
FIG. 8 is a signal waveform diagram for describing a driving method in the first embodiment.
Figure 9:
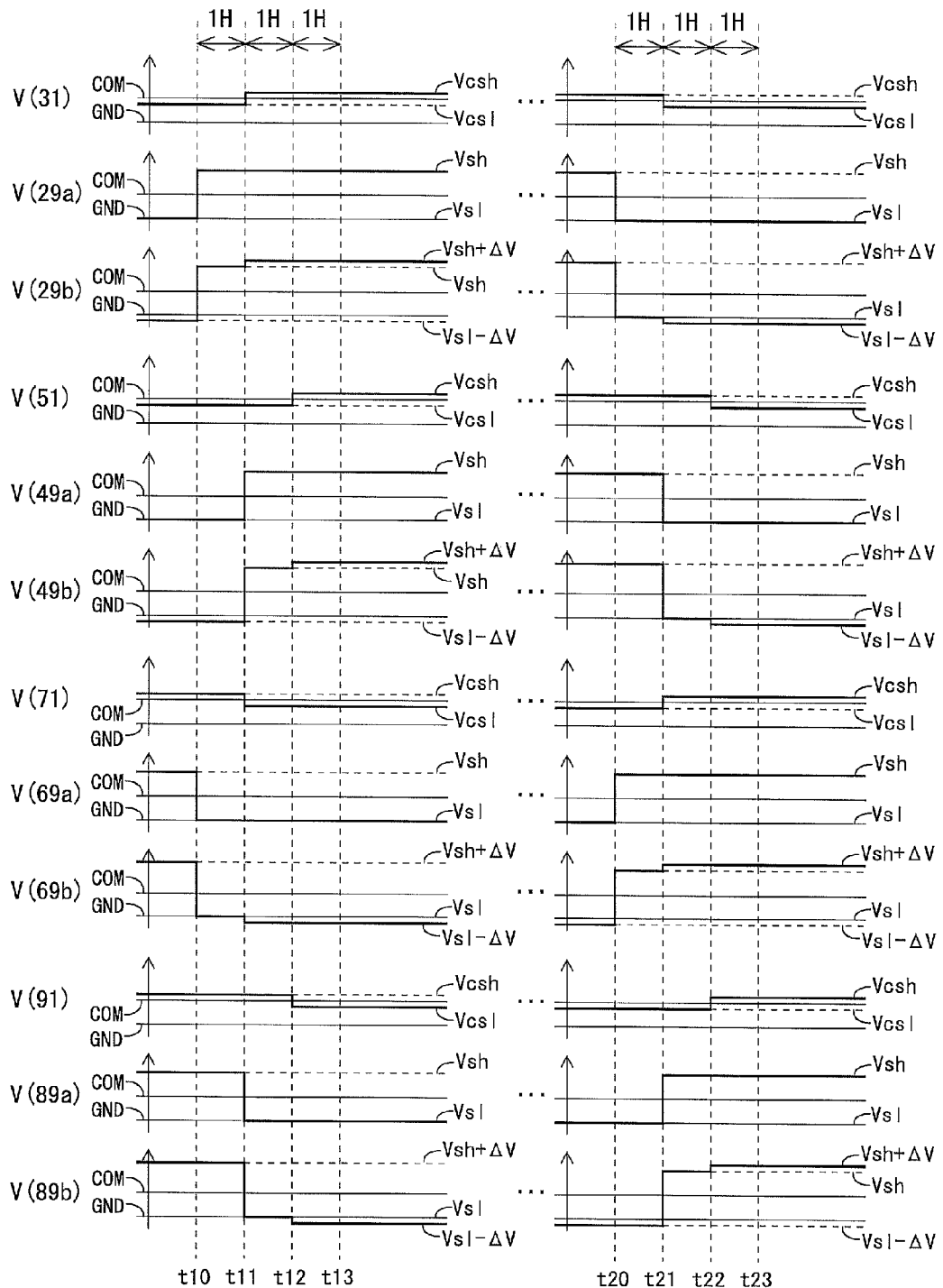
FIG. 9 is a signal waveform diagram for describing a driving method in the first embodiment.

Next, a driving method according to the present embodiment will be described with reference to FIG. 8 and FIG. 9. FIG. 8 shows changes of potentials of the first scanning signal line GLi, the second scanning signal line G2Li, the first scanning signal line GLi+1, the second scanning signal line G2Li+1, the data signal lines SLj, SLj+1, the holding capacitance lines CSL, the first capacitance line SEL1, and the second capacitance line SEL2. FIG. 9 shows changes of potentials of the capacitance electrode 31, the pixel electrodes 29a, 29b, the capacitance electrode 51, the pixel electrodes 49a, 49b, the capacitance electrode 71, the pixel electrodes 69a, 69b, the capacitance electrode 91, and the pixel electrodes 89a, 89b. Concerning FIG. 8 and FIG. 9, it is assumed that waveforms in odd frames are shown at the left side, and waveforms in even frames are shown at the right side. Moreover, in FIG. 8 and FIG. 9, a time interval between dashed lines adjacent in left and right directions is one horizontal scanning period. Note that in the present embodiment, it is assumed that a liquid crystal display device is driven at a frame rate of 120 Hz, one horizontal scanning period is 7.4 µs, and one vertical scanning period (one frame period) is 8.3 µs, for example. However, the present invention is not limited to these. For example, the present invention can be also applied to a liquid crystal display device that is driven at a frame rate of 240 Hz.

As shown in FIG. 8, a gate-on potential Vgh is provided to the first scanning signal line GLi during one horizontal scanning period, and thereafter, the gate-on potential Vgh is provided to the first scanning signal line GLi+1 during one horizontal scanning period. In this way, the gate-on potential Vgh is sequentially provided to the first scanning signal lines GL1 to GLm, for each one row. To each first scanning signal line, the gate-on potential Vgh is provided during one horizontal scanning period during one frame period, and a gate-off potential Vgl is provided during other period. A timing at which the gate-on potential Vgh is provided to adjacent two first scanning signal lines is shifted by one horizontal scanning period.

As shown in FIG. 8, a gate-on potential Vgh is provided to the second scanning signal line G2Li during one horizontal scanning period, and thereafter, the gate-on potential Vgh is provided to the second scanning signal line G2Li+1 during one horizontal scanning period. In this way, the gate-on potential Vgh is also sequentially provided to the second scanning signal lines GL1 to GLm, for each one row. To each second scanning signal line, the gate-on potential Vgh is provided during one horizontal scanning period during one frame period, and the gate-off potential Vgl is provided during other period. A timing at which the gate-on potential Vgh is provided to adjacent two second scanning signal lines is shifted by one horizontal scanning period. Concerning each row, a timing at which the gate-on potential Vgh is provided to the second scanning signal line is delayed by one horizontal scanning period from the timing at which the gate-on potential Vgh is provided to the first scanning signal line.

As shown in FIG. 8, to the data signal line SLj, a potential Vsh that is higher than the potential COM of the common electrode 41 is provided in odd frames, and a potential Vsl that is lower than the potential COM is provided in even frames. To the data signal line SLj+1, the potential Vsl is provided in odd frames, and the potential Vsh is provided in even frames. In this way, to the data signal lines SL1 to SLn, a potential of a positive polarity and a potential of a negative polarity with reference to the potential COM of the common electrode 41 are provided alternately every one frame period. A polarity reversal between the potential of the positive polarity and the potential of the negative polarity is performed during a blanking period. Potentials of adjacent two data signal lines have mutually opposite polarities. That is, when a potential of the positive polarity is provided to a certain data signal line, a potential of the negative polarity is provided to a data signal line adjacent to this data signal line. Although a potential provided to a data signal line has a magnitude corresponding to an image to be displayed, a description is made here by assuming that a stationary image of one color is displayed on an entire screen.

A potential equal to the potential COM of the common electrode 41 is provided to the holding capacitance line CSL. In the present embodiment, the potential COM of the common electrode 41 is maintained at a constant value. Therefore, potentials of the holding capacitance lines CSL are also maintained at a constant value. Note that, the potentials of the holding capacitance lines CSL may be set to a constant value slightly different from the potential COM of the common electrode 41 to prevent occurrence of flicker and burning due to a direct current component applied to the pixel electrode.

A potential Vcsh of a relatively high level and a potential Vcsl of a relatively low level are provided to the first capacitance lines SEL1 and the second capacitance lines SEL2 alternately every one frame period. When the potential Vcsh is provided to one of the first capacitance line SEL1 and the second capacitance line SEL2, the potential Vcsl is provided to the other capacitance line. Note that, a timing at which potentials provided to the first capacitance line SEL1 and the second capacitance line SEL2 change is preferably in a blanking period such that an inconvenience does not occur in display.

Under the above assumptions, how potentials of the capacitance electrode and the pixel electrode in the pixel formation portion change will be described (see FIG. 8 and FIG. 9).

In odd frames, at a time point t10, a potential of the first scanning signal line GLi becomes the gate-on potential Vgh. Accordingly, the first transistors TFT1a, TFT3a and the second transistors TFT1b, TFT3b become in an on state. In the odd frames, a potential of the data signal line SLj is the potential Vsh of the positive polarity, and a potential of the data signal line SLj+1 is the potential Vsl of the negative polarity. Therefore, at the time point t10, potentials of the pixel electrodes 29a, 29b in the pixel formation portion PIX1 increase to Vsh, and potentials of the pixel electrodes 69a, 69b in the pixel formation portion PIX3 decrease to Vsl.

At a time point t11, a potential of the second scanning signal line G2Li becomes the gate-on potential Vgh. Accordingly, the third transistors TFT1c, TFT3c become in an on state. In the odd frames, the first capacitance line SEL1 is at the potential Vcsh of a relatively high level, and the second capacitance line SEL2 is at the potential Vcsl of a relatively low level. Therefore, at the time point t11, a potential of the capacitance electrode 31 in the pixel formation portion PIX1 increases to Vcsh, and a potential of the capacitance electrode 71 in the pixel formation portion PIX3 decreases to Vcsl. In this case, because the capacitance electrode 31 and the pixel electrode 29b are capacitance-coupled, the potential of the pixel electrode 29b also changes due to the change of the potential of the capacitance electrode 31. A magnitude $\Delta V$ of a potential change in the pixel electrode 29b at this time is obtained by the following Equation (1).

$$\Delta V = (Vcsh - Vcsl) \times K \tag{1}$$

In the above Equation (1), K is obtained by the following Equation (2).

$$K = Cl / (Clc1b + Ccs1b + Cl) \tag{2}$$

To simplify the description, a parasitic capacitance between electrodes of the second transistors TFT1b and TFT3b is not considered because this capacitance is small, and other small parasitic capacitances that do not directly affect the present invention are not considered either.

Thus, at the time point t11, the potential of the pixel electrode 29b increases from Vsh to Vsh+$\Delta V$. Similarly, because the capacitance electrode 71 and the pixel electrode 69b are capacitance-coupled, the potential of the pixel electrode 69b also changes due to the change of the potential of the capacitance electrode 71. As a result, at the time point t11, the potential of the pixel electrode 69b decreases from Vsl to Vsl-$\Delta V$. Here, for $\Delta V$, the same symbol as that for the pixel electrode 29b is used for simplicity. $\Delta V$ is obtained by the above Equation (1), and K is obtained by the following Equation (2-1).

$$K = C3 / (Clc3b + Ccs3b + C3) \tag{2-1}$$

Here, for simplicity, concerning the equations that express a change of a potential, the same symbols ($\Delta V$, K) are used for all pixel electrodes, and this is similarly applied hereinafter. Magnitudes of changes of potentials of the pixel electrodes 49b, 89b are obtained by substituting the value of K obtained by the following Equations (2-2), (2-3) into the above Equation (1).

$$K = C2 / (Clc2b + Ccs2b + C2) \tag{2-2}$$

$$K = C4 / (Clc4b + Ccs4b + C4) \tag{2-3}$$

Like in an example described later, for the case of a configuration that does not include the holding capacitance line CSL, $\Delta V$ can be similarly obtained, by setting values of Ccs1b, Ccs2b, Ccs3b, Ccs4b to 0.

At the time point t11, a potential of the first scanning signal line GLi+1 becomes the gate-on potential Vgh. Accordingly, the first transistors TFT2a, TFT4a and the second transistors TFT2b, TFT4b become in an on state. Consequently, at the time point t11, the potentials of the pixel electrodes 49a, 49b in the pixel formation portion PIX2 increase to Vsh, and the potentials of the pixel electrodes 89*a*, 89*b* in the pixel formation portion PIX4 decrease to Vsl.

At a time point t12, a potential of the second scanning signal line G2Li+1 becomes the gate-on potential Vgh. Accordingly, the third transistors TFT2*c*, TFT4*c* become in an on state. Consequently, at the time point t12, the potential of the capacitance electrode 51 in the pixel formation portion PIX2 increases to Vcsh, and the potential of the capacitance electrode 91 in the pixel formation portion PIX4 decreases to Vcsl. Because the capacitance electrode 51 and the pixel electrode 49*b* are capacitance-coupled, the potential of the pixel electrode 49*b* also changes. Similarly, because the capacitance electrode 91 and the pixel electrode 89*b* are capacitance-coupled, the potential of the pixel electrode 89*b* also changes. As a result, at the time point t12, the potential of the pixel electrode 49*b* increases from Vsh to Vsh+$\Delta$V, and the potential of the pixel electrode 89*b* decreases from Vsl to Vsl−$\Delta$V.

The potentials of the pixel electrodes 29*a*, 29*b*, 69*a*, and 69*b* are maintained during a period until when the potential of the first scanning signal line GLi becomes the gate-on potential Vgh in the even frames (during a period up to a time point t20). The potentials of the pixel electrodes 49*a*, 49*b*, 89*a*, and 89*b* are maintained during a period until when the potential of the first scanning signal line GLi+1 becomes the gate-on potential Vgh in the even frames (during a period up to a time point t21).

In the even frames, an operation similar to that in the odd frames is performed (however, directions in which the potentials of the pixel electrodes and the potentials of the capacitance electrodes change become opposite to those in the odd frames). In the manner as described above, in each pixel formation portion, different potentials are provided to pixel electrodes in the first sub-pixel portion and pixel electrodes in the second sub-pixel portion.

<1.5 Effect>

According to the present embodiment, in each pixel formation portion, after one horizontal scanning period since the same potential is provided to the pixel electrode of the first sub-pixel portion and the pixel electrode of the second sub-pixel portion, the potential of the pixel electrode of the second sub-pixel portion slightly varies. Consequently, during a major period of one frame period, different potentials are provided to the pixel electrode of the first sub-pixel portion and the pixel electrode of the second sub-pixel portion. In the present embodiment, to vary the potential of the pixel electrode of the second sub-pixel portion, there are provided a third transistor having a gate electrode connected to a second scanning signal line and having a source electrode connected to a potential varying capacitance line, a capacitance electrode (a potential varying capacitance electrode) connected to a drain electrode of the third transistor, and a capacitance (a potential varying capacitance) formed by a pixel electrode and a capacitance electrode. In this configuration, the potential of the pixel electrode of the second sub-pixel portion varies based on the potential of the potential varying capacitance line when the third transistor is set to an on state. In this case, the potential Vcsh of a relatively high level and the potential Vcsl of a relatively low level are provided to the potential varying capacitance line alternately every one frame period. The potential COM of a constant level is provided to the holding capacitance line. In this way, the capacitance line is direct-current driven during each frame period. Therefore, even when a width of a capacitance line trunk formed in a peripheral region of a display panel is set narrow, reduction of a display quality attributable to a delay of a signal potential little occurs. Thus, in a liquid crystal display device in which one pixel is divided into the plurality of sub pixels to improve a viewing angle characteristic, a narrow picture-frame by reduction of a wiring region can be realized without reducing a display quality.

<1.6 About Configuration Using Metal Oxide Semiconductor Film for Semiconductor Layer of Transistor>

In the first embodiment, concerning a transistor on the glass substrate 10, a transistor that uses amorphous silicon for semiconductor layers is employed. However, the present invention is not limited thereto, and a transistor may be employed that uses a microcrystalline silicon film, a polycrystalline silicon film, a metal oxide semiconductor film, or the like for semiconductor layers. Further, these semiconductor layers may be a two-layer structure or a multilayer structure made of an intrinsic layer and a low-resistance contact layer, in a similar manner to that when an amorphous silicon TFT is employed.

The microcrystalline silicon film is a silicon film that internally has a mixed state of a crystal phase made of fine crystal grains and an amorphous phase. The polycrystalline silicon film is a film made of a crystal phase and a slight crystal grain boundary present in the crystal phase, and having a very high crystallization rate. Many of metal oxide semiconductor films contain zinc (Zn), indium (In), gallium (Ga), titanium (Ti), or the like as main components, as constituent metal elements. Concrete examples of the metal oxide semiconductor films include a Zn—O based semiconductor (ZnO) film, an In—Ga—Zn—O based semiconductor (IGZO) film, an In—Zn—O based semiconductor (IZO) film, a Zn—Ti—O based semiconductor (ZTO) film, and a Ti—O based semiconductor (titanium dioxide) film. It is particularly preferable that the IGZO film and the ZTO film are amorphous, to have an excellent on-off ratio of transistors.

When a microcrystalline silicon film, a polycrystalline silicon film, and a metal oxide semiconductor film are employed for semiconductor layers, transistors of higher mobility than that of amorphous silicon transistors can be manufactured. Therefore, charge into a capacitance can be quickly performed in each pixel formation portion. Accordingly, reduction of a display quality attributable to a shortage of a charge capacity of a transistor can be suppressed. Because of high mobility, a transistor size can be made small, and a liquid crystal display device can be made further small.

Note that, in each embodiment described below, a transistor that uses a microcrystalline silicon film, a polycrystalline silicon film, a metal oxide semiconductor film, and the like can be also employed for semiconductor layers. However, in each embodiment described below, particularly when a transistor that uses a metal oxide semiconductor film is employed for semiconductor layers, the gate insulation layer 33 and the interlayer insulation layer 35 may be formed by a silicon oxide (SiOx) film, a silicon nitride oxide (SiNxOy) film, or a laminated film of a silicon oxide film and a silicon nitride film.

2. Second Embodiment

<2.1 Entire Configuration>

Figure 10:
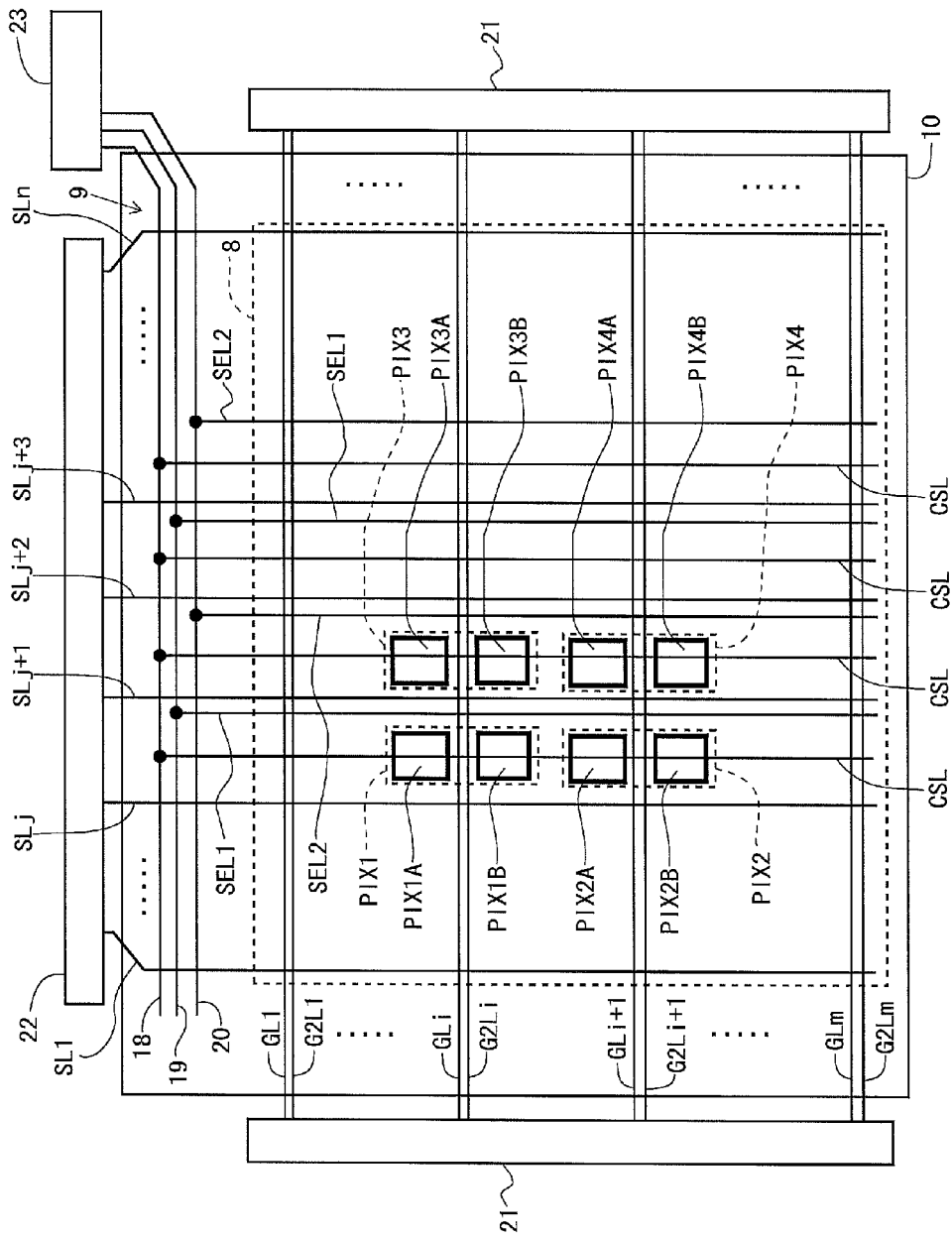
FIG. 10 is a plan view of an active matrix substrate in a second embodiment of the present invention.

Because a schematic configuration of a liquid crystal display device is similar to that of the first embodiment, a description thereof will be omitted (see FIG. 2). FIG. 10 is a plan view of an active matrix substrate 1 in a second embodiment of the present invention. In the present embodiment, a first sub-pixel portion and a second sub-pixel portion (in one pixel formation portion) are laid out to sandwich a first scanning signal line and a second scanning signal line. Other configurations are similar to those of the first embodiment. In the following, points different from those of the first embodiment will be mainly described, and descriptions of points similar to those of the first embodiment will be omitted.

<2.2 Structure of Pixel Formation Portion>
<2.2.1 Planar Structure>

Figure 11:
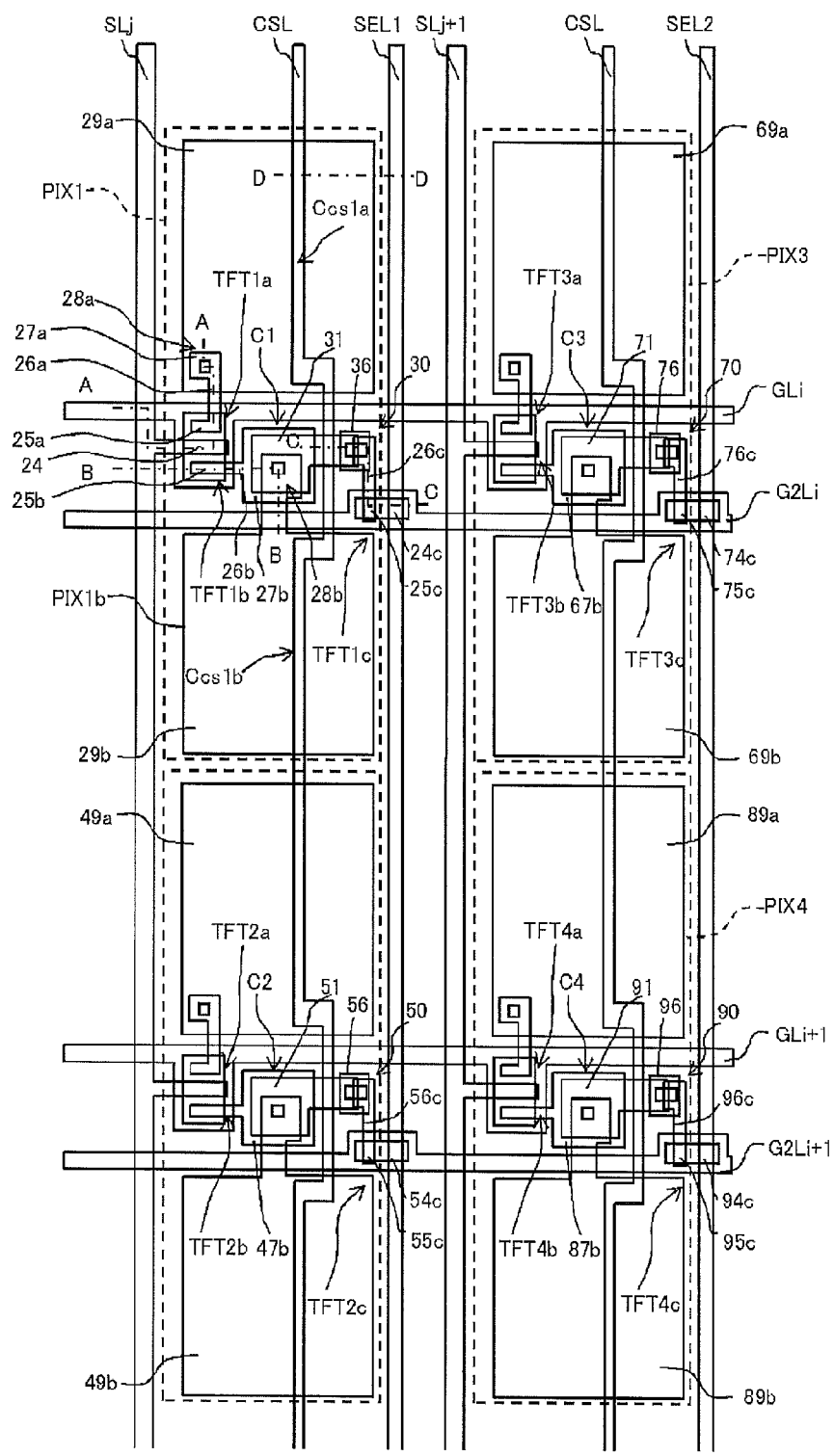
FIG. 11 is a plan view of a region in which pixel formation portions PIX1 to PIX4 are formed in the second embodiment.

FIG. 11 is a plan view of a region in which pixel formation portions PIX1 to PIX4 are formed. In the present embodiment, a first scanning signal line GLi and a second scanning signal line G2Li are arranged to pass between two pixel electrodes 29a, 29b included in the pixel formation portion PIX1 and between two pixel electrodes 69a, 69b included in the pixel formation portion PIX3, and a first scanning signal line GLi+1 and a second scanning signal line G2Li+1 are arranged to pass between two pixel electrodes 49a, 49b included in the pixel formation portion PIX2 and between two pixel electrodes 89a, 89b included in the pixel formation portion PIX4.

Figure 12:
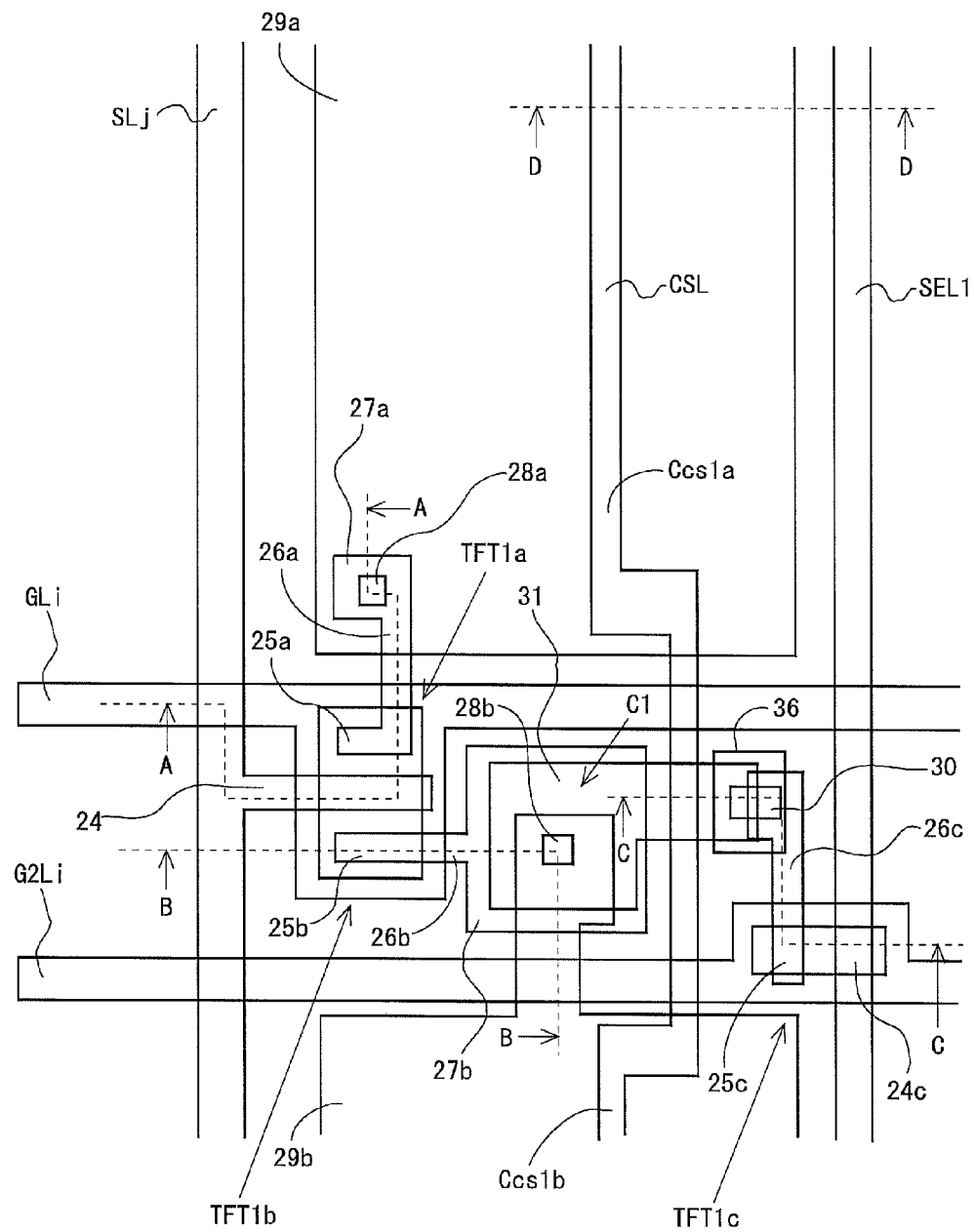
FIG. 12 is an enlarged plan view of a part of a region in which the pixel formation portion PIX1 is formed in the second embodiment.

FIG. 12 is an enlarged plan view of a part of a region in which the pixel formation portion PIX1 is formed. In the present embodiment, the first scanning signal line GLi and the second scanning signal line G2Li are formed at relatively close places. A drain electrode 25c of a third transistor TFT1c is connected to a drain lead line 26c, and the drain lead line 26c is connected to a capacitance electrode 31 via a connection electrode 36 and a contact 30. In a region where a contact 28b for connecting between an electrode 27b and the pixel electrode 29b is formed, the capacitance electrode 31 and the electrode 27b are laid out to be superimposed in a vertical direction on the active matrix substrate 1. Accordingly, a potential varying capacitance Cl is formed.

<2.2.2 Cross-Sectional Structure>

Figure 13:
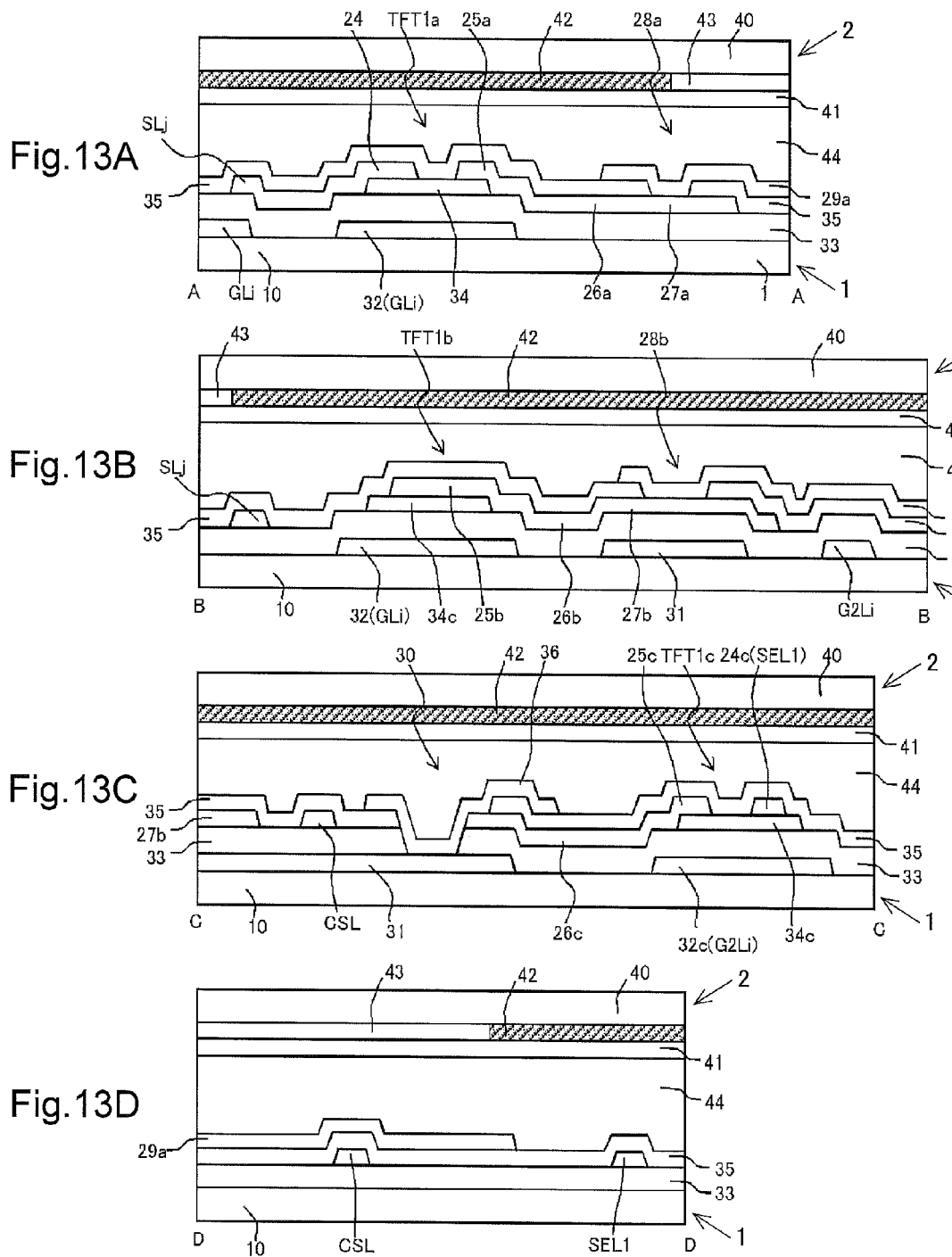
FIG. 13A is a cross-sectional view along line A-A in FIG. 12.
FIG. 13B is a cross-sectional view along line B-B in FIG. 12.
FIG. 13C is a cross-sectional view along line C-C in FIG. 12.
FIG. 13D is a cross-sectional view along line D-D in FIG. 12.

FIG. 13A is a cross-sectional view along line A-A in FIG. 12. FIG. 13B is a cross-sectional view along line B-B in FIG. 12. FIG. 13C is a cross-sectional view along line C-C in FIG. 12. FIG. 13D is a cross-sectional view along line D-D in FIG. 12. In the present embodiment, there are formed the first scanning signal line GLi, the second scanning signal line G2Li, gate electrodes 32, 32c, and the capacitance electrode 31, on a glass substrate 10, and there is formed a gate insulation layer 33 to cover them. On the gate insulation layer 33 in the third transistor TFT1c, there are formed a semiconductor layer 34c, and a source electrode 24c and a drain electrode 25c in contact with the semiconductor layer 34c, and there is formed a drain lead line 26c near them. On a further upper layer, an interlayer insulation layer 35 is formed. A connection electrode 36 is formed on the interlayer insulation layer 35. In the contact 30, the interlayer insulation layer 35 and the gate insulation layer 33 are hollowed out such that the capacitance electrode 31 and the drain lead line 26c are electrically connected via the connection electrode 36. Note that, the contact 30 is formed by hollowing out a first silicon nitride film (at a portion of the contact 30) in a process of forming the gate insulation layer 33 from the first silicon nitride film (refer to the first embodiment).

<2.2.3 Equivalent Circuit>

Figure 14:
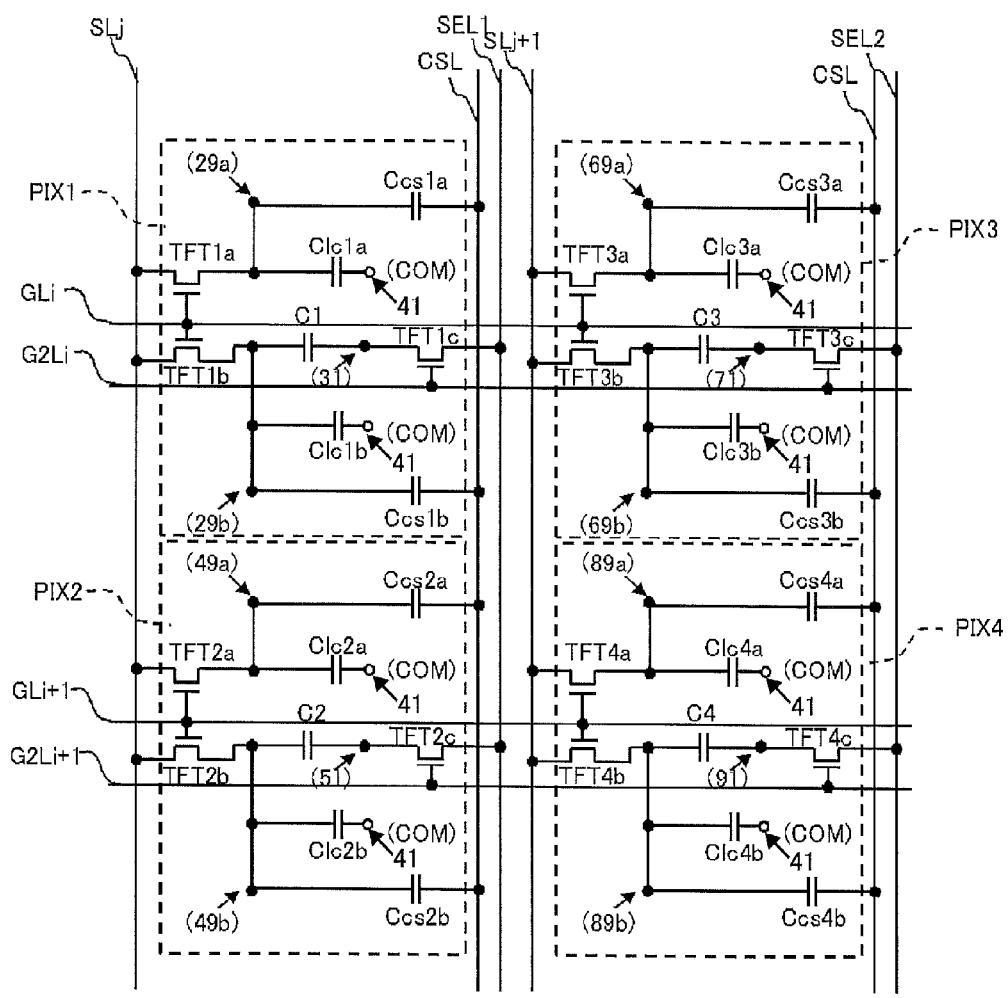
FIG. 14 is an equivalent circuit diagram of pixel formation portions in the second embodiment.

FIG. 14 is an equivalent circuit diagram of pixel formation portions in the present embodiment. The first embodiment and the second embodiment are different in only a arrangement position of a second scanning signal line, and an electrical circuit configuration itself is the same as that of the first embodiment.

<2.3 Driving Method>

As described above, the present embodiment and the first embodiment are the same in the electrical circuit configuration itself. Therefore, a driving method in the present embodiment is the same as the driving method in the first embodiment.

<2.4. Effect>

According to the present embodiment, although a manufacturing process becomes slightly complex because of a complex structure near a potential varying capacitance as compared with the first embodiment, an effect similar to that of the first embodiment can be obtained.

3. Third Embodiment

<3.1 Entire Configuration>

Figure 15:
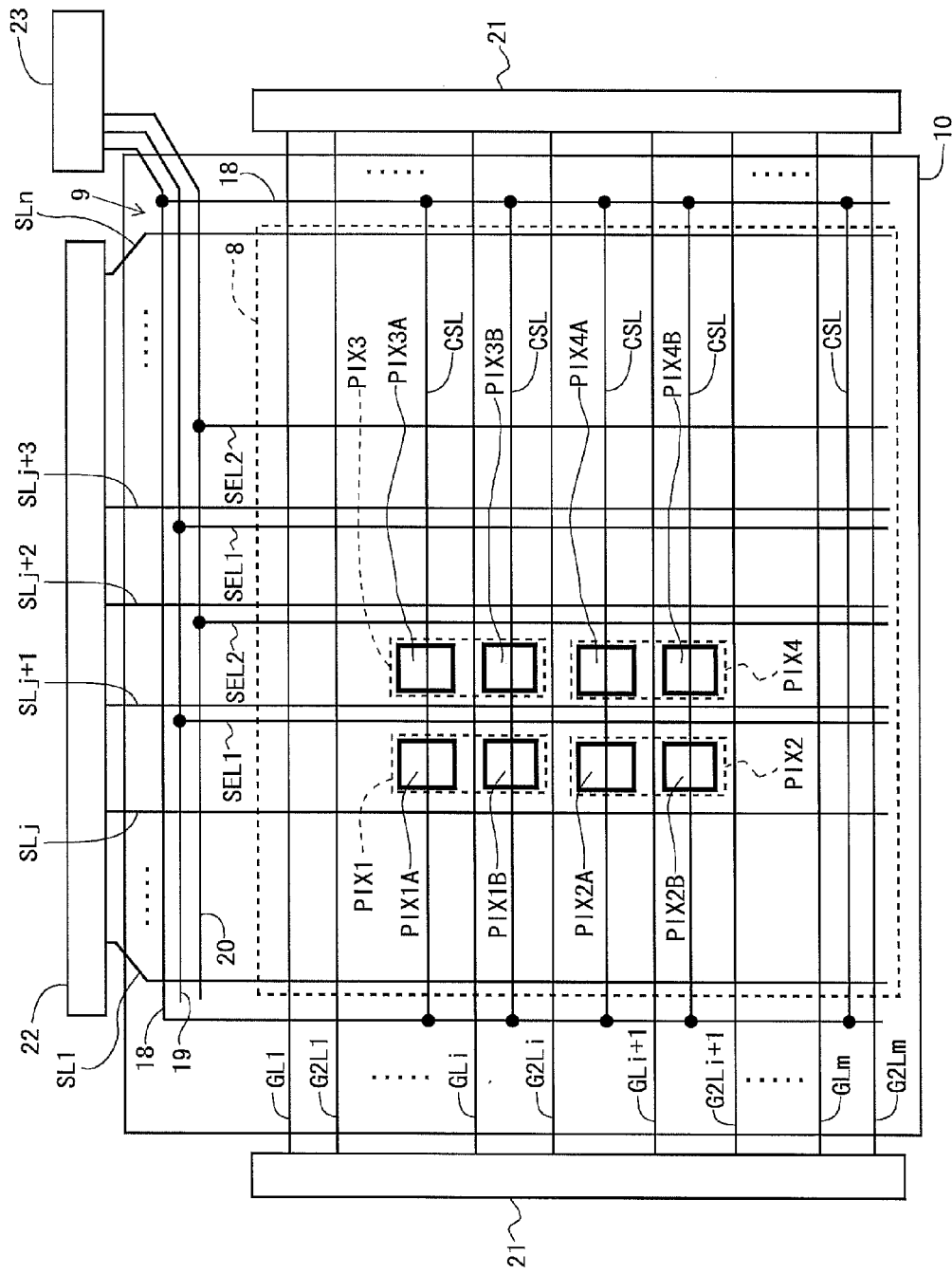
FIG. 15 is a plan view of an active matrix substrate in a third embodiment of the present invention.

Because a schematic configuration of a liquid crystal display device is similar to that of the first embodiment, a description thereof will be omitted (see FIG. 2). FIG. 15 is a plan view of an active matrix substrate 1 in a third embodiment of the present invention. In the present embodiment, a holding-capacitance line trunk 18 is arranged to extend to a region between a display region 8 and a gate driver unit 21 in a peripheral region 9, and holding capacitance lines CSL are formed to extend from the holding-capacitance line trunk 18 into the display region 8 in parallel with a first scanning signal line and a second scanning signal line. In this way, in the present embodiment, unlike in the first embodiment, the holding capacitance lines CSL are arranged to extend in parallel with the first scanning signal line and the second scanning signal line.

<3.2 Structure of Pixel Formation Portion>
<3.2.1 Planar Structure>

Figure 16:
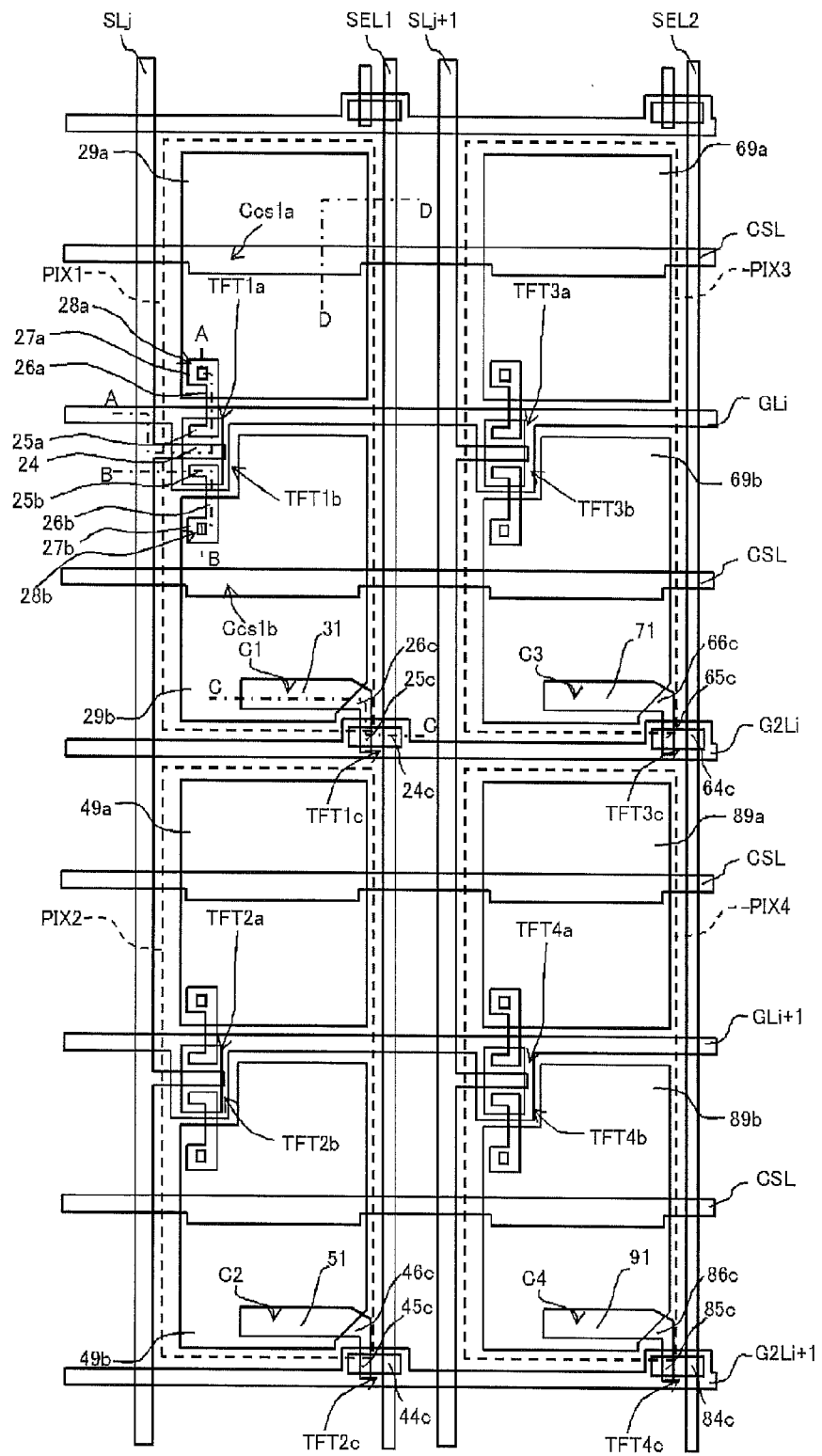
FIG. 16 is a plan view of a region in which pixel formation portions PIX1 to PIX4 are formed in the third embodiment.

FIG. 16 is a plan view of a region in which pixel formation portions PIX1 to PIX4 are formed. In the present embodiment, the holding capacitance lines CSL are arranged to pass on first sub-pixel portions PIX1A, PIX3A, on second sub-pixel portions PIX1B, PIX3B, on first sub-pixel portions PIX2A, PIX4A, and on second sub-pixel portions PIX2B, PIX4B, respectively.

Figure 17:
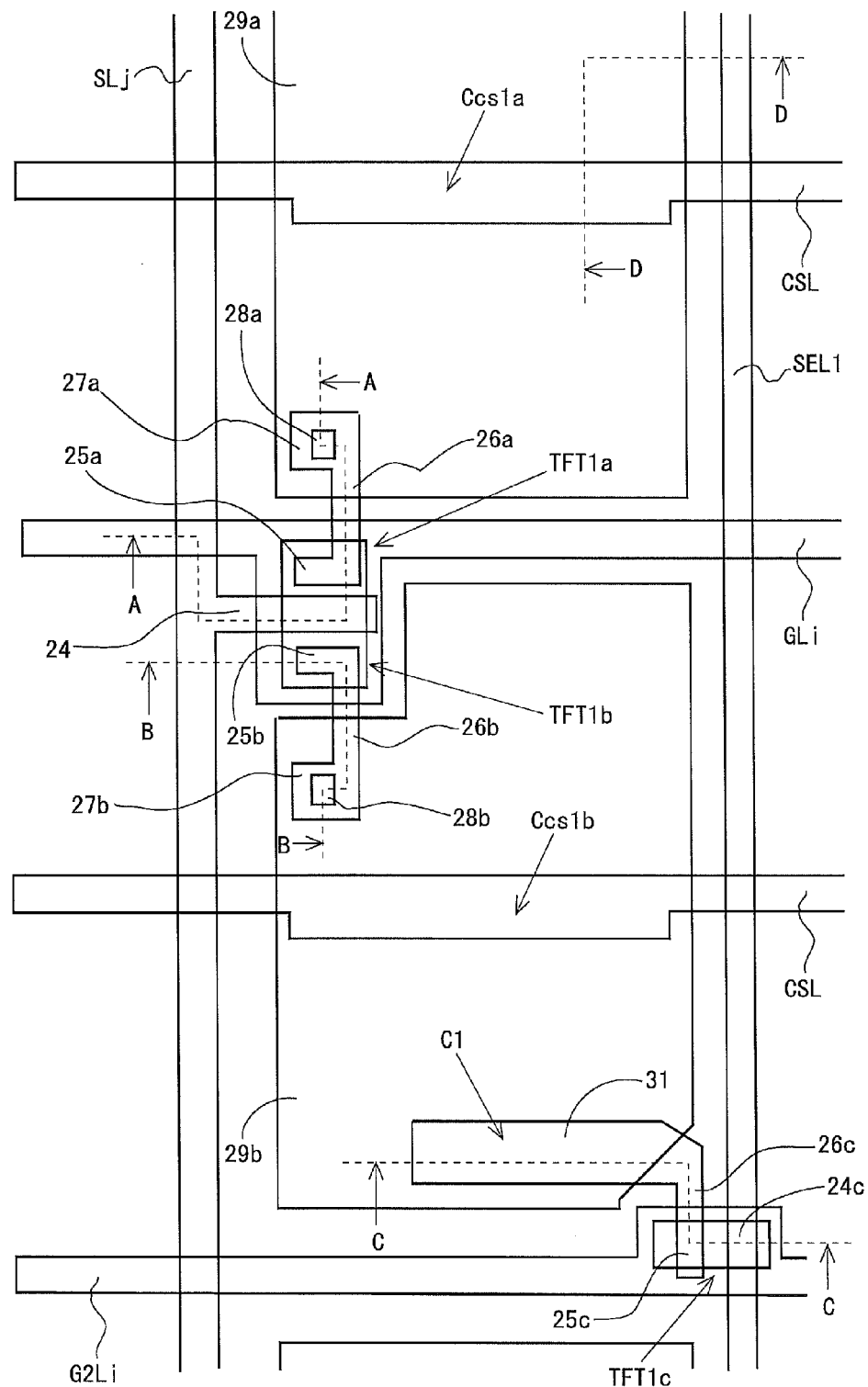
FIG. 17 is an enlarged plan view of a part of a region in which the pixel formation portion PIX1 is formed in the third embodiment.

FIG. 17 is an enlarged plan view of a part of a region in which the pixel formation portion PIX1 is formed. In the first embodiment, because the holding capacitance line CSL is arranged to extend in parallel with the data signal line, the capacitance electrode 31 is also formed to extend in parallel with the data signal line. This is because when the capacitance electrode 31 is formed to extend in parallel with the first scanning signal line and the second scanning signal line, for example, there is a possibility that there occurs a portion where the holding capacitance line CSL and the capacitance electrode 31 are superimposed in a vertical direction on the active matrix substrate 1. On the other hand, in the present embodiment, the holding capacitance line CSL is arranged to extend in parallel with the first scanning signal line and the second scanning signal line. Therefore, the capacitance electrode 31 is formed to extend in parallel with the first scanning signal line and the second scanning signal line. When the capacitance C1 having a desired capacitance value is formed by the capacitance electrode 31 and the pixel electrode 29b, formation of the capacitance electrode 31 is not particularly limited.

<3.2.2 Cross-Sectional Structure>

A cross-sectional view along line A-A in FIG. 17 is similar to the cross-sectional view shown in FIG. 6A. A cross-sectional view along line B-B in FIG. 17 is similar to the cross-sectional view shown in FIG. 6B. A cross-sectional view along line C-C in FIG. 17 is similar to the cross-sectional view shown in FIG. 6C. A cross-sectional view along line D-D in FIG. 17 is similar to the cross-sectional view shown in FIG. 6D. Therefore, a description of a cross-sectional structure will be omitted.

<3.2.3 Equivalent Circuit>

Figure 18:
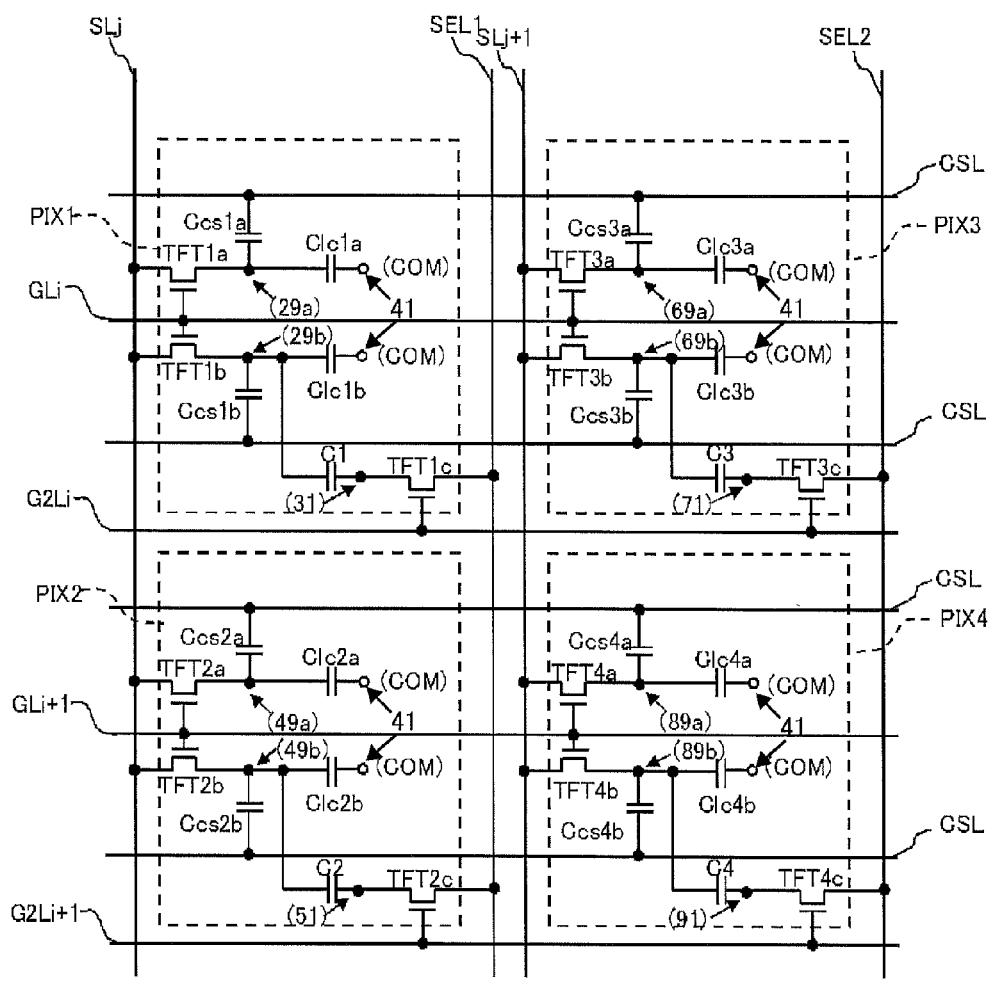
FIG. 18 is an equivalent circuit diagram of pixel formation portions in the third embodiment.

FIG. 18 is an equivalent circuit diagram of pixel formation portions in the present embodiment. The present embodiment and the first embodiment are different in a sub-pixel portion connected to each holding capacitance line CSL. Specifically, in the first embodiment, the sub-pixel portions (PIX1A, PIX1B, PIX2A, and PIX2B in FIG. 3, for example) that are continuously laid out in a direction to which the data signal lines extend are connected to the same holding capacitance line. On the other hand, in the present embodiment, sub-pixel portions (PIX1A and PIX3A in FIG. 15, for example) that are continuously laid out in a direction to which the first scanning signal line and the second scanning signal line extend are connected to the same holding capacitance line.

<3.3 Driving Method>

The present embodiment and the first embodiment are different in only a connection relationship between the holding capacitance line CSL and the sub-pixel portion, concerning an electrical circuit configuration. Here, all the holding capacitance lines CSL arranged in the display region 8 are driven in a similar manner. Therefore, a driving method in the present embodiment is the same as the driving method in the first embodiment.

<3.4 Effect>

In the first embodiment, three lines (a data signal line, a holding capacitance line, and a first capacitance line or a second capacitance line) are present per one pixel as lines that cross the first scanning signal line and the second scanning signal line. On the other hand, according to the present embodiment, two lines (a data signal line, and a first capacitance line or a second capacitance line) are present per one pixel as lines that cross the first scanning signal line and the second scanning signal line. In this way, according to the present embodiment, the number of intersections between the first scanning signal line, the second scanning signal line and other lines becomes small.

Thus, an effect similar to that of the first embodiment can be obtained, and further, loads of the first scanning signal line and the second scanning signal line can be decreased as compared with the first embodiment. However, because the number of intersections between the data signal lines and other lines become large, loads of the data signal lines increase.

4. Fourth Embodiment

<4.1 Entire Configuration>

Figure 19:
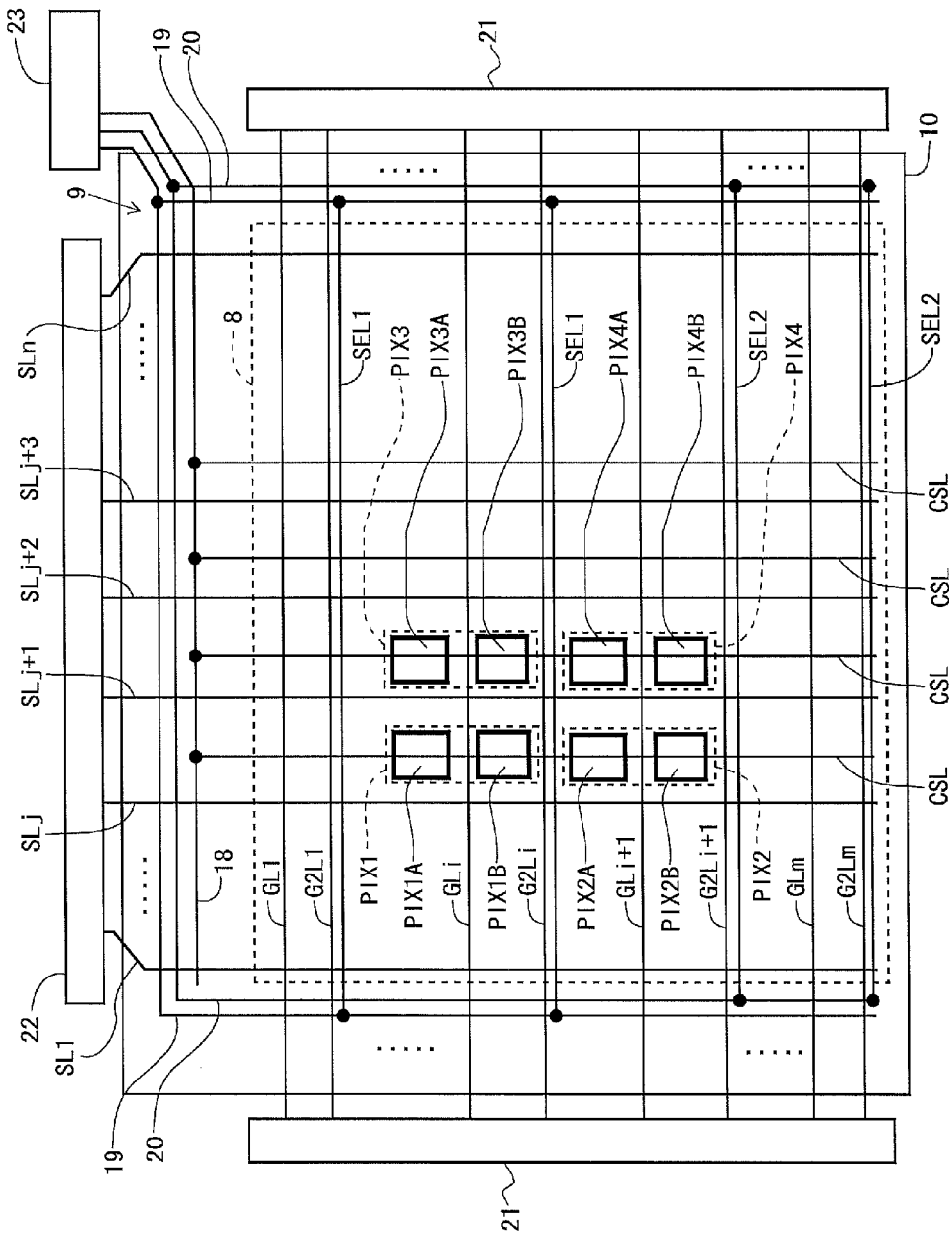
FIG. 19 is a plan view of an active matrix substrate in a fourth embodiment of the present invention.

Because a schematic configuration of a liquid crystal display device is similar to that of the first embodiment, a description thereof will be omitted (see FIG. 2). FIG. 19 is a plan view of an active matrix substrate 1 in a fourth embodiment of the present invention. In the present embodiment, a first capacitance line trunk 19 and a second capacitance line trunk 20 are arranged to extend to a region between a display region 8 and a gate driver unit 21 in a peripheral region 9. A first capacitance line SEL1 is formed to extend from the first capacitance line trunk 19 into the display region 8 in parallel with a first scanning signal line and a second scanning signal line, and a second capacitance line SEL2 is formed to extend from the second capacitance line trunk 20 into the display region 8 in parallel with the first scanning signal line and the second scanning signal line. In this way, in the present embodiment, unlike in the first to third embodiments, the first capacitance line SEL1 and the second capacitance line SEL2 are arranged to extend in parallel with the first scanning signal line and the second scanning signal line. Note that, the first capacitance line SEL1 and the second capacitance line SEL2 are provided to alternately correspond to a pixel matrix, for each one row.

<4.2 Structure of Pixel Formation Portion>
<4.2.1 Planar Structure>

Figure 20:
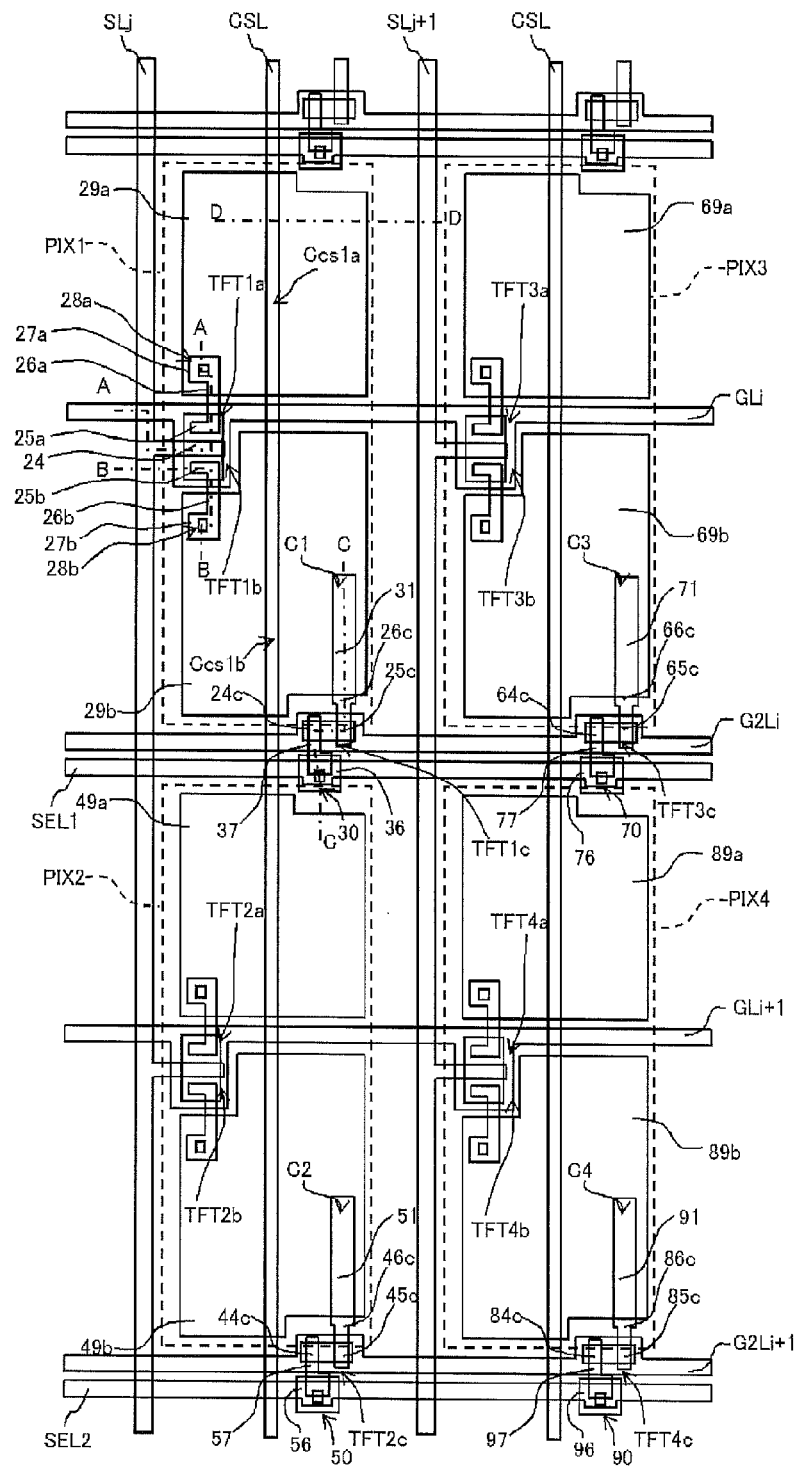
FIG. 20 is a plan view of a region in which pixel formation portions PIX1 to PIX4 are formed in the fourth embodiment.

FIG. 20 is a plan view of a region in which pixel formation portions PIX1 to PIX4 are formed. In the present embodiment, a second scanning signal line G2Li is arranged along one side (a lower side in FIG. 20) of the pixel formation portions PIX1, PIX3, and the first capacitance line SEL1 is arranged along the second scanning signal line G2Li. Further, a second scanning signal line G2Li+1 is arranged along one side of the pixel formation portions PIX2, PIX4, and the second capacitance line SEL2 is arranged along the second scanning signal line G2Li+1.

Figure 21:
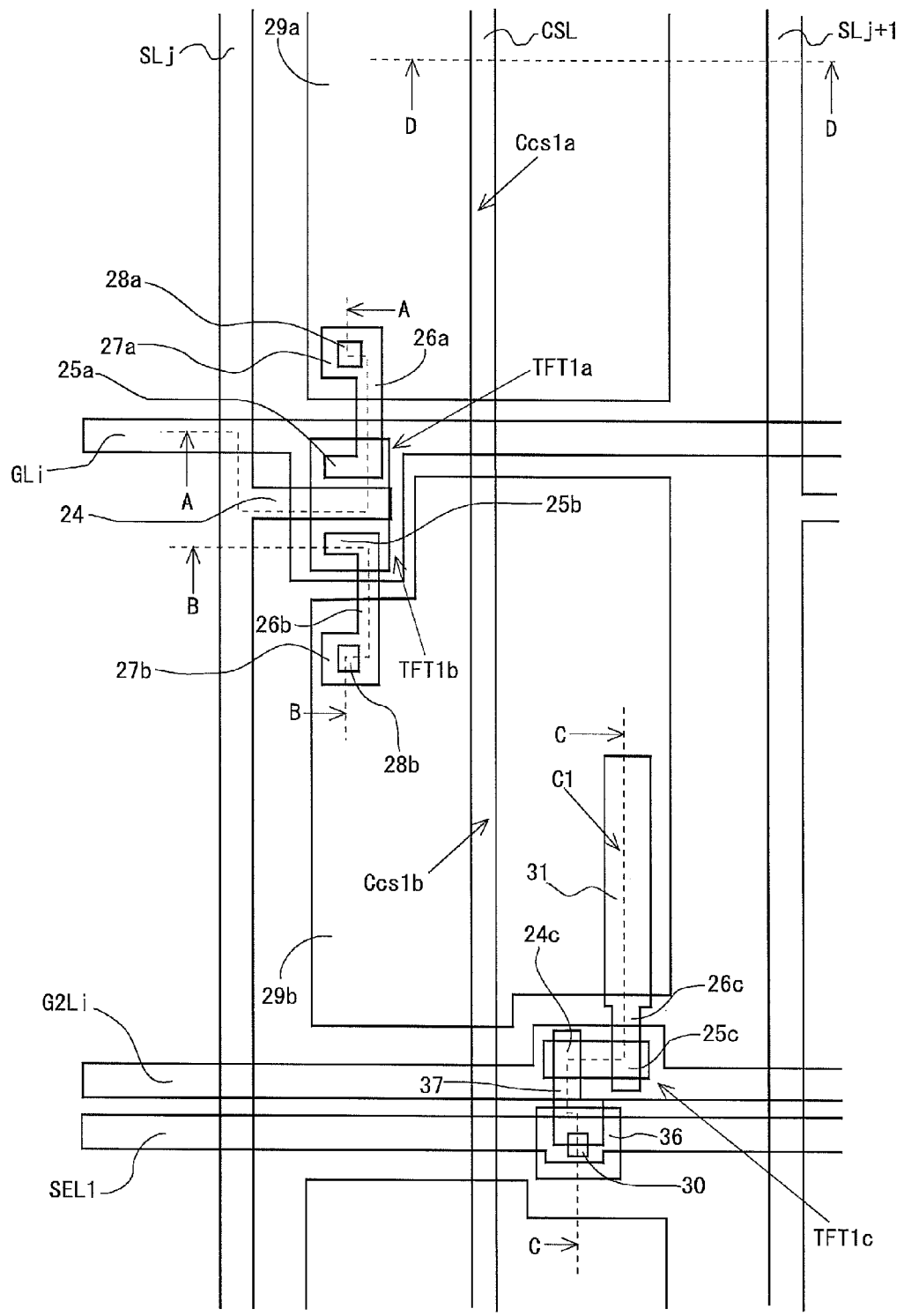
FIG. 21 is an enlarged plan view of a part of a region in which the pixel formation portion PIX1 is formed in the fourth embodiment.

FIG. 21 is an enlarged plan view of a part of a region in which the pixel formation portion PIX1 is formed. In the present embodiment, a source electrode 24*c* of a third transistor TFT1*c* is connected to a source lead line 37. The source lead line 37 is connected to the first capacitance line SEL1 via a connection electrode 36 and a contact 30.

<4.2.2 Cross-Sectional Structure>

Figure 22:
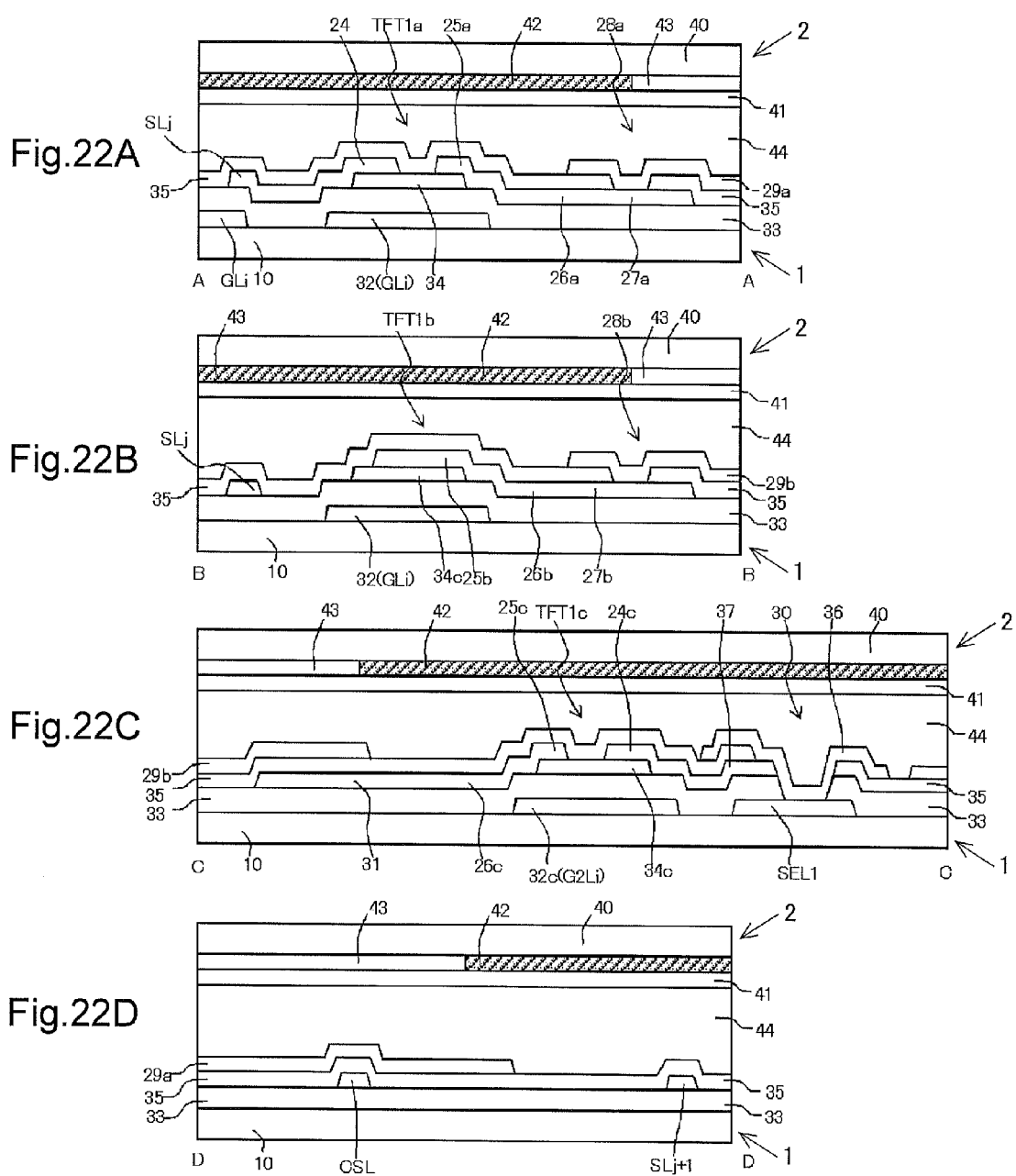
FIG. 22A is a cross-sectional view along line A-A in FIG. 21.
FIG. 22B is a cross-sectional view along line B-B in FIG. 21.
FIG. 22C is a cross-sectional view along line C-C in FIG. 21.
FIG. 22D is a cross-sectional view along line D-D in FIG. 21.

FIG. 22A is a cross-sectional view along line A-A in FIG. 21. FIG. 22B is a cross-sectional view along line B-B in FIG. 21. FIG. 22C is a cross-sectional view along line C-C in FIG. 21. FIG. 22D is a cross-sectional view along line D-D in FIG. 21. In the present embodiment, there are formed the first scanning signal line GLi, the second scanning signal line G2Li, gate electrodes 32, 32*c*, and the first capacitance line SEL1, on a glass substrate 10, and there is formed a gate insulation layer 33 to cover them. On the gate insulation layer 33 in the third transistor TFT1*c*, there are formed a semiconductor layer 34*c*, and a source electrode 24*c* and a drain electrode 25*c* in contact with the semiconductor layer 34*c*, and there are formed a source lead line 37, a drain lead line 26*c*, and a capacitance electrode 31, near them. On a further upper layer, an interlayer insulation layer 35 is formed. A connection electrode 36 is formed on the interlayer insulation layer 35. In the contact 30, the interlayer insulation layer 35 and the gate insulation layer 33 are hollowed out such that the first capacitance line SEL1 and the source lead line 37 are electrically connected via the connection electrode 36. As shown in FIG. 22D, holding capacitance lines CSL are also formed on the gate insulation layer 33.

<4.2.3 Equivalent Circuit>

Figure 23:
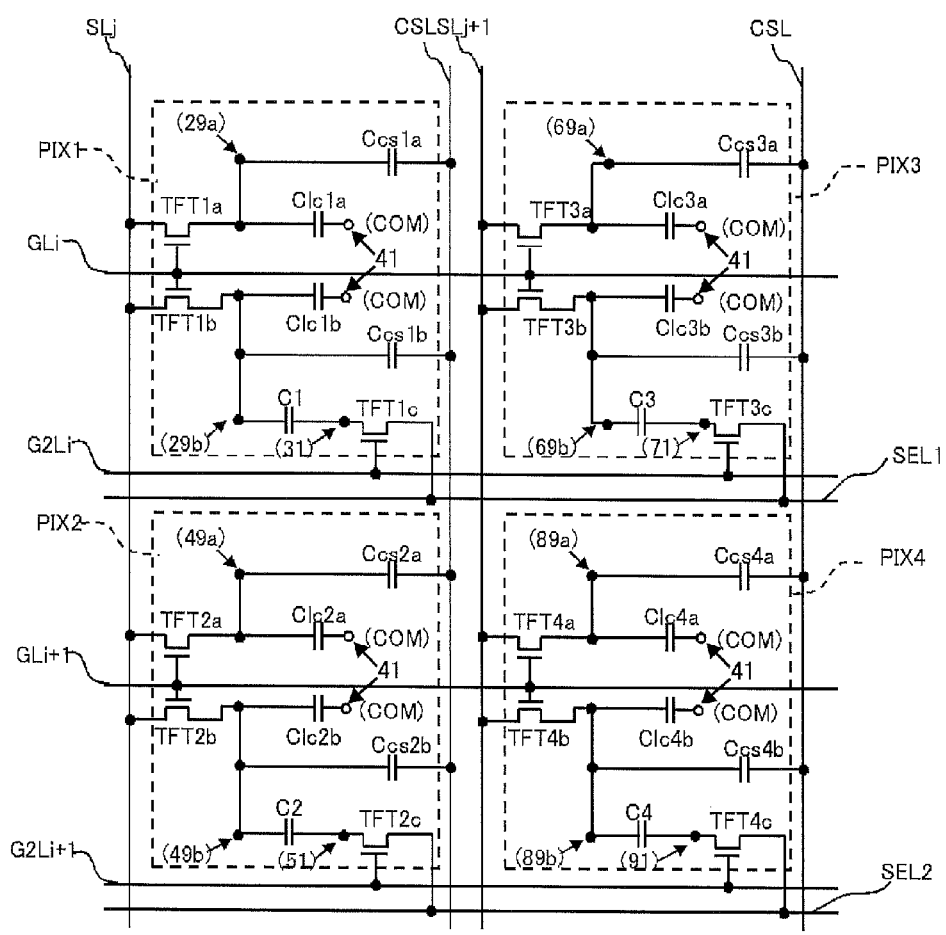
FIG. 23 is an equivalent circuit diagram of pixel formation portions in the fourth embodiment.

FIG. 23 is an equivalent circuit diagram of pixel formation portions in the present embodiment. The present embodiment and the first embodiment are different in a pixel formation portion connected to each first capacitance line SEL1. Specifically, in the first embodiment, the pixel formation portions (PIX1 and PIX2 in FIG. 7, for example) continuously laid out in a direction to which the data signal lines extend are connected to the same first capacitance line SEL1. On the other hand, in the present embodiment, pixel formation portions (PIX1 and PIX3 in FIG. 23, for example) continuously laid out in a direction to which the first scanning signal line and the second scanning signal line extend are connected to the same first capacitance line SEL1. This is similarly applied to the second capacitance line SEL2.

<4.3 Driving Method>

In the first embodiment, the first capacitance line SEL1 and the second capacitance line SEL2 are formed to extend in parallel with the data signal lines. On the other hand, in the present embodiment, the first capacitance line SEL1 and the second capacitance line SEL2 are formed to extend in parallel with the first scanning signal line and the second scanning signal line. Further, a potential Vcsh of a relatively high level and a potential Vcsl of a relatively low level are provided to the first capacitance line SEL1 and the second capacitance line SEL2 alternately every one frame period.

Figure 24:
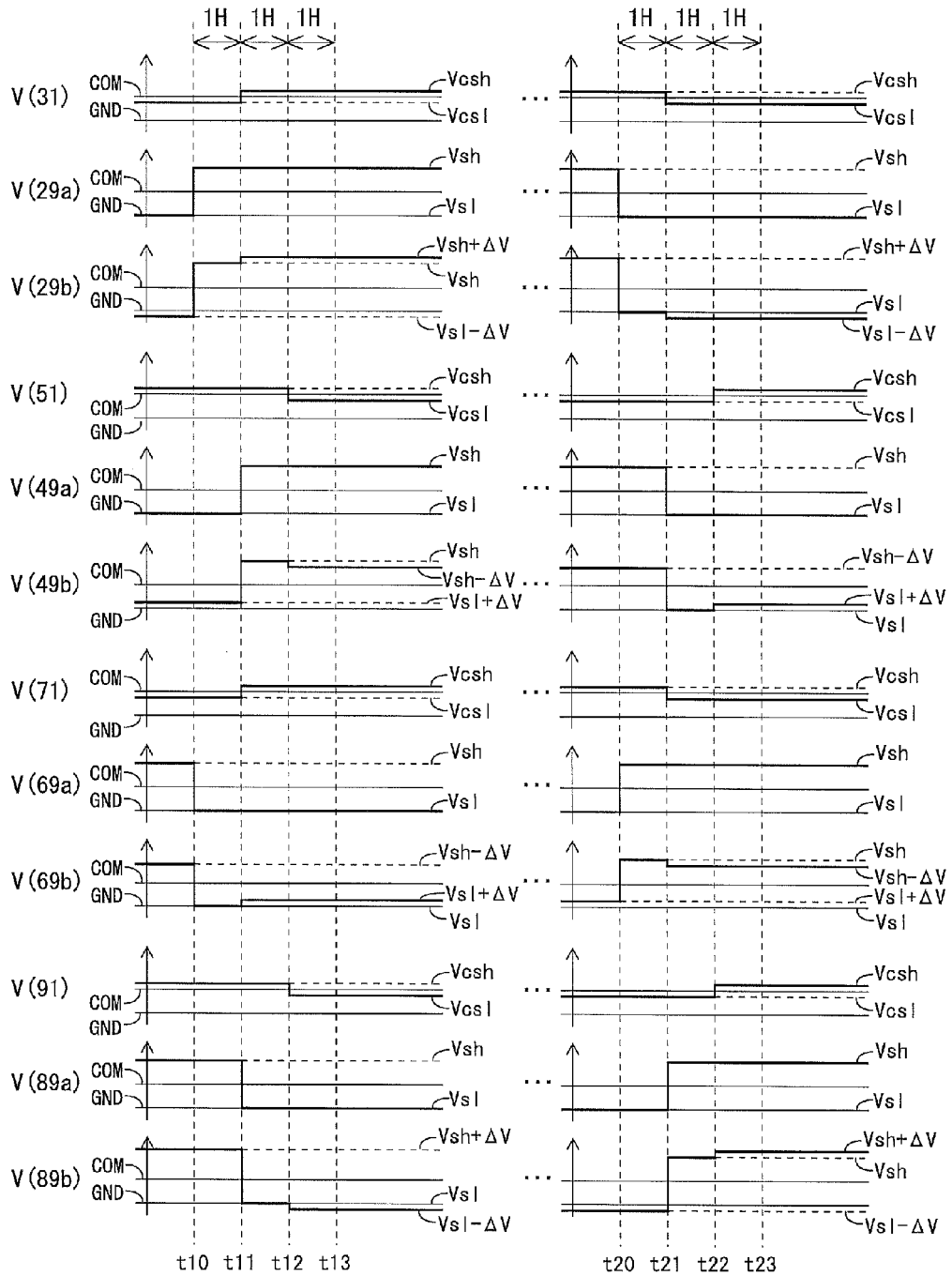
FIG. 24 is a signal waveform diagram for describing a driving method in the fourth embodiment.

Thus, changes of potentials of pixel electrodes 49a, 49b, and a capacitance electrode 51 that are included in the pixel formation portion PIX2 in the present embodiment become the same as changes of the potentials of pixel electrodes 69a, 69b, and the capacitance electrode 71 that are included in the pixel formation portion PIX3 in the first embodiment. Further, changes of potentials of the pixel electrodes 69a, 69b and a capacitance electrode 71 that are included in the pixel formation portion PIX3 in the present embodiment become the same as the changes of the potentials of the pixel electrodes 49a, 49b and the capacitance electrode 51 that are included in the pixel formation portion PIX2 in the first embodiment. That is, in the present embodiment, changes of potentials of the capacitance electrode 31, the pixel electrodes 29a, 29b, the capacitance electrode 51, the pixel electrodes 49a, 49b, the capacitance electrode 71, the pixel electrodes 69a, 69b, a capacitance electrode 91, and pixel electrodes 89a, 89b become as shown in FIG. 24.

<4.4 Effect>

In the first embodiment, three lines (the data signal line, the holding capacitance line, and the first capacitance line or the second capacitance line) are present per one pixel as lines that cross the first scanning signal line and the second scanning signal line. On the other hand, in the present embodiment, two lines (a data signal line and a holding capacitance line) are present per one pixel as lines that cross the first scanning signal line and the second scanning signal line. In this way, according to the present embodiment, the number of intersections between the first scanning signal line, the second scanning signal line and other lines becomes small.

Thus, an effect similar to that of the first embodiment can be obtained, and further, loads of the first scanning signal line and the second scanning signal line can be decreased as compared with the first embodiment, and reduction of a display quality attributable to a delay of a scanning signal can be suppressed. However, because the number of intersections between the data signal lines and other lines become large, loads of the data signal lines increase.

5. Fifth Embodiment

<5.1 Entire Configuration>

Figure 25:
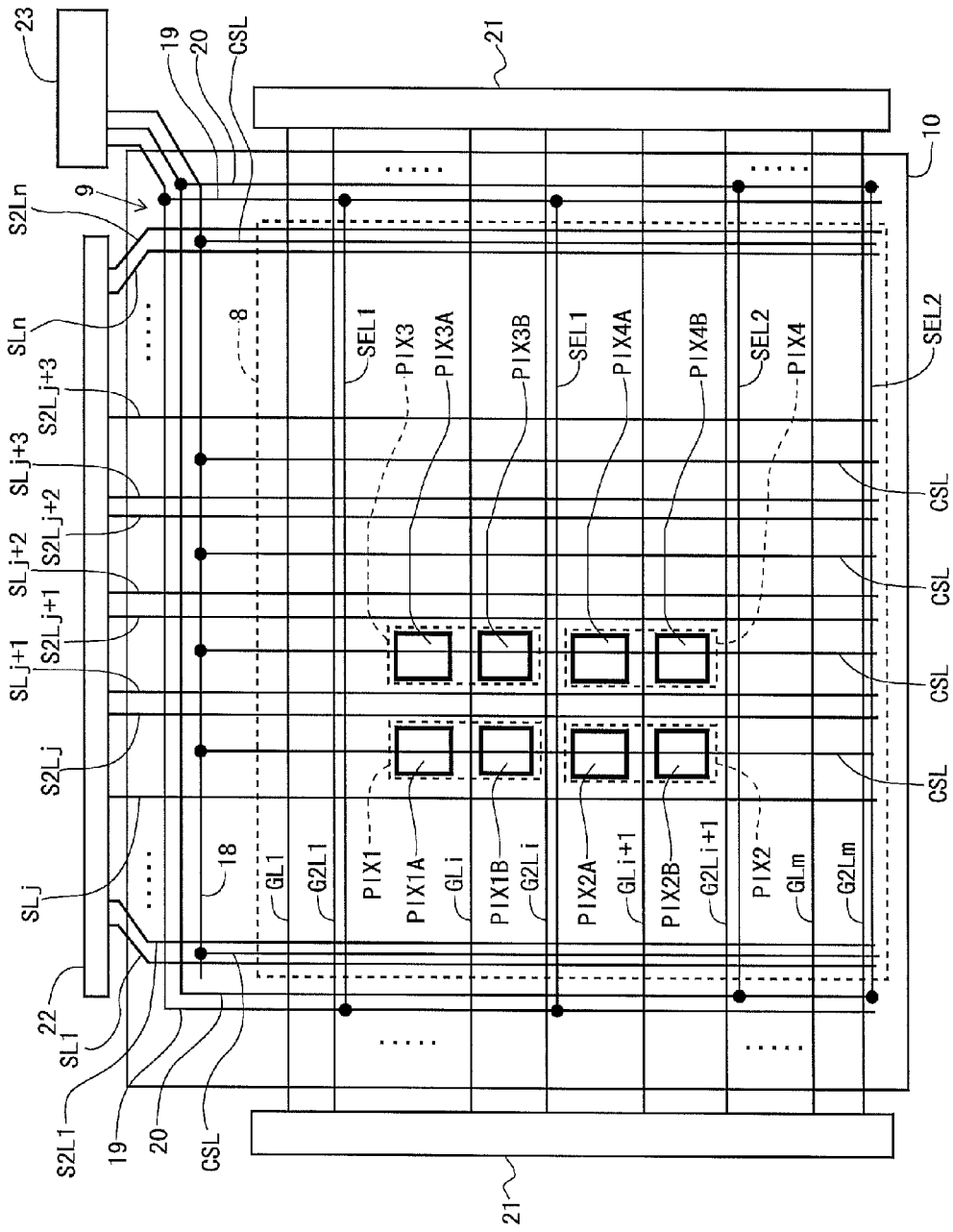
FIG. 25 is a plan view of an active matrix substrate in a fifth embodiment of the present invention.

Because a schematic configuration of a liquid crystal display device is similar to that of the first embodiment, a description thereof will be omitted (see FIG. 2). FIG. 25 is a plan view of an active matrix substrate 1 in a fifth embodiment of the present invention. In the present embodiment, a first capacitance line trunk 19, a second capacitance line trunk 20, a first capacitance line SEL1, and a second capacitance line SEL2 are formed in a similar manner to that in the fourth embodiment (see FIG. 19). Further, in the present embodiment, two data signal lines are provided for each column of a pixel matrix. Specifically, there are provided first data signal lines SL1 to SLn arranged at a left side of a pixel formation portion in FIG. 25, and second data signal lines S2L1 to S2Ln arranged at a right side of the pixel formation portion in FIG. 25.

<5.2 Structure of Pixel Formation Portion>
<5.2.1 Planar Structure>

Figure 26:
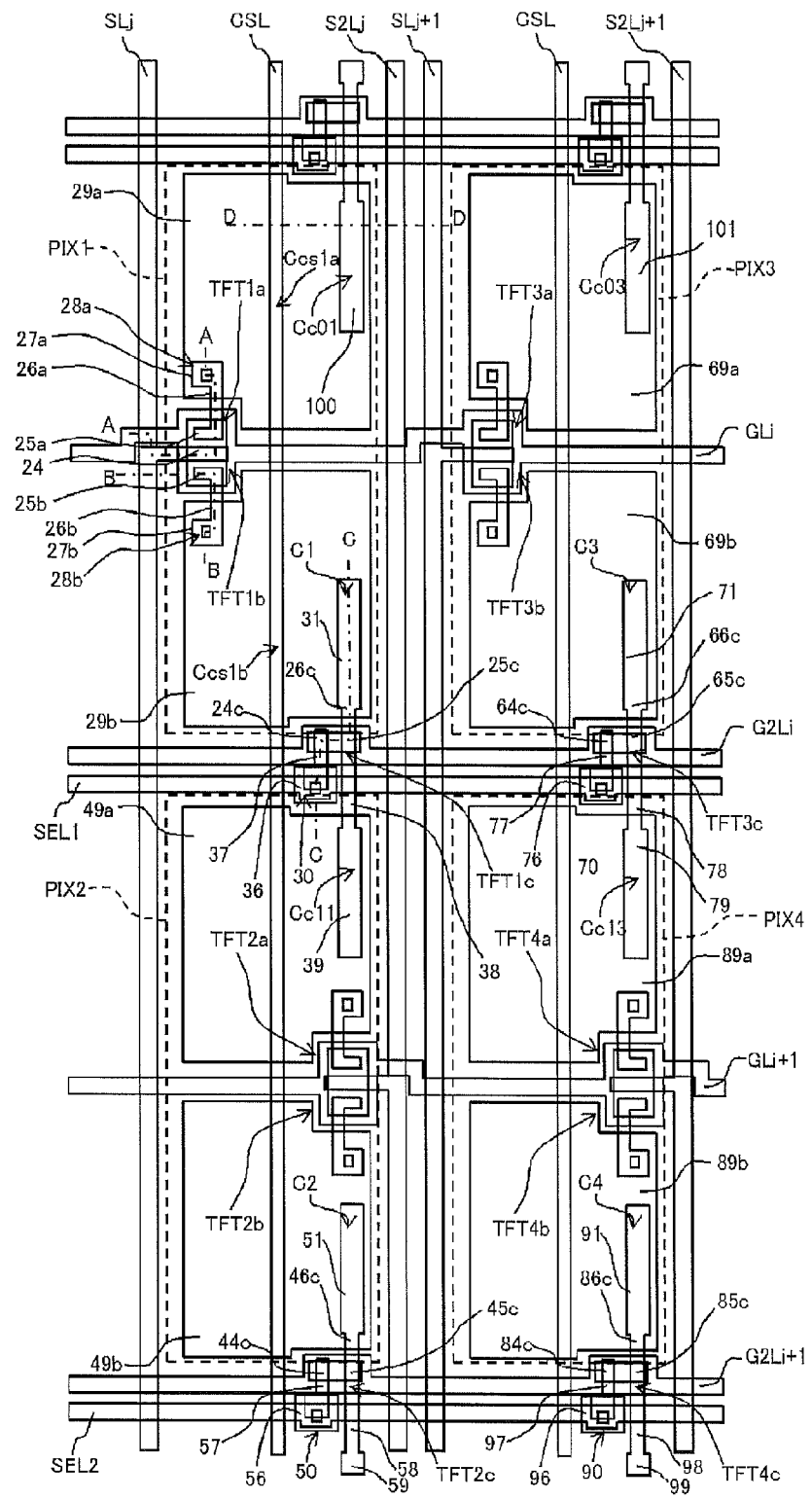
FIG. 26 is a plan view of a region in which pixel formation portions PIX1 to PIX4 are formed in the fifth embodiment.

FIG. 26 is a plan view of a region in which pixel formation portions PIX1 to PIX4 are formed. In the present embodiment, a first data signal line SLj is arranged along one side (a left side in FIG. 26) of pixel formation portions PIX1, PIX2, and a second data signal line S2Lj is arranged along the other side (a right side in FIG. 26) of the pixel formation portions PIX1, PIX2. Further, a first data signal line SLj+1 is arranged along one side of pixel formation portions PIX3, PIX4, and a second data signal line S2Lj+1 is arranged along the other side of the pixel formation portions PIX3, PIX4.

A first transistor TFT1a and a second transistor TFT1b are provided to be connected to the first data signal line SLj, in the pixel formation portion PIX1. A first transistor TFT2a and a second transistor TFT2b are provided to be connected to the second data signal line S2Lj, in the pixel formation portion PIX2. A first transistor TFT3a and a second transistor TFT3b are provided to be connected to the first data signal line SLj+1, in the pixel formation portion PIX3. A first transistor TFT4a and a second transistor TFT4b are provided to be connected to the second data signal line S2Lj+1, in the pixel formation portion PIX4. In this way, when attention is focused on each column of a pixel matrix, pixel formation portions are alternately connected for each one row to a first data signal line and a second data signal line.

In the present embodiment, a second scanning signal line G2Li is arranged along one side (a lower side in FIG. 26) of the pixel formation portions PIX1, PIX3, and a first capacitance line SEL1 is arranged along the second scanning signal line G2Li. Further, a second scanning signal line G2Li+1 is arranged along one side of the pixel formation portions PIX2, PIX4, and the second capacitance line SEL2 is arranged along the second scanning signal line G2Li+1.

Incidentally, in the present embodiment, a capacitance is formed by an electrode electrically connected to a capacitance electrode in a second sub-pixel portion included in each row of the pixel matrix, and a pixel electrode in a first sub-pixel portion included in the next row. For example, a capacitance Cc11 is formed by an electrode 39 connected to a capacitance electrode 31 in a second sub-pixel portion of the pixel formation portion PIX1 (the capacitance electrode 31 and the electrode 39 are integrally formed), and a pixel electrode 49a in a first sub-pixel portion of the pixel formation portion PIX2.

Figure 27:
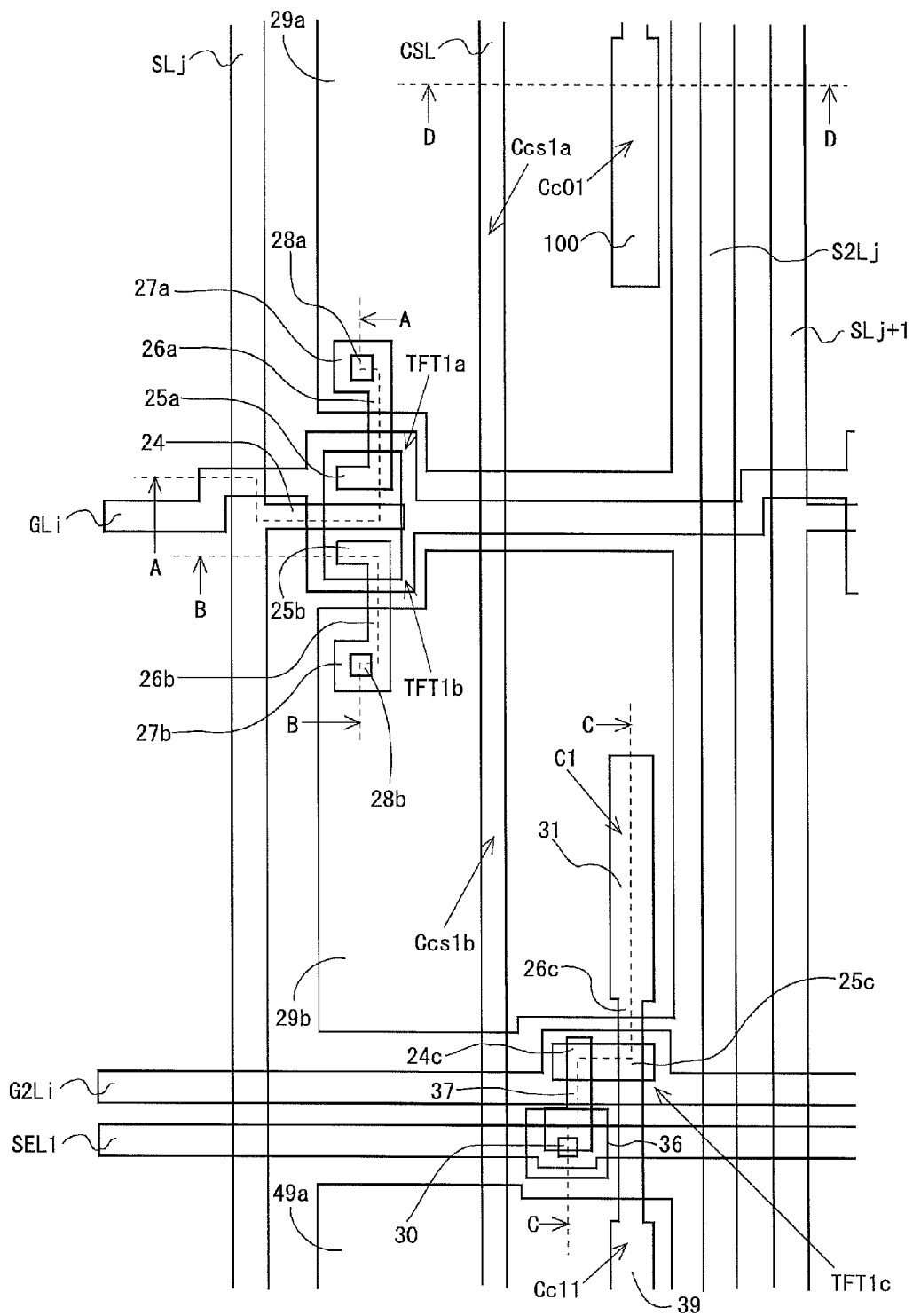
FIG. 27 is an enlarged plan view of a part of a region in which the pixel formation portion PIX1 is formed in the fifth embodiment.

FIG. 27 is an enlarged plan view of a part of a region in which the pixel formation portion PIX1 is formed. In the present embodiment, a source electrode 24c of a third transistor TFT1c is connected to a source lead line 37, and the source lead line 37 is connected to the first capacitance line SEL1 via a connection electrode 36 and a contact 30. In the first sub-pixel portion PIX1A, a capacitance electrode 100 is formed in a region between a holding capacitance line CSL and the second data signal line S2Lj. The capacitance electrode 100 and a pixel electrode 29a are laid out to be superimposed in a vertical direction on the active matrix substrate 1. Accordingly, a capacitance Cc01 is formed.

<5.2.2 Cross-Sectional Structure>

Figure 28:
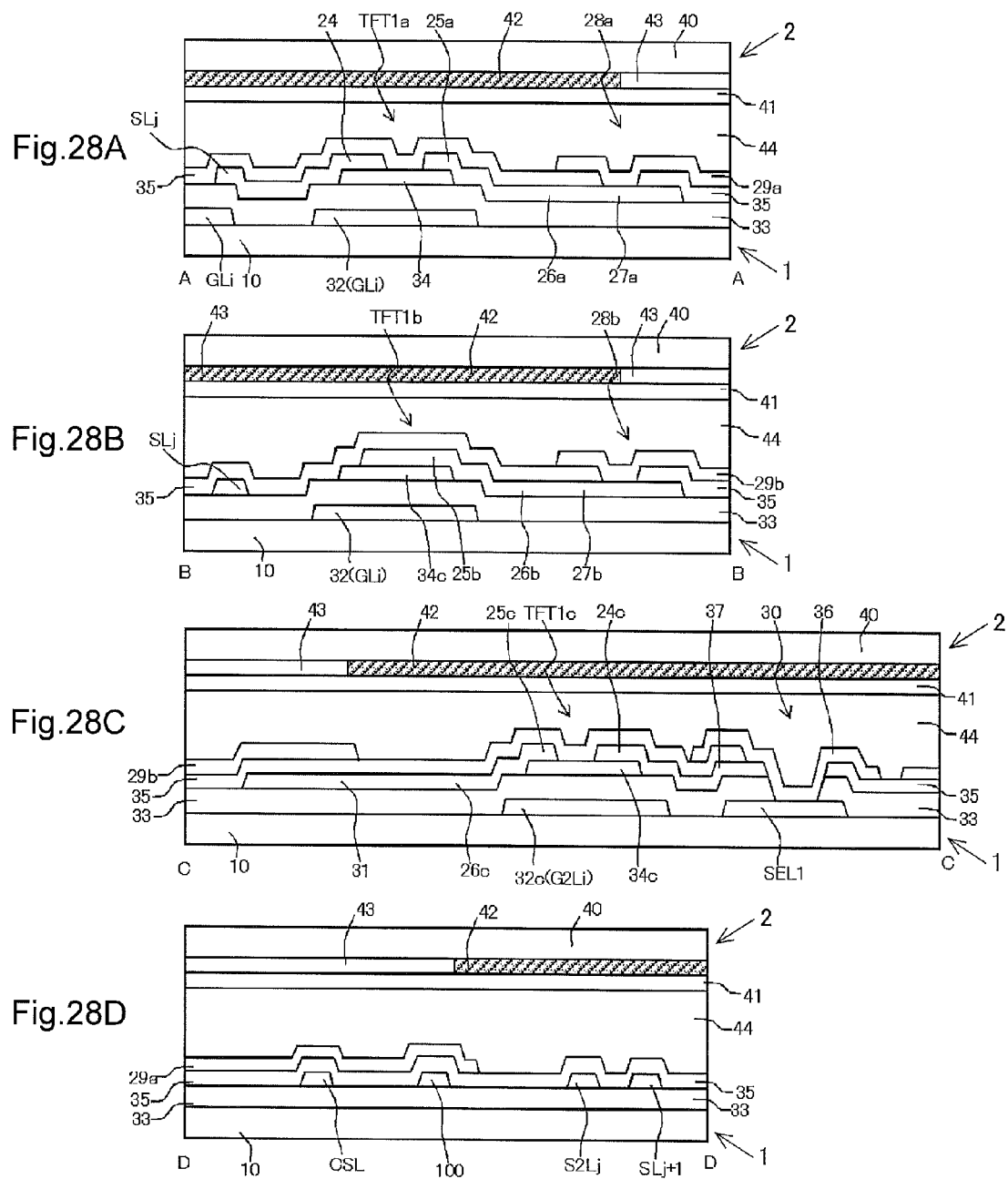
FIG. 28A is a cross-sectional view along line A-A in FIG. 27.
FIG. 28B is a cross-sectional view along line B-B in FIG. 27.
FIG. 28C is a cross-sectional view along line C-C in FIG. 27.
FIG. 28D is a cross-sectional view along line D-D in FIG. 27.

FIG. 28A is a cross-sectional view along line A-A in FIG. 27. FIG. 28B is a cross-sectional view along line B-B in FIG. 27. FIG. 28C is a cross-sectional view along line C-C in FIG. 27. FIG. 28D is a cross-sectional view along line D-D in FIG. 27. A cross-sectional structure near the first transistor TFT1a, the second transistor TFT1b, and the third transistor TFT1c is similar to that in the fourth embodiment. In the present embodiment, as shown in FIG. 28D, holding capacitance lines CSL, the capacitance electrode 100, and the second data signal line S2Lj are also formed on a gate insulation layer 33.

<5.2.3 Equivalent Circuit>

Figure 29:
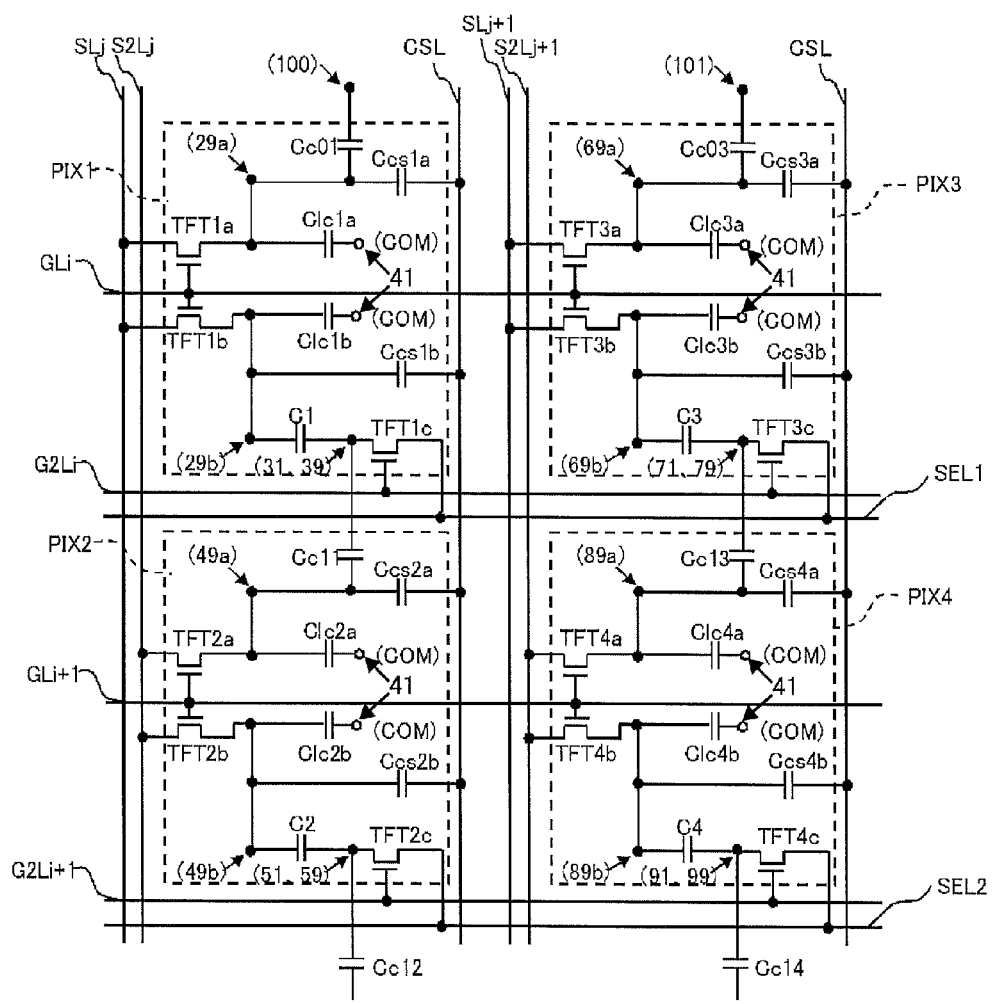
FIG. 29 is an equivalent circuit diagram of pixel formation portions in the fifth embodiment.

FIG. 29 is an equivalent circuit diagram of pixel formation portions in the present embodiment. A first data signal line and a second data signal line are connected to transistors in the pixel formation portions PIX1 to PIX4 such that data signals are supplied from the first data signal lines SLj, SLj+1 in the pixel formation portions PIX1, PIX3, respectively, and that data signals are supplied from the second data signal lines S2Lj, S2Lj+1 in the pixel formation portions PIX2, PIX4, respectively.

In the present embodiment, the pixel formation portion PIX1 includes as constituent elements of the first sub-pixel portion PIX1A, the first transistor TFT1$a$ having a gate electrode connected to the first scanning signal line GLi and having a source electrode connected to the first data signal line SLj, the pixel electrode 29$a$ connected to a drain electrode of the first transistor TFT1$a$, a liquid crystal capacitance Clc1$a$ formed by the common electrode 41 to which a constant potential COM is provided and the pixel electrode 29$a$, a holding capacitance Ccs1$a$ formed by the pixel electrode 29$a$ and the holding capacitance line CSL, and the capacitance Cc01 formed by the capacitance electrode 100 and the pixel electrode 29$a$. Further, the pixel formation portion PIX1 includes as constituent elements of a second sub-pixel portion PIX1B, the second transistor TFT1$b$ having a gate electrode connected to the first scanning signal line GLi and having a source electrode connected to the first data signal line SLj, the pixel electrode 29$b$ connected to a drain electrode of the second transistor TFT1$b$, a liquid crystal capacitance Clc1$b$ formed by the common electrode 41 and the pixel electrode 29$b$, a holding capacitance Ccs1$b$ formed by the pixel electrode 29$b$ and the holding capacitance line CSL, the third transistor TFT1$c$ having a gate electrode connected to the second scanning signal line G2Li and having a source electrode connected to the first capacitance line SEL1, the capacitance electrode 31 connected to a drain electrode of the third transistor TFT1$c$, and the potential varying capacitance C1 formed by the pixel electrode 29$b$ and the capacitance electrode 31. The pixel formation portion PIX2 has a configuration similar to that of the pixel formation portion PIX1, except that a connection destination of source electrodes of the first transistor TFT2$a$ and the second transistor TFT2$b$ is the second data signal line S2Lj.

<5.3 Driving Method>

Figure 30:
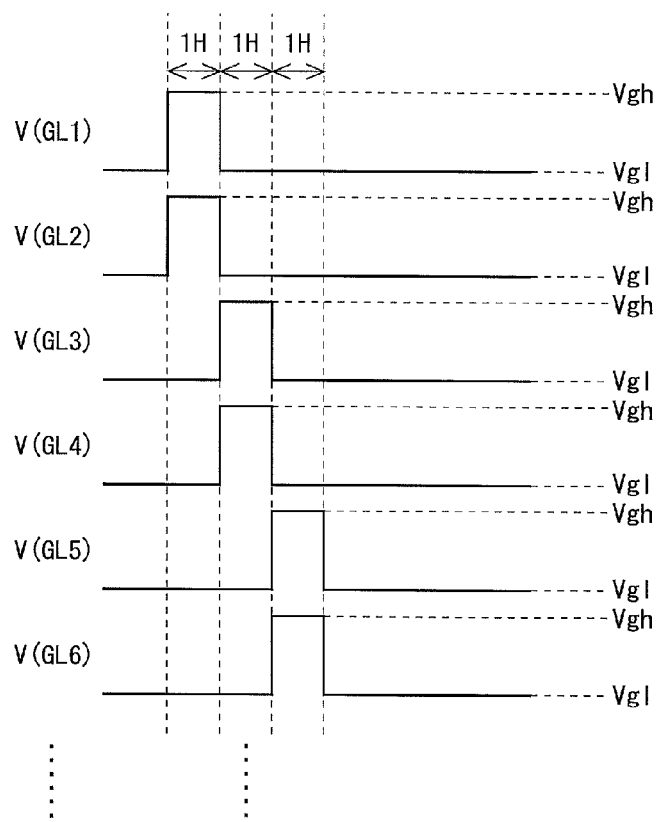
FIG. 30 is a signal waveform diagram for describing a driving method in the fifth embodiment.

Next, a driving method in the present embodiment will be described with reference to FIG. 30, FIG. 31, and FIG. 32. FIG. 30 shows waveforms of potentials of first scanning signal lines. As shown in FIG. 30, in the present embodiment, gate-on potentials Vgh are sequentially provided for each two rows to the first scanning signal lines. A timing at which the gate-on potential Vgh is provided to certain two first scanning signal lines and a timing at which the gate-on potential Vgh is provided to the next two first scanning signal lines are shifted by one horizontal scanning period.

Figure 31:
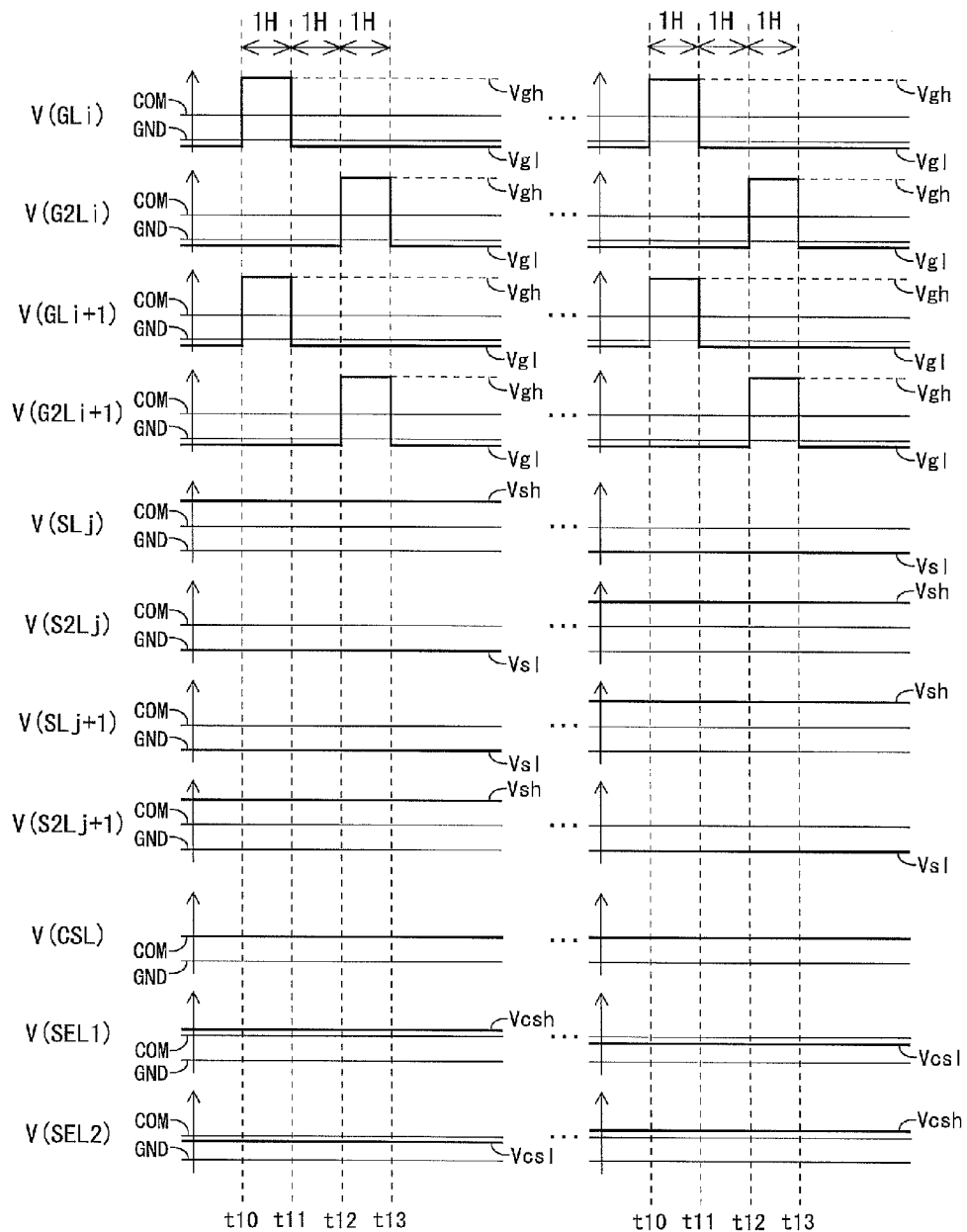
FIG. 31 is a signal waveform diagram for describing the driving method in the fifth embodiment.
Figure 32:
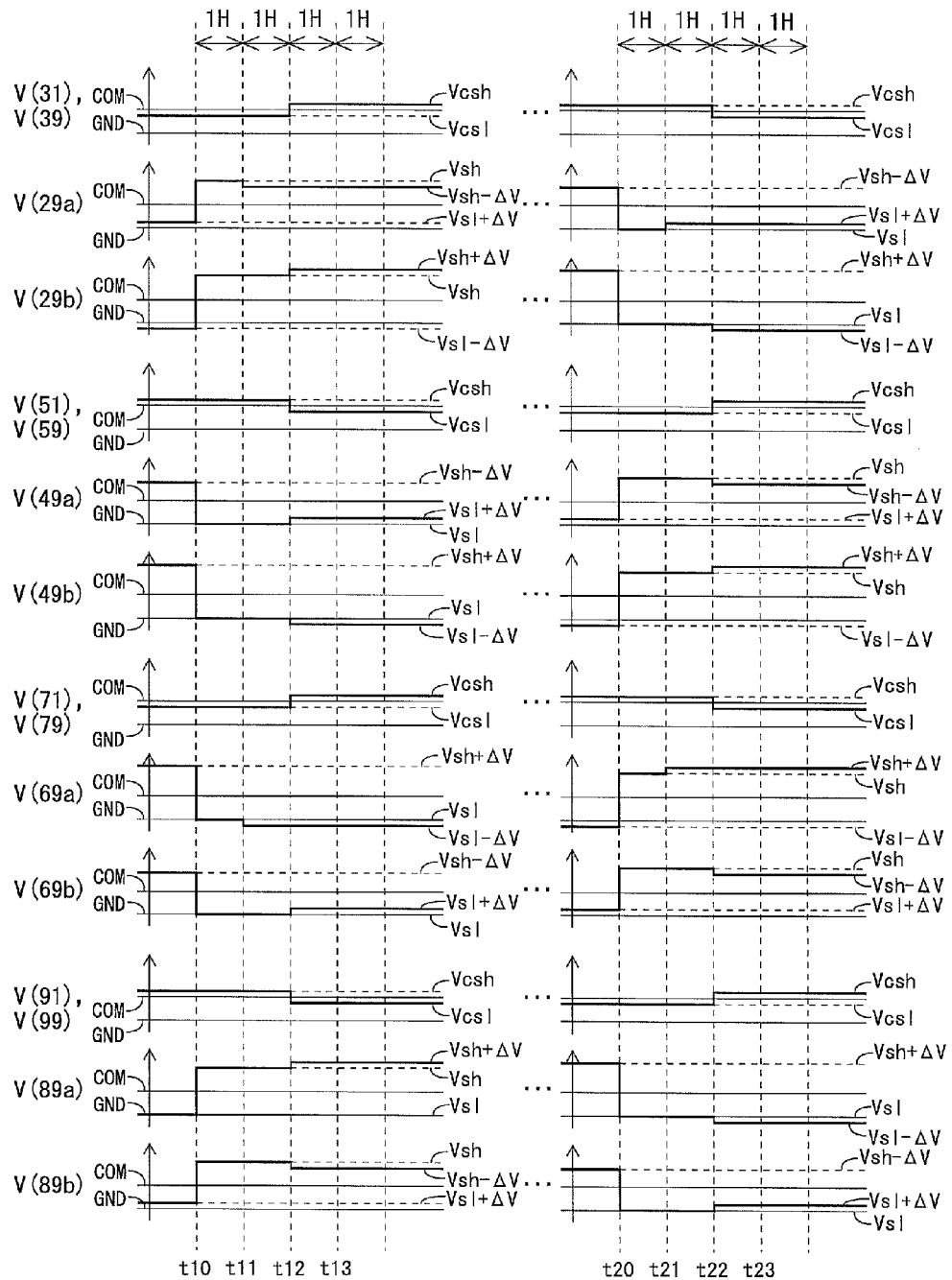
FIG. 32 is a signal waveform diagram for describing the driving method in the fifth embodiment.

As shown in FIG. 31, the gate-on potential Vgh is provided to the first scanning signal lines GLi, GLi+1 during one horizontal scanning period, and thereafter, the gate-on potential Vgh is provided to the second scanning signal lines G2Li, G2Li+1 during one horizontal scanning period. A timing at which the gate-on potential Vgh is provided to the first scanning signal lines GLi, GLi+1 and a timing at which the gate-on potential Vgh is provided to the second scanning signal lines G2Li, G2Li+1 are shifted by two horizontal scanning periods. In this way, concerning each row, a timing at which the gate-on potential Vgh is provided to the second scanning signal line is delayed by two horizontal scanning periods from a timing at which the gate-on potential Vgh is provided to the first scanning signal line.

As shown in FIG. 31, to the first data signal line SLj and the second data signal line S2Lj+1, a potential Vsh that is higher than the potential COM of a common electrode 41 is provided in odd frames, and a potential Vsl that is lower than the potential COM is provided in even frames. To the second data signal line S2Lj and the first data signal line SLj+1, a potential Vsl is provided in odd frames, and the potential Vsh is provided in even frames. In this way, potentials of adjacent two first data signal lines have mutually opposite polarities. Similarly, potentials of adjacent two second data signal lines have also mutually opposite polarities. Concerning each column, a potential of the first data signal line and a potential of the second data signal line have mutually opposite polarities.

Under the above assumptions, how potentials of a capacitance electrode and a pixel electrode in a pixel formation portion change will be described (see FIG. 31 and FIG. 32).

In odd frames, at a time point t10, potentials of the first scanning signal lines GLi, GLi+1 become the gate-on potential Vgh. Accordingly, the first transistors TFT1$a$ to TFT4$a$ and the second transistors TFT1$b$ to TFT4$b$ become in an on state. In the odd frames, potentials of the first data signal line SLj and the second data signal line S2Lj+1 are the potential Vsh of a positive polarity, and potentials of the second data signal line S2Lj and the first data signal line SLj+1 are the potential Vsl of a negative polarity. Therefore, at the time point t10, potentials of the pixel electrodes 29$a$, 29$b$ in the pixel formation portion PIX1 and potentials of the pixel electrodes 89$a$, 89$b$ in the pixel formation portion PIX4 increase to Vsh, and potentials of the pixel electrodes 49$a$, 49$b$ in the pixel formation portion PIX2 and potentials of the pixel electrodes 69$a$, 69$b$ in the pixel formation portion PIX3 decrease to Vsl.

At a time point t11, in a row before a row including pixel formation portions PIX1, PIX3, a potential of the second scanning signal line becomes the gate-on potential Vgh. In odd frames, the second capacitance line SEL2 is at the potential Vcsl of a relatively low level. Thus, in the row before the row including the pixel formation portions PIX1, PIX3, potentials of capacitance electrodes 100, 101 decrease. Here, as shown in FIG. 29, the capacitance electrode 100 and the pixel electrode 29$a$ are capacitance-coupled. Therefore, the potential of the pixel electrode 29$a$ decreases from Vsh to Vsh−ΔV. Similarly, as shown in FIG. 29, the capacitance electrode 101 and the pixel electrode 69$a$ are capacitance-coupled. Therefore, the potential of the pixel electrode 69$a$ decreases from Vsl to Vsl−ΔV. A magnitude ΔV of a potential change of the pixel electrodes 29$a$, 69$a$ is as shown in the above Equation (1). However, K in the Equation (1) as the equation for obtaining the magnitude of ΔV is obtained by the following Equation (3).

$$K = Cc01/(Clc1a + Ccs1a + Cc01) \tag{3}$$

At a time point t12, potentials of the second scanning signal lines G2Li, G2Li+1 become the gate-on potential Vgh. Therefore, the third transistors TFT1$c$ to TFT4$c$ become in an on state. In odd frames, the first capacitance line SEL1 is at the potential Vcsh of a relatively high level, and the second capacitance line SEL2 is at the potential Vcsl of a relatively low level. Accordingly, at a time point t12, potentials of the capacitance electrode 31 in the pixel formation portion PIX1 and the capacitance electrode 71 in the pixel formation portion PIX3 increase to Vcsh, and potentials of a capacitance electrode 51 in the pixel formation portion PIX2 and a capacitance electrode 91 in the pixel formation portion PIX4 decrease to Vcsl. Thus, at the time point t12, the potential of the pixel electrode 29$b$ increases from Vsh to Vsh+ΔV, the potential of the pixel electrode 69$b$ increases from Vsl to Vsl+ΔV, the potential of the pixel electrode 49$b$ decreases from Vsl to Vsl−ΔV, and the potential of the pixel electrode 89$b$ decreases from Vsh to Vsh−ΔV.

The capacitance electrode 31 in the pixel formation portion PIX1 is connected to the capacitance electrode 39 in the pixel formation portion PIX2, and the capacitance electrode 71 in the pixel formation portion PIX3 is connected to the capacitance electrode 79 in the pixel formation portion PIX4. In the pixel formation portion PIX2, a capacitance Cc11 is formed by the capacitance electrode 39 and the pixel electrode 49a. In the pixel formation portion PIX4, a capacitance Cc13 is formed by the capacitance electrode 79 and the pixel electrode 89a. Thus, at the time point t12, the potential of the pixel electrode 49a increases from Vsl to Vsl+ΔV, and the potential of the pixel electrode 89a increases from Vsh to Vsh+ΔV.

At and after the time point t12, the potentials of the pixel electrodes 29a, 29b, 49a, 49b, 69a, 69b, 89a, and 89b in the pixel formation portions PIX1 to PIX4 are maintained during a period (a period up to a time point t20) until when the potentials of the first scanning signal lines GLi, GLi+1 become the gate-on potential Vgh in even frames.

In the even frames, an operation similar to that in the odd frames is also performed (however, a direction in which a potential of a pixel electrode and a potential of a capacitance electrode change becomes opposite to that in the odd frames). Thus, in each pixel formation portion, different potentials are provided to pixel electrodes in the first sub-pixel portion and pixel electrodes in the second sub-pixel portion.

A description is now given of a reason why the timing at which the gate-on potential Vgh is provided to the second scanning signal line is delayed by two horizontal scanning periods from the timing at which the gate-on potential Vgh is provided to the first scanning signal line. Assume that the timing at which the gate-on potential Vgh is provided to the second scanning signal line is delayed by one horizontal scanning period from the timing at which the gate-on potential Vgh is provided to the first scanning signal line, like in the first to fourth embodiments. In this case, the timing at which a potential of the second scanning signal line becomes the gate-on potential Vgh in a row before a row including the pixel formation portion PIX1 becomes the same as the timing at which a potential of the first scanning signal line GLi provided to the pixel formation portion PIX1 becomes the gate-on potential Vgh, for example. Then, a potential of the capacitance electrode 100 varies during a period when a potential of the pixel electrode 29a should be set to the potential Vsh of the data signal SLj. Because the capacitance electrode 100 and the pixel electrode 29a are capacitance-coupled, the potential of the pixel electrode 29a becomes unstable. Further, after the pixel electrode 29a is charged based on the data signal SLj, the potential of the pixel electrode 29a does not vary unlike the variation at the time point t11 in FIG. 32.

Figure 33:
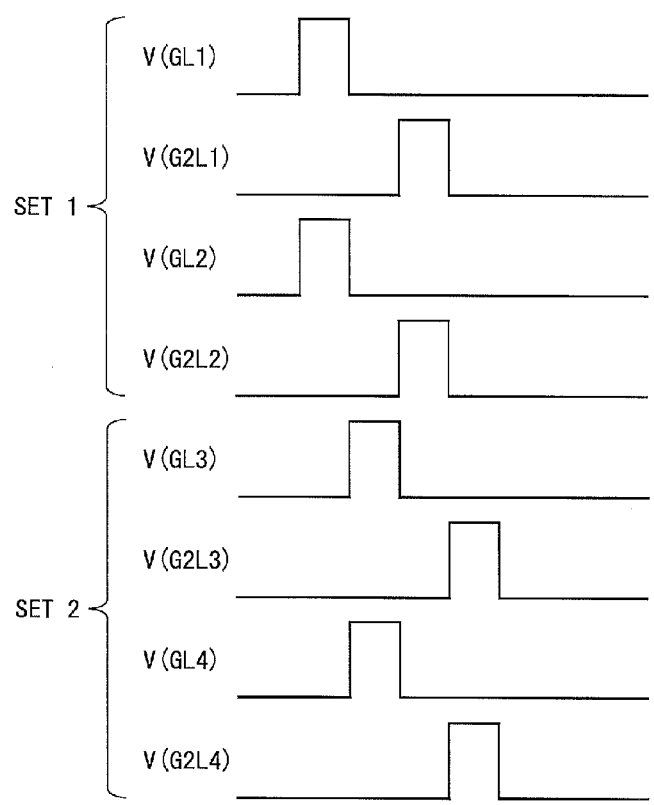
FIG. 33 is a signal waveform diagram for describing the driving method in the fifth embodiment.

Accordingly, when assuming that a first row and a second row of a pixel matrix are a "set 1", and a third row and a fourth row are a "set 2", first scanning signal lines and second scanning signal lines are driven as shown in FIG. 33. That is, two first scanning signal lines as one set are sequentially selected. Further, two second scanning signal lines of each set are selected after one horizontal scanning period since two first scanning signal lines of a set next to the each set are selected. Note that, this interval is not necessarily required to be one horizontal scanning period, and a timing at which the second scanning signal lines of each set are selected may be a suitable timing after a pixel electrode is sufficiently charged by selection of first scanning signal lines of a set next to the each set.

<5.4 Effect>

According to the present embodiment, in each pixel formation portion, after the same potential is provided to both pixel electrodes of the first sub-pixel portion and pixel electrodes of the second sub-pixel portion, the potential of one sub-pixel portion slightly increases and the potential of the other sub-pixel portion slightly decreases. Therefore, a large effect of viewing angle characteristic improvement can be obtained, as compared with the first to fourth embodiments in which a potential of only one sub-pixel portion is varied. Further, in the present embodiment, focusing attention on each column of the pixel matrix, pixel formation portions are alternately connected for each one row to a first data signal line and a second data signal line. That is, as compared with the first embodiment, the number of pixel formation portions to which one data signal line should supply a data signal becomes a half. Therefore, a display device can be operated at a high speed without reducing a display quality. For example, a configuration according to the present embodiment can be applied to a display device that has a drive frequency of 240 Hz. Further, a narrow picture-frame by reduction of a wiring region can be realized without reducing a display quality, in a similar manner to that in the first embodiment.

6. Sixth Embodiment

<6.1 Entire Configuration>

Because a schematic configuration of a liquid crystal display device is similar to that of the first embodiment, a description thereof will be omitted (see FIG. 2). A plan view of an active matrix substrate 1 according to the present embodiment is similar to that in the fourth embodiment as shown in FIG. 19. However, when attention is focused on each column of a pixel matrix, pixel formation portions are alternately connected for each row to data signal lines arranged along one side (a left side in FIG. 19) of the each column and data signal lines arranged along the other side (a right side in FIG. 19) of the each column.

<6.2 Structure of Pixel Formation Portion>

<6.2.1 Planar Structure>

Figure 34:
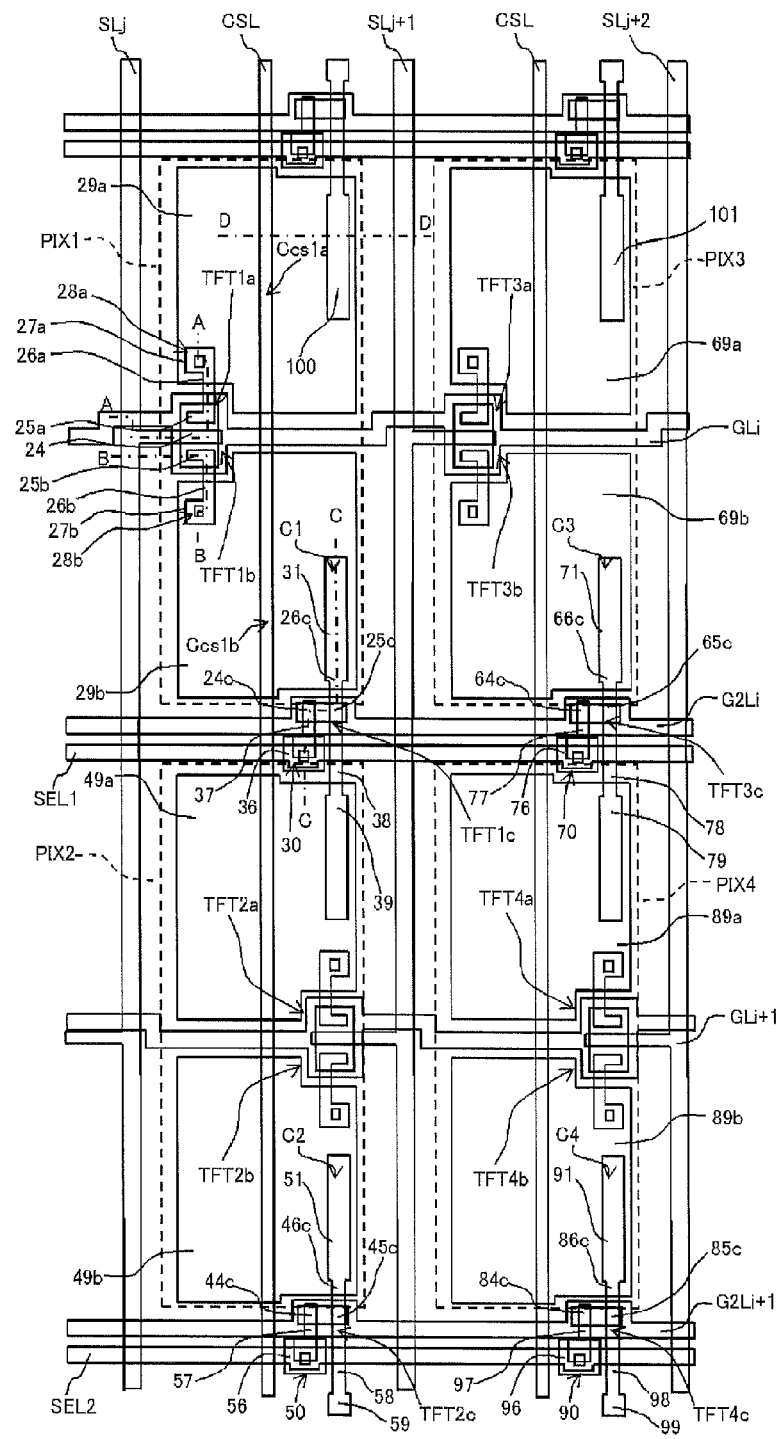
FIG. 34 is a plan view of a region in which pixel formation portions PIX1 to PIX4 are formed in a sixth embodiment of the present invention.

FIG. 34 is a plan view of a region in which pixel formation portions PIX1 to PIX4 are formed. A positional relationship between the pixel formation portions PIX1 to PIX4 and first scanning signal lines GLi, GLi+1, second scanning signal lines G2Li, G2Li+1, holding capacitance lines CSL, a first capacitance line SEL1, and a second capacitance line SEL2 is similar to that in the fourth embodiment (see FIG. 20). A connection relationship between the pixel formation portions PIX1 to PIX4 and data signal lines is different from that in the fourth embodiment. For example, attention is focused on a connection relationship between the pixel formation portions PIX1 to PIX4 and a data signal line SLj+1. In the fourth embodiment, as shown in FIG. 20, the data signal line SLj+1 is connected to transistors TFT3a, TFT3b in the pixel formation portion PIX3 and transistors TFT4a, TFT4b in the pixel formation portion PIX4. On the other hand, in the present embodiment, as shown in FIG. 34, the data signal line SLj+1 is connected to transistors TFT3a, TFT3b in the pixel formation portion PIX3 and transistors TFT2a, TFT2b in the pixel formation portion PIX2. In this way, in the present embodiment, pixel formation portions connected to each data signal line are laid out in a zigzag manner.

Figure 35:
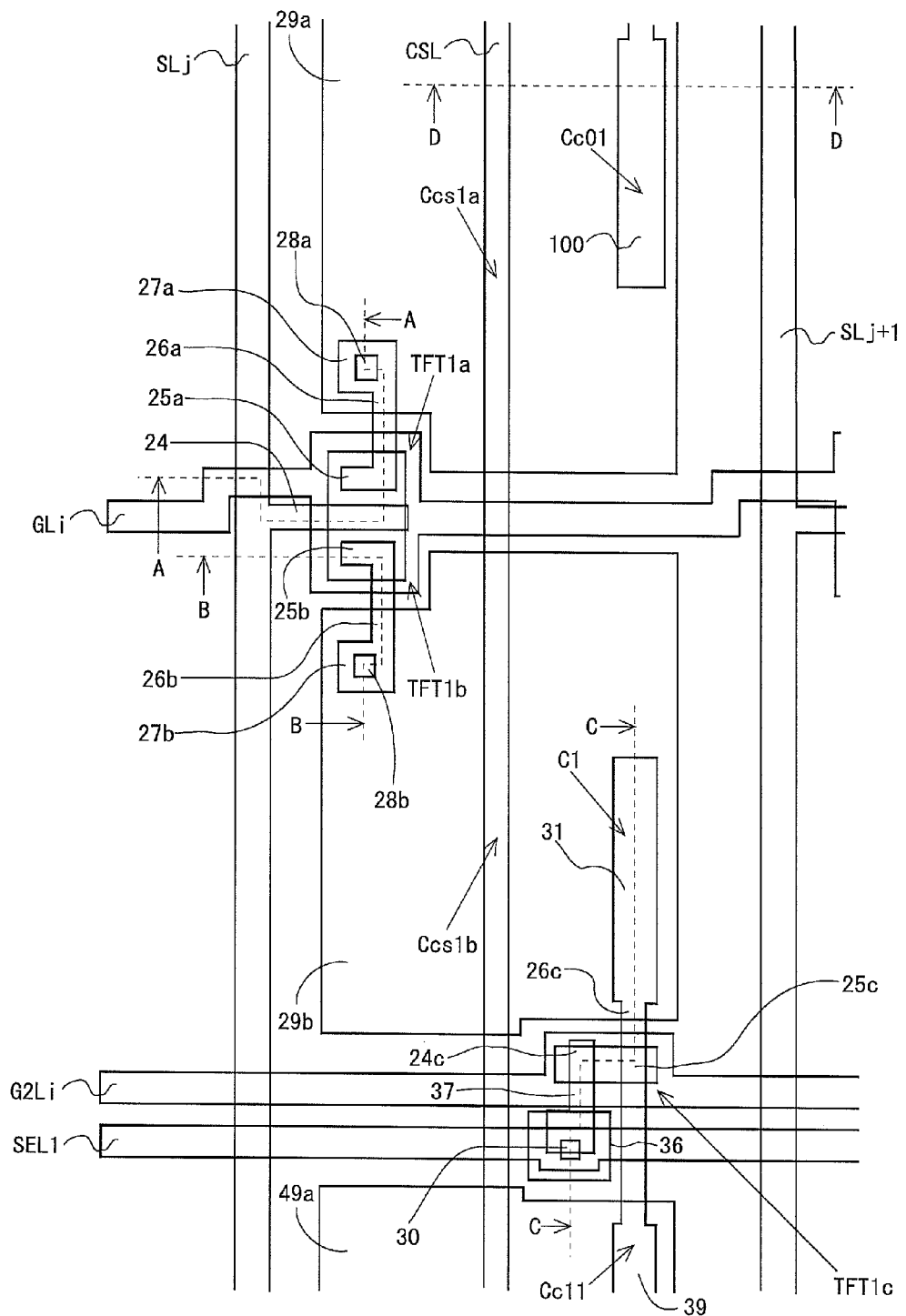
FIG. 35 is an enlarged plan view of a part of a region in which the pixel formation portion PIX1 is formed in the sixth embodiment.

FIG. 35 is an enlarged plan view of a part of a region in which the pixel formation portion PIX1 is formed. In the present embodiment, a source electrode 24c of a third transistor TFT1c is connected to a source lead line 37, and the source lead line 37 is connected to a first capacitance line SEL1 via a connection electrode 36 and a contact 30. In a first sub-pixel portion PIX1A, a capacitance electrode 100 is formed in a region between the capacitance line CSL and the data signal line SLj+1. The capacitance electrode 100 and a pixel electrode 29a are laid out to be superimposed in a vertical direction on an active matrix substrate 1. Accordingly, a capacitance Cc01 is formed.

<6.2.2 Cross-Sectional Structure>

Figure 36:
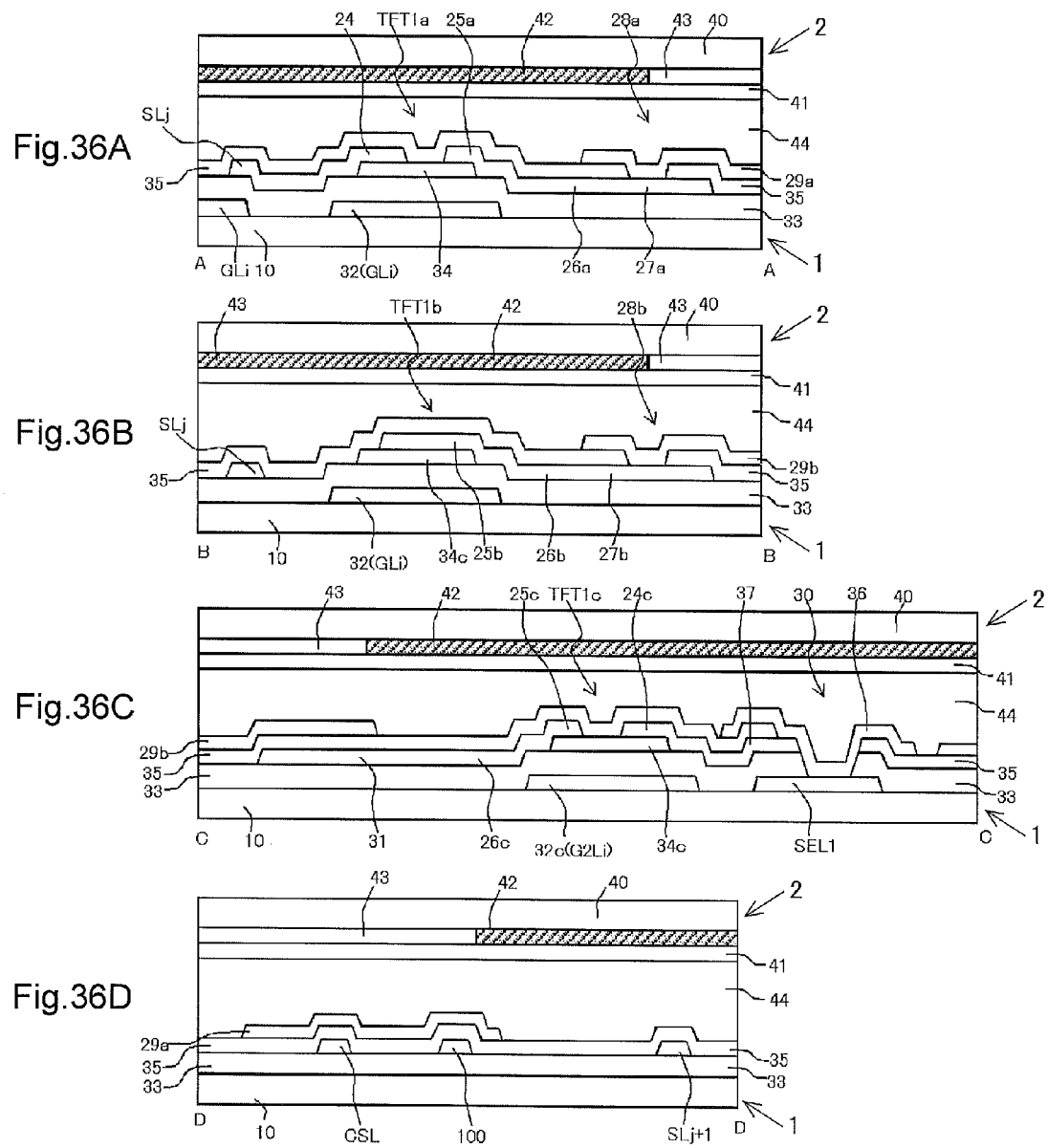
FIG. 36A is a cross-sectional view along line A-A in FIG. 35.
FIG. 36B is a cross-sectional view along line B-B in FIG. 35.
FIG. 36C is a cross-sectional view along line C-C in FIG. 35.
FIG. 36D is a cross-sectional view along line D-D in FIG. 35.

FIG. 36A is a cross-sectional view along line A-A in FIG. 35. FIG. 36B is a cross-sectional view along line B-B in FIG. 35. FIG. 36C is a cross-sectional view along line C-C in FIG. 35. FIG. 36D is a cross-sectional view along line D-D in FIG. 35. In the present embodiment, as shown in FIG. 36D, the holding capacitance line CSL and the capacitance electrode 100 are also formed on a gate insulation layer 33.

<6.2.3 Equivalent Circuit>

Figure 37:
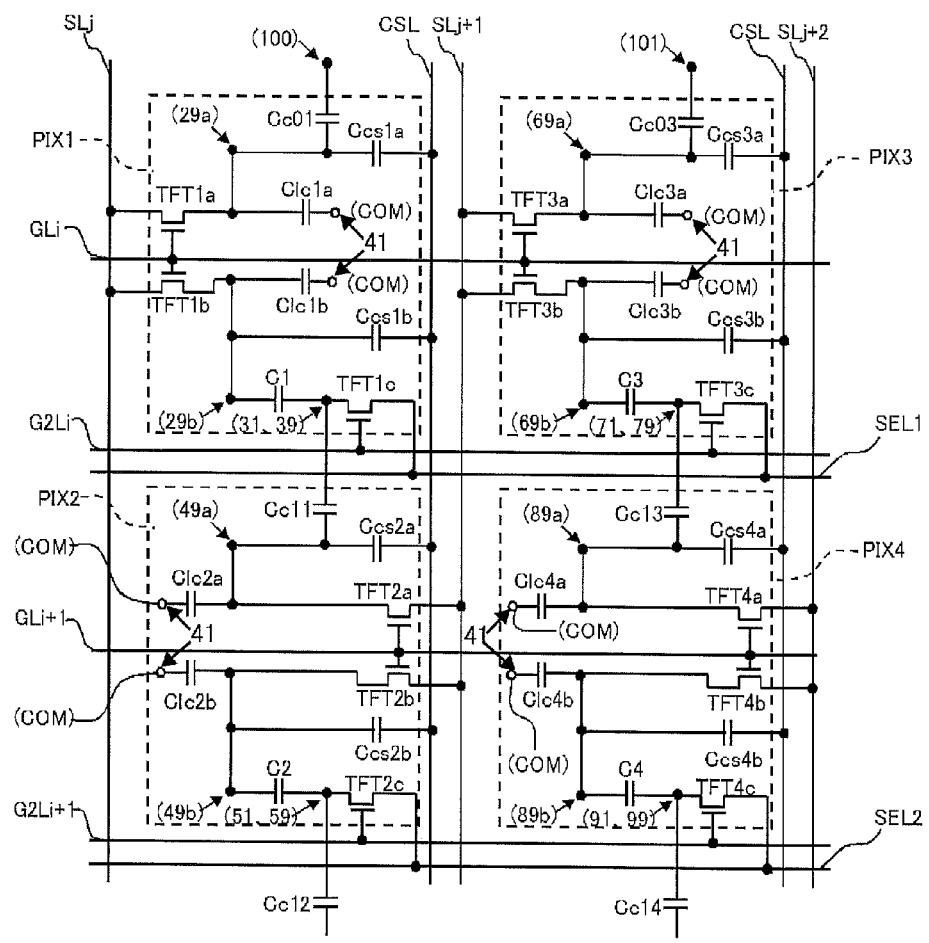
FIG. 37 is an equivalent circuit diagram of pixel formation portions in the sixth embodiment.

FIG. 37 is an equivalent circuit diagram of pixel formation portions in the present embodiment. As shown in FIG. 37, a first transistor TFT1$a$ and a second transistor TFT1$b$ in the pixel formation portion PIX1 are connected to the data signal line SLj, a first transistor TFT2$a$ and a second transistor TFT2$b$ in the pixel formation portion PIX2 are connected to the data signal line SLj+1, a first transistor TFT3$a$ and a second transistor TFT3$b$ in the pixel formation portion PIX3 are connected to the data signal line SLj+1, and a first transistor TFT4$a$ and a second transistor TFT4$b$ in the pixel formation portion PIX4 are connected to the data signal line SLj+2. Configurations of the first sub-pixel portion and the second sub-pixel portion in each pixel formation portion are similar to those in the fifth embodiment (see FIG. 29), except a connection relationship between transistors and data signal lines (see FIG. 29).

<6.3 Driving Method>

Figure 38:
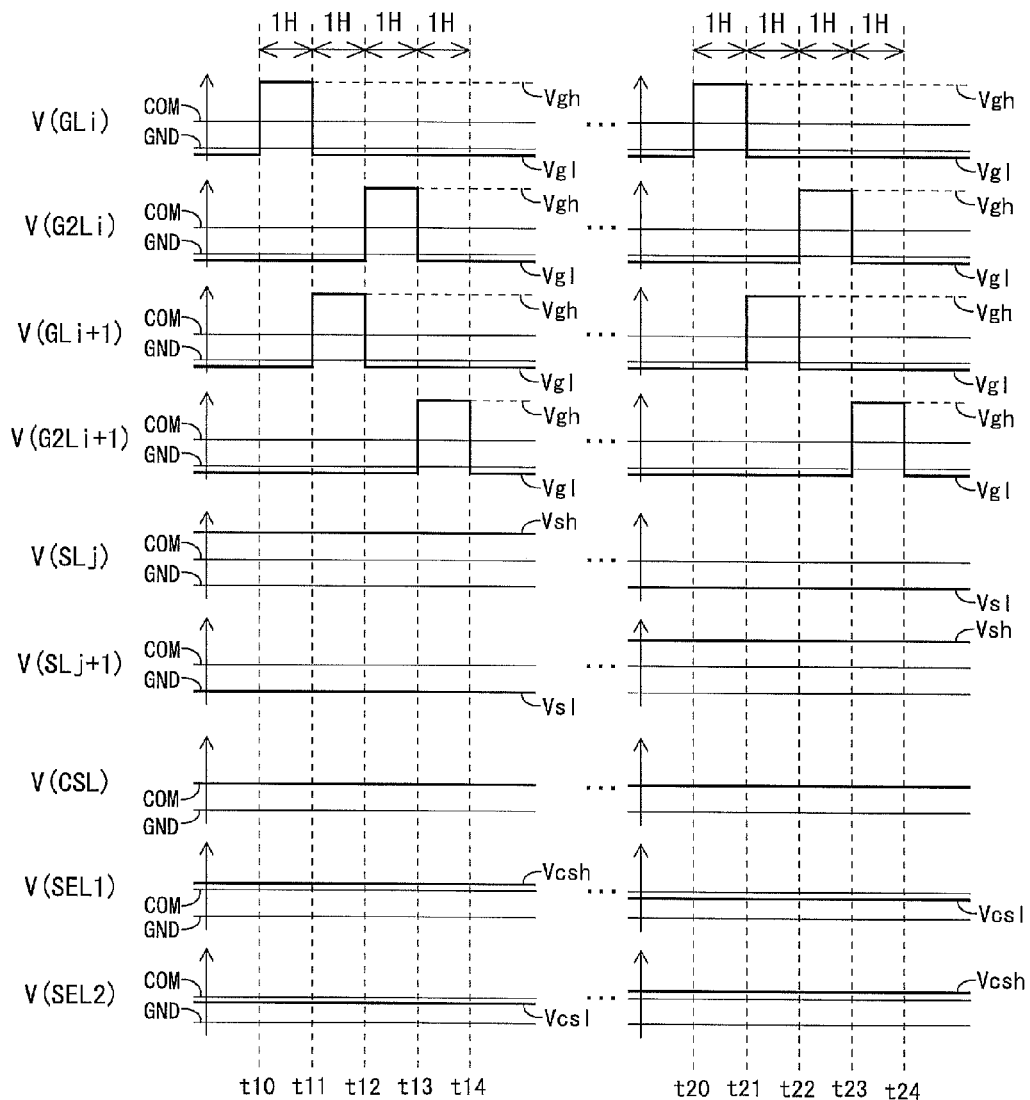
FIG. 38 is a signal waveform diagram for describing a driving method in the sixth embodiment.
Figure 39:
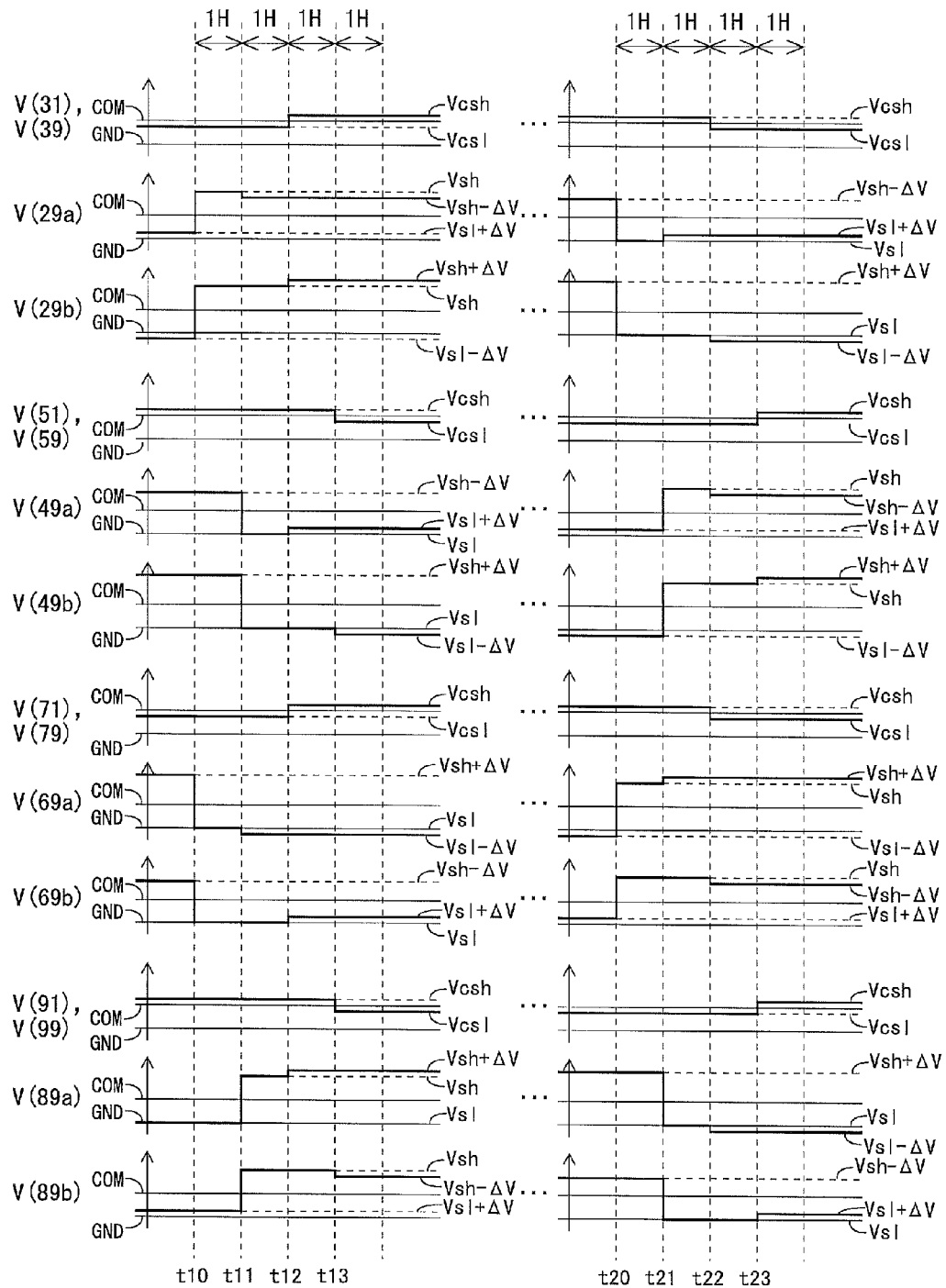
FIG. 39 is a signal waveform diagram for describing the driving method in the sixth embodiment.

Next, a driving method in the present embodiment will be described with reference to FIG. 38 and FIG. 39. The first scanning signal lines GLi, GLi+1, the data signal lines SLj, SLj+1, the holding capacitance lines CSL, the first capacitance line SEL1, and the second capacitance line SEL2 are driven in a similar manner to that in the first embodiment. A gate-on potential Vgh is sequentially provided for each one row to second scanning signal lines GL1 to GLm, in a similar manner to that in the first embodiment. However, in the present embodiment, unlike in the first embodiment, concerning each row, a timing at which the gate-on electrode Vgh is provided to the second scanning signal line is delayed by two horizontal scanning periods from a timing at which the gate-on potential Vgh is provided to the first scanning signal line. Note that, a reason why the timing at which the gate-on potential Vgh is provided to the second scanning signal line is delayed by two horizontal scanning periods from the timing at which the gate-on potential Vgh is provided to the first scanning signal line is the same as that in the fifth embodiment.

Under the above assumptions, how potentials of the capacitance electrode and the pixel electrode in the pixel formation portion change will be described (see FIG. 38 and FIG. 39).

In odd frames, at a time point t10, a potential of the first scanning signal line GLi becomes the gate-on potential Vgh. Accordingly, the first transistors TFT1$a$, TFT3$a$ and the second transistors TFT1$b$, TFT3$b$ become in an on state. In the odd frames, a potential of the data signal line SLj is a potential Vsh of a positive polarity, and a potential of the data signal line SLj+1 is a potential Vsl of a negative polarity. Therefore, at the time point t10, potentials of pixel electrodes 29$a$, 29$b$ in the pixel formation portion PIX1 increase to Vsh, and potentials of pixel electrodes 69$a$, 69$b$ in the pixel formation portion PIX3 decrease to Vsl.

At a time point t11, a potential of the first scanning signal line GLi+1 becomes the gate-on potential Vgh. Accordingly, the first transistors TFT2$a$, TFT4$a$ and the second transistors TFT2$b$, TFT4$b$ become in an on state. Because it is assumed that a stationary image of one color is displayed on an entire screen, the data signal line SLj+2 has the same potential as that of the data signal line SLj. That is, in odd frames, the potential of the data signal line SLj+2 is the potential Vsh of a positive polarity. Thus, at the time point t11, potentials of pixel electrodes 49$a$, 49$b$ in the pixel formation portion PIX2 decrease to Vsl, and potentials of pixel electrodes 89$a$, 89$b$ in the pixel formation portion PIX4 increase to Vsh.

At the time point t11, in a row before a row including pixel formation portions PIX1, PIX3, a potential of the second scanning signal line becomes the gate-on potential Vgh. In odd frames, the second capacitance line SEL2 is at the potential Vcsl of a relatively low level. Thus, in the row before the row including the pixel formation portions PIX1, PIX3, potentials of capacitance electrodes 100, 101 decrease. Here, as shown in FIG. 37, the capacitance electrode 100 and the pixel electrode 29$a$ are capacitance-coupled. Therefore, the potential of the pixel electrode 29$a$ decreases from Vsh to Vsh−ΔV. Similarly, as shown in FIG. 37, the capacitance electrode 101 and the pixel electrode 69$a$ are capacitance-coupled. Therefore, the potential of the pixel electrode 69$a$ decreases from Vsl to Vsl−ΔV.

At a time point t12, a potential of the second scanning signal line G2Li becomes the gate-on potential Vgh. Accordingly, the transistors TFT1$c$, TFT3$c$ become in an on state. Further, in the odd frames, the first capacitance line SEL1 is at the potential Vcsh of a relatively high level. Consequently, at the time point t12, the potential of a capacitance electrode 31 in the pixel formation portion PIX1 and the potential of a capacitance electrode 71 in the pixel formation portion PIX3 increase to Vcsh. Thus, at the time point t12, the potential of the pixel electrode 29$b$ increases from Vsh to Vsh+ΔV, and the potential of the pixel electrode 69$b$ increases from Vsl to Vsl+ΔV.

The capacitance electrode 31 in the pixel formation portion PIX1 is connected to a capacitance electrode 39 in the pixel formation portion PIX2, and the capacitance electrode 71 in the pixel formation portion PIX3 is connected to a capacitance electrode 79 in the pixel formation portion PIX4. A capacitance Cc11 is formed by the capacitance electrode 39 and the pixel electrode 49$a$ in the pixel formation portion PIX2, and a capacitance Cc13 is formed by the capacitance electrode 79 and a pixel electrode 89$a$ in the pixel formation portion PIX4. Thus, at the time point t12, the potential of the pixel electrode 49$a$ increases from Vsl to Vsl+ΔV, and the potential of the pixel electrode 89$a$ increases from Vsh to Vsh+ΔV.

At a time point t13, a potential of the second scanning signal line G2Li+1 becomes the gate-on potential Vgh. Accordingly, third transistors TFT2$c$, TFT4$c$ become in an on state. Further, in the odd frames, the second capacitance line SEL2 is at the potential Vcsl of a relatively low level. Consequently, at the time point t13, the potential of a capacitance electrode 51 in the pixel formation portion PIX2 and the potential of a capacitance electrode 91 in the pixel formation portion PIX4 decrease to Vcsl. Thus, at the time point t13, the potential of the pixel electrode 49$b$ increases from Vsl to Vsl−ΔV, and the potential of the pixel electrode 89$b$ decreases from Vsh to Vsh−ΔV.

The potentials of the pixel electrodes 29$a$, 29$b$, 69$a$, and 69$b$ are maintained during a period until when the potential of the first scanning signal line GLi becomes the gate-on potential Vgh in the even frames (during a period up to a time point t20). The potentials of the pixel electrodes 49$a$, 49$b$, 89$a$, and 89$b$ are maintained during a period until when the potential of the first scanning signal line GLi+1 becomes the gate-on potential Vgh in the even frames (during a period up to a time point t21).

In the even frames, an operation similar to that in the odd frames is performed (however, directions in which the potentials of the pixel electrodes and the potentials of the capacitance electrodes change become opposite to those in the odd frames). In the manner as described above, in each pixel formation portion, different potentials are provided to pixel electrodes in the first sub-pixel portion and pixel electrodes in the second sub-pixel portion.

<6.4 Effect>

According to the present embodiment, in a similar manner to that in the fifth embodiment, in each pixel formation portion, after the same potential is provided to both pixel electrodes of the first sub-pixel portion and pixel electrodes of the second sub-pixel portion, the potential of one sub-pixel portion slightly increases and the potential of the other sub-pixel portion slightly decreases. Therefore, a large effect of viewing angle characteristic improvement can be obtained. Further, a narrow picture-frame by reduction of a wiring region can be realized without reducing a display quality, in a similar manner to that in the first embodiment.

7. Seventh Embodiment

<7.1 Entire Configuration>

Figure 40:
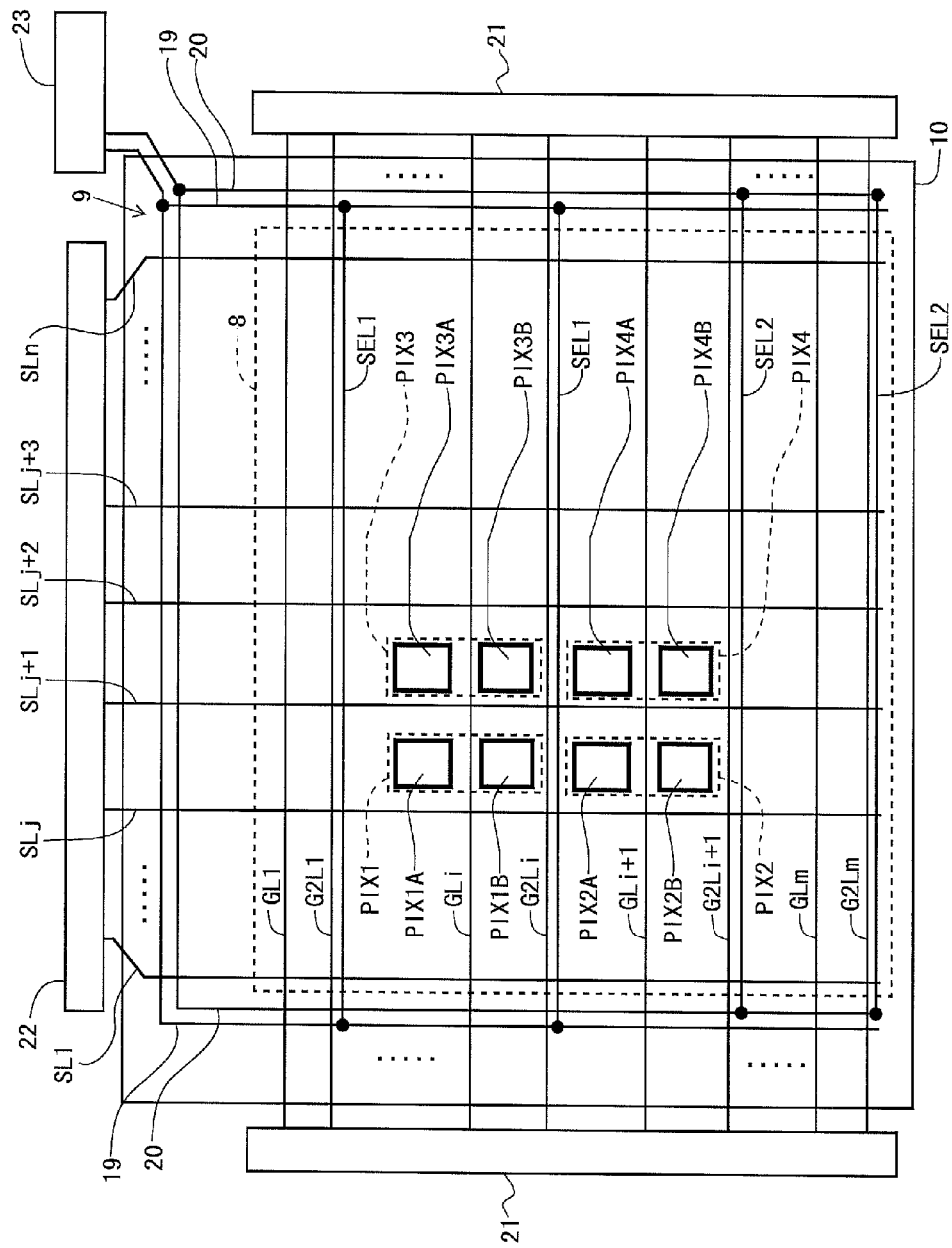
FIG. 40 is a plan view of an active matrix substrate in a seventh embodiment of the present invention.

Because a schematic configuration of a liquid crystal display device is similar to that of the first embodiment, a description thereof will be omitted (see FIG. 2). FIG. 40 is a plan view of an active matrix substrate 1 in a seventh embodiment of the present invention. The configuration in the present embodiment is similar to that in the sixth embodiment, except that the holding capacitance lines CSL and the holding-capacitance line trunk 18 are not provided. Therefore, in the following, points different from those of the sixth embodiment will be mainly described, and descriptions of points similar to those of the sixth embodiment will be omitted.

<7.2 Structure of Pixel Formation Portion>
<7.2.1 Planar Structure>

Figure 41:
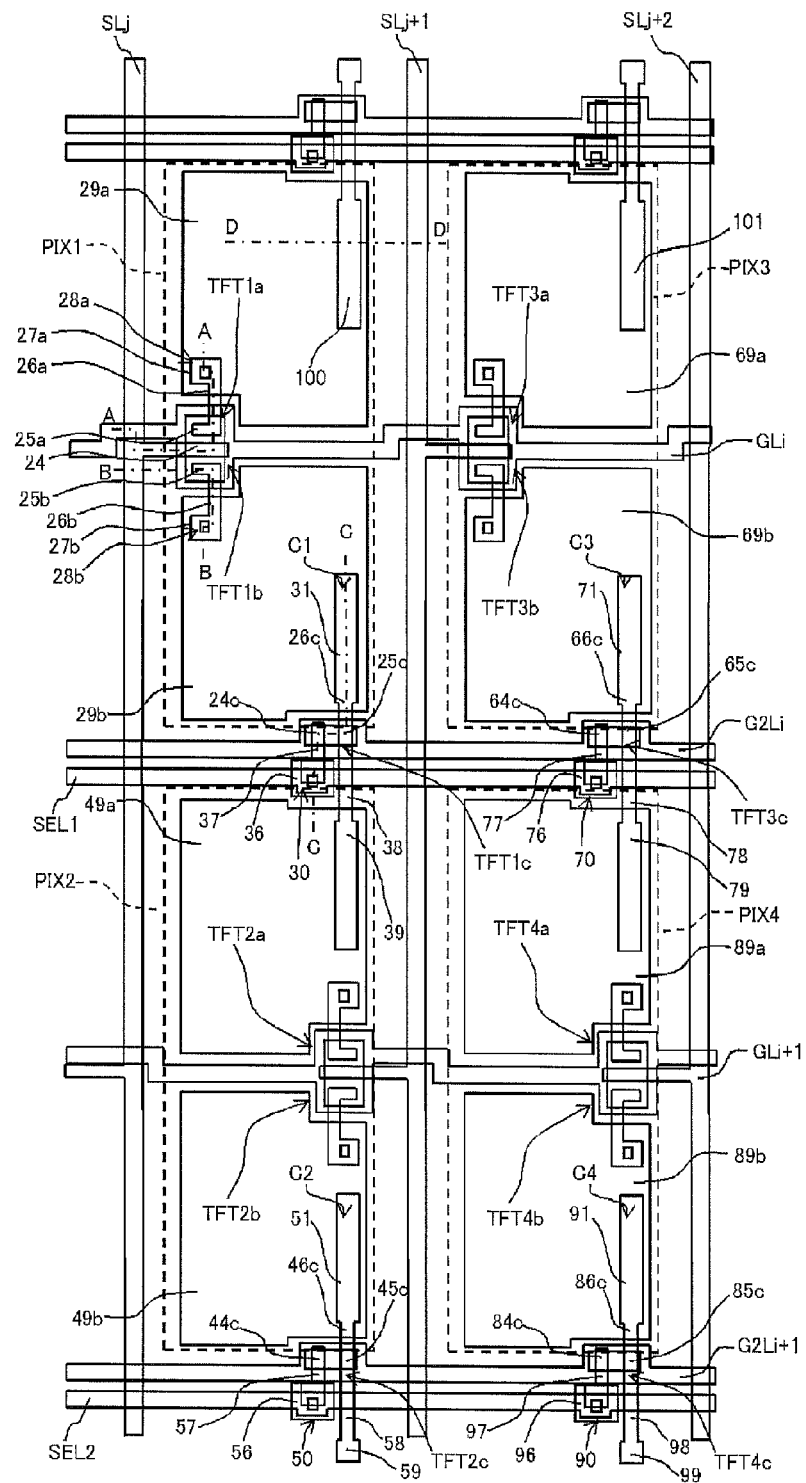
FIG. 41 is a plan view of a region in which pixel formation portions PIX1 to PIX4 are formed in the seventh embodiment.
Figure 42:
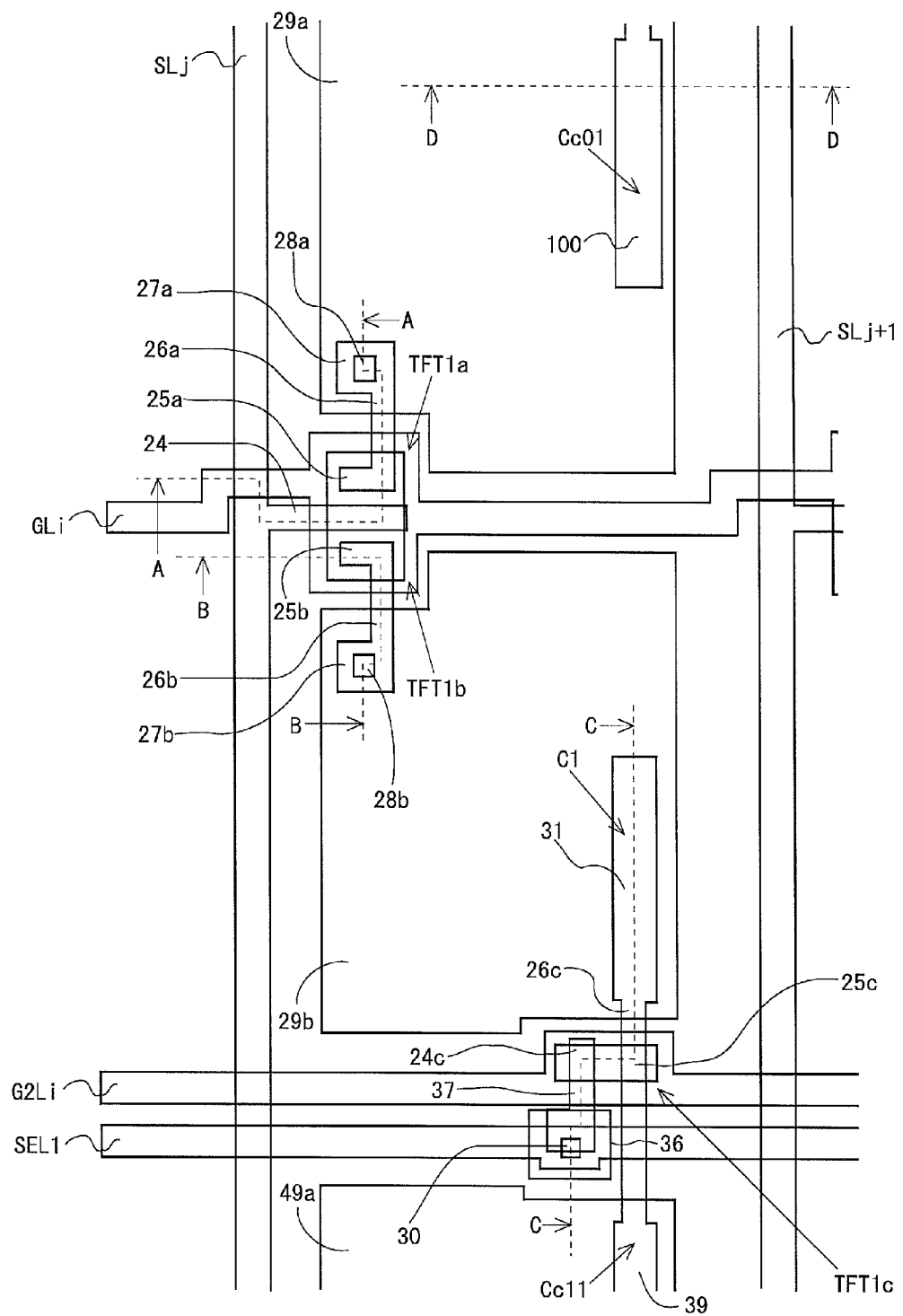
FIG. 42 is an enlarged plan view of a part of a region in which the pixel formation portion PIX1 is formed in the seventh embodiment.

FIG. 41 is a plan view of a region in which pixel formation portions PIX1 to PIX4 are formed. FIG. 42 is an enlarged plan view of a part of a region in which the pixel formation portion PIX1 is formed. As described above, the holding capacitance lines CSL are not provided in the present embodiment. Therefore, the holding capacitances Ccs1a, Ccs1b that are formed by the holding capacitance lines CSL and the pixel electrodes 29a, 29b are not included in the pixel formation portion PIX1, for example, unlike in the sixth embodiment (see FIG. 34).

<7.2.2 Cross-Sectional Structure>

Figure 43:
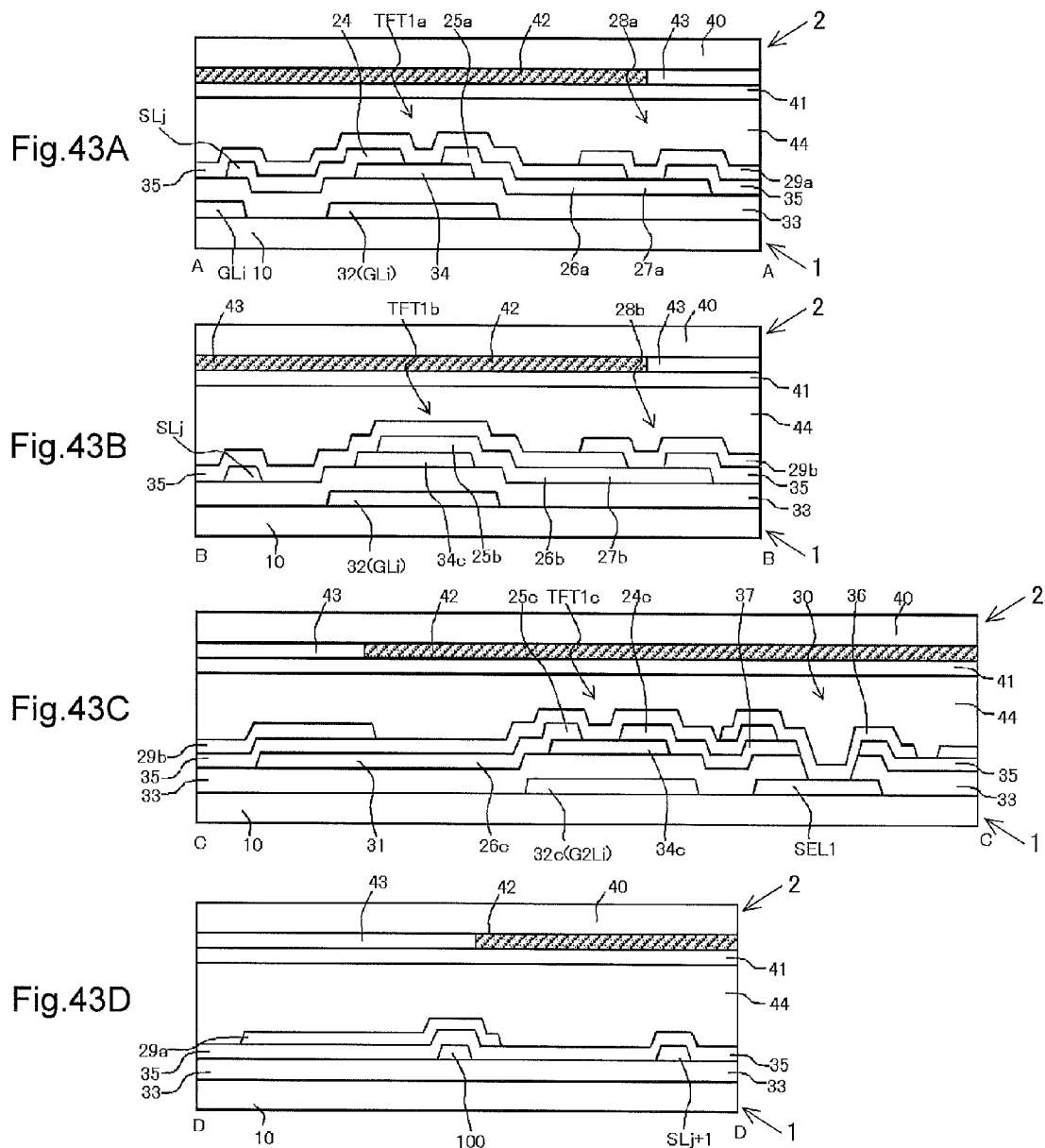
FIG. 43A is a cross-sectional view along line A-A in FIG. 42.
FIG. 43B is a cross-sectional view along line B-B in FIG. 42.
FIG. 43C is a cross-sectional view along line C-C in FIG. 42.
FIG. 43D is a cross-sectional view along line D-D in FIG. 42.

FIG. 43A is a cross-sectional view along line A-A in FIG. 42. FIG. 43B is a cross-sectional view along line B-B in FIG. 42. FIG. 43C is a cross-sectional view along line C-C in FIG. 42. FIG. 43D is a cross-sectional view along line D-D in FIG. 42. In the present embodiment, the holding capacitance lines CSL are not provided on the gate insulation layer 33, as shown in FIG. 43D.

<7.2.3 Equivalent Circuit>

Figure 44:
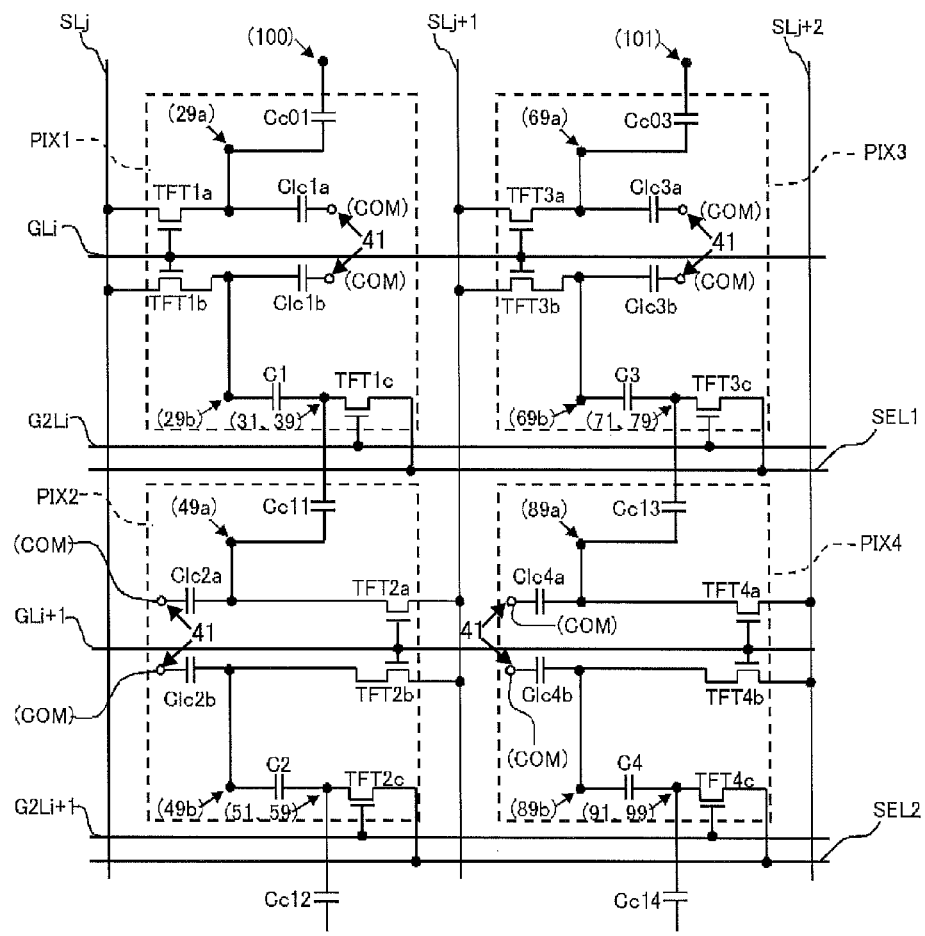
FIG. 44 is an equivalent circuit diagram of pixel formation portions in the seventh embodiment.

FIG. 44 is an equivalent circuit diagram of pixel formation portions in the present embodiment. As described above, the holding capacitance lines CSL are not provided in the present embodiment. Therefore, each pixel formation portion does not include a capacitance formed by a pixel electrode in a first sub-pixel portion and the holding capacitance line CSL and a capacitance formed by a pixel electrode in a second sub-pixel portion and the holding capacitance line CSL.

<7.3 Driving Method>

Next, a driving method according to the present embodiment will be described with reference to FIG. 45 and FIG. 39.

Figure 45:
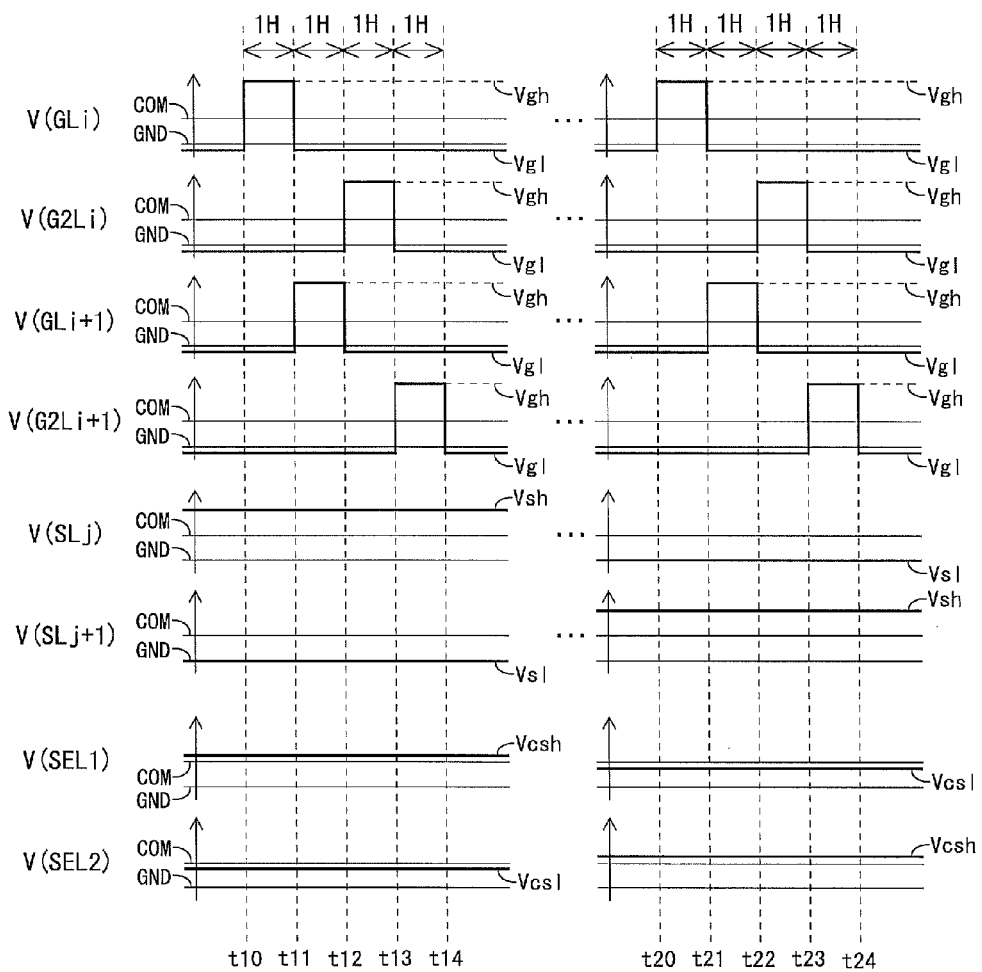
FIG. 45 is a signal waveform diagram for describing a driving method in the seventh embodiment.

As shown in FIG. 45, a first scanning signal line GLi, a second scanning signal line G2Li, a first scanning signal line GLi+1, a second scanning signal line G2Li+1, data signal lines SLj, SLj+1, a first capacitance line SEL1, and a second capacitance line SEL2 are driven in a similar manner to that in the sixth embodiment. Therefore, a potential of a pixel electrode and a potential of a capacitance electrode in each pixel formation portion change in a similar manner to that in the sixth embodiment (see FIG. 39). However, in the present embodiment, K in the Equation (1) as the equation for obtaining a magnitude of $\Delta V$ is obtained by the following equation (4).

$$K=C1/(Clc1b+C1) \tag{4}$$

In the present embodiment, when a size of a capacitance value of the potential varying capacitance C1 is set the same as that in the first to sixth embodiment, for example, a magnitude $\Delta V$ of a potential change of a pixel electrode becomes different from magnitudes in the first to sixth embodiments. Therefore, it is necessary to adjust the size of the capacitance value of the potential varying capacitance C1 such that the potential change of the pixel electrode becomes a desired magnitude.

<7.4 Effect>

According to the present embodiment, in a similar manner to that in the sixth embodiment, in each pixel formation portion, after the same potential is provided to both pixel electrodes of the first sub-pixel portion and pixel electrodes of the second sub-pixel portion, the potential of one sub-pixel portion slightly increases and the potential of the other sub-pixel portion slightly decreases. Therefore, a large effect of viewing angle characteristic improvement can be obtained. Further, a narrow picture-frame by reduction of a wiring region can be realized without reducing a display quality, in a similar manner to that in the first embodiment. Also, because of the configuration that does not have the holding capacitance lines CSL, the wiring region can be effectively reduced, and further narrowing of the frame can be realized.

8. Example of Using Liquid Crystal Display Device for Television Receiver

Figure 46:
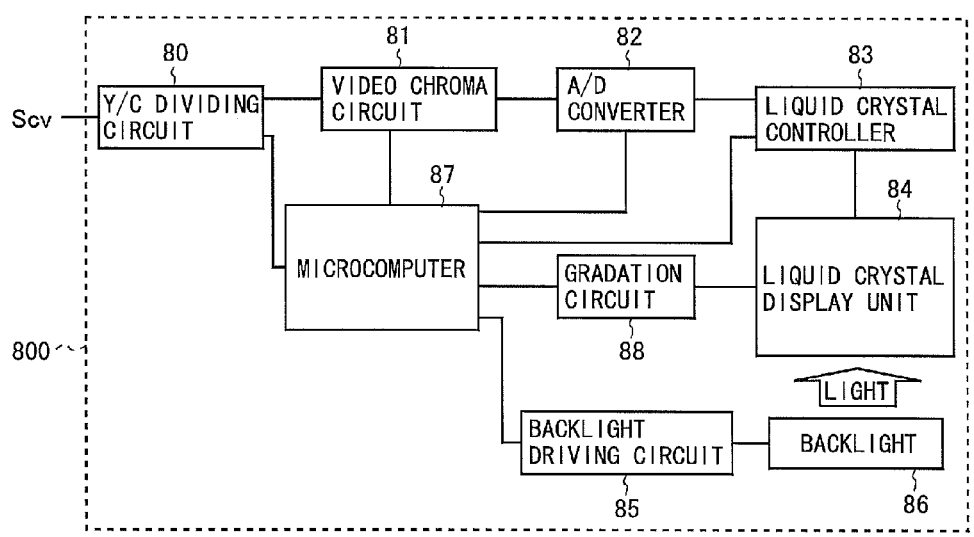
FIG. 46 is a block diagram showing a configuration example of a display device for a television receiver that uses a liquid crystal display device according to the present invention.

Next, an example of a case where a liquid crystal display device according to the present invention is used for a television receiver will be described. FIG. 46 is a block diagram showing a configuration of a display device 800 for a television receiver. The display device 800 includes a Y/C dividing circuit 80, a video chroma circuit 81, an A/D converter 82, a liquid crystal controller 83, a liquid crystal display unit 84, a backlight driving circuit 85, a backlight 86, a microcomputer 87, and a gradation circuit 88. The liquid crystal display unit 84 contains a liquid crystal panel, and a source driver and a gate driver for driving the liquid crystal panel.

In the display device 800 having the above configuration, first, a composite color video signal Scv as a television signal is inputted from an outside to the Y/C dividing circuit 80, and the composite color video signal Scv is divided into brightness signal and a color signal. The brightness signal and the color signal are converted into analog RGB signals corresponding to three primary colors of light by the video chroma circuit 81. Further, the analog RGB signals are converted into digital RGB signals by the A/D converter 82. The digital RGB signals are inputted to the liquid crystal controller 83. In the Y/C dividing circuit 80, a horizontal synchronization signal and a vertical synchronization signal are also taken out from the composite color video signal Scv inputted from the outside. These synchronization signals are also inputted to the liquid crystal controller 83 via the microcomputer 87.

The liquid crystal controller 83 outputs a driver data signal based on the digital RGB signals provided from the A/D converter 82. The liquid crystal controller 83 generates timing control signals for operating the source driver and the gate driver in the liquid crystal display unit 84, based on the synchronization signals, and provides the timing control signals to the source driver and the gate driver. In the gradation circuit 88, respective gradation voltages of three primary colors R, G, B for a color display are generated, and these gradation voltages are also supplied to the liquid crystal display unit 84.

In the liquid crystal display unit 84, drive signals (such as a data signal and a scanning signal) are generated by the source driver and the gate driver at an inside based on the driver data signal, the timing control signal, and the gradation voltage. A color image is displayed on the liquid crystal panel at the inside, based on the drive signals. Note that, to display an image by the liquid crystal display unit 84, light irradiation needs to be performed from behind the liquid crystal panel in the liquid crystal display unit 84. In the display device 800, the backlight driving circuit 85 drives the backlight 86 on the basis of a control of the microcomputer 87 to irradiate a back surface of the liquid crystal panel with light.

Including the above process, control of the system as a whole is performed by the microcomputer 87. Note that, as a video signal (a composite color video signal) inputted from the outside, a video signal picked up by a camera and a video signal supplied via the internet line can be also used, in addition to a video signal based on a television broadcasting. That is, the display device 800 can display an image based on various video signals.

Figure 47:
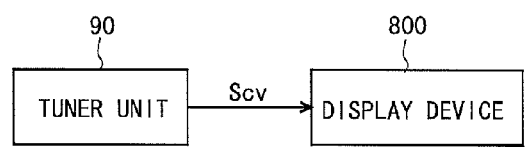
FIG. 47 is a block diagram showing an entire configuration including a tuner unit of a television receiver that uses a liquid crystal display device according to the present invention.

When the display device 800 having the above configuration displays an image based on a television broadcasting, a tuner unit 90 is connected to the display device 800, as shown in FIG. 47. The tuner unit 90 takes out, from receiving waves (high-frequency wave signals) received by an antenna, a signal of a channel to be received, and converts the signal into an intermediate frequency signal. Further, the tuner unit 90 detects the intermediate frequency signal, and takes out the composite color video signal Scv as a television signal. The composite color video signal Scv is inputted to the display device 800 as described above, and the image based on the composite color video signal Scv is displayed by the display device 800.

Figure 48:
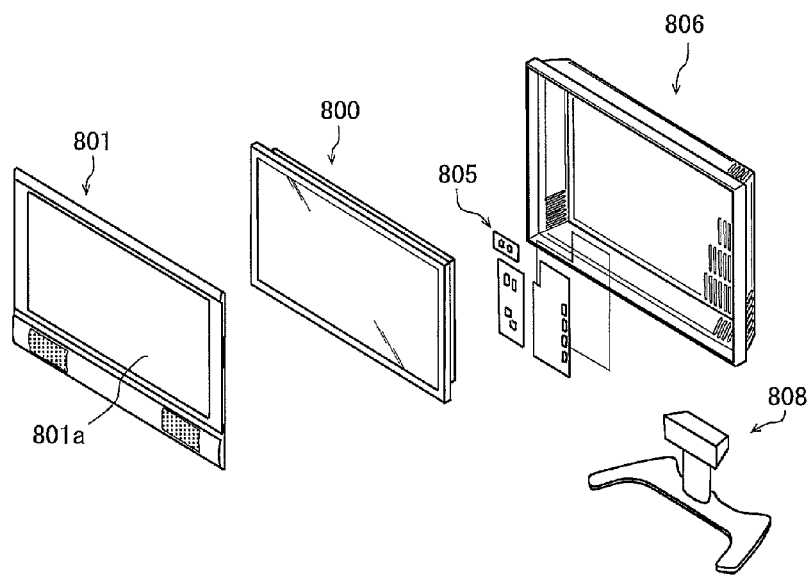
FIG. 48 is an exploded perspective view showing a mechanical configuration of the television receiver.
Figure 49:
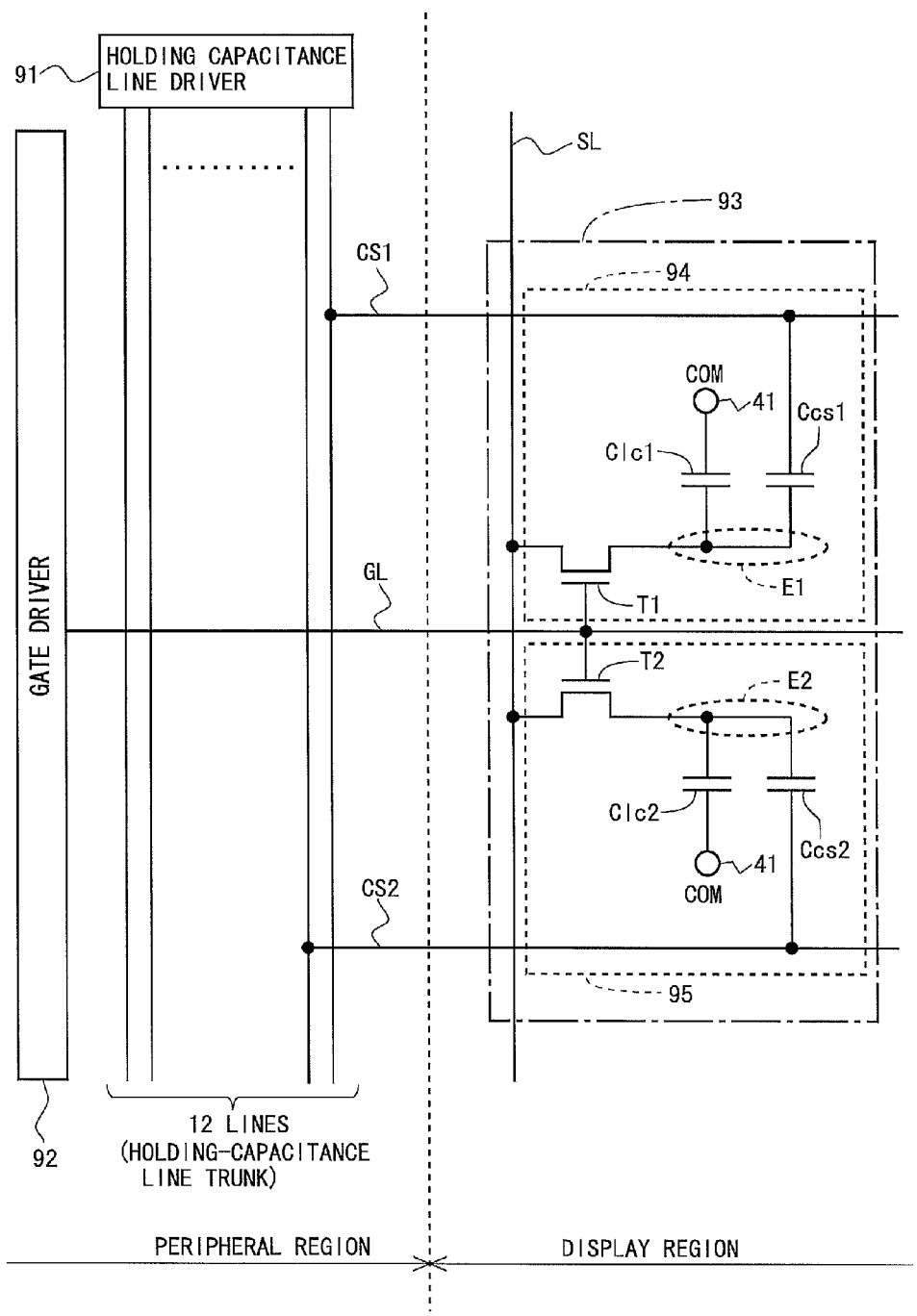
FIG. 49 is a diagram schematically showing an example of a circuit configuration of a liquid crystal display device that employs a pixel division method in a conventional example.
Figure 50:
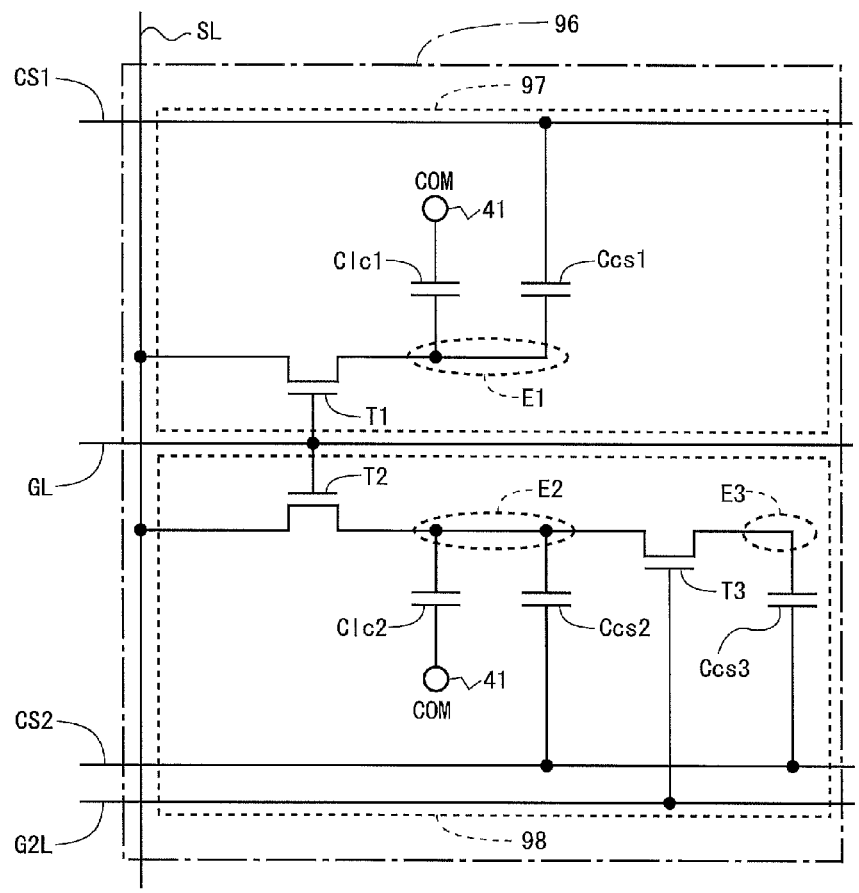
FIG. 50 is an equivalent circuit diagram of another conventional liquid crystal display device that employs a pixel division method.

FIG. 48 is an exploded perspective view showing an example of a mechanical configuration of the display device 800 having the above configuration that is used as a television receiver. In the example shown in FIG. 48, the television receiver has a first casing 801 and a second casing 806 in addition to the display device 800, as constituent elements thereof. The first casing 801 and the second casing 806 are configured to sandwich the display device 800 while surrounding the display device. In the first casing 801, an opening portion 801a for transmitting the image to be displayed by the display device 800 is formed. The second casing 806 is for covering a back surface side of the display device 800, and is configured such that an operation circuit 805 for operating the display device 800 is provided and a supporting member 808 is fitted to a lower side.

9. Others

A configuration in the display region 8 in the seventh embodiment is that the holding capacitance lines CSL are excluded from the configuration in the sixth embodiment. In a similar manner to this, a configuration that the holding capacitance lines CSL are excluded from the configurations in the first to fifth embodiments can be also employed. Accordingly, also in the first to fifth embodiments, a wiring region can be effectively reduced, and further narrowing of the frame can be realized.

DESCRIPTION OF REFERENCE CHARACTERS

1: ACTIVE MATRIX SUBSTRATE
8: DISPLAY REGION
9: PERIPHERAL REGION
10: GLASS SUBSTRATE (OF ACTIVE MATRIX SUBSTRATE)
11: LIQUID CRYSTAL PANEL
18: HOLDING-CAPACITANCE LINE TRUNK
19: FIRST CAPACITANCE LINE TRUNK
20: SECOND CAPACITANCE LINE TRUNK
29a, 29b, 49a, 49b, 69a, 69b, 89a, 89b: PIXEL ELECTRODE
31, 51, 71, 91: CAPACITANCE ELECTRODE
PIX1 to PIX4: PIXEL FORMATION PORTION
PIX1A to PIX4A: FIRST SUB-PIXEL PORTION
PIX1B to PIX4B: SECOND SUB-PIXEL PORTION
GL1 to GLm: FIRST SCANNING SIGNAL LINE
G2L1 to G2Lm: SECOND SCANNING SIGNAL LINE
SL1 to SLn: DATA SIGNAL LINE
CSL: HOLDING CAPACITANCE LINE
SEL1: FIRST CAPACITANCE LINE

The invention claimed is:

1. A liquid crystal display device in which a pixel formation portion forming one pixel includes a first sub-pixel portion and a second sub-pixel portion, the liquid crystal display device comprising:
  a plurality of data signal lines;
  a plurality of first scanning signal lines that are provided to cross the plurality of data signal lines, and are selectively driven;
  a plurality of the pixel formation portions that are respectively provided to correspond to intersections of the plurality of data signal lines and the plurality of first scanning signal lines, and form a pixel matrix;
  a plurality of second scanning signal lines that are provided to correspond to the plurality of first scanning signal lines, and are selectively driven;
  a plurality of potential varying capacitance lines; and
  a common electrode, wherein
  the first sub-pixel portion includes
    a first switching element having a first electrode connected to the first scanning signal line and having a second electrode connected to the data signal line, and being in an on state when the first scanning signal line is selected, and
    a first pixel electrode connected to a third electrode of the first switching element and laid out such that a capacitance is formed between the first pixel electrode and the common electrode,
  the second sub-pixel portion includes
    a second switching element having a first electrode connected to the first scanning signal line and having a second electrode connected to the data signal line, and being in an on state when the first scanning signal line is selected,
    a second pixel electrode connected to a third electrode of the second switching element and laid out such that a capacitance is formed between the second pixel electrode and the common electrode,
    a third switching element having a first electrode connected to the second scanning signal line and having a second electrode connected to one of the potential varying capacitance lines, and being in an on state when the second scanning signal line is selected, and a potential varying capacitance electrode connected to a third electrode of the third switching element and laid out such that a capacitance is formed between the potential varying capacitance electrode and the second pixel electrode, and during each frame period, a second scanning signal line corresponding to each row in the pixel matrix is selected after a first scanning signal line corresponding to the each row is selected.

2. The liquid crystal display device according to claim 1, wherein
a different potential is provided every one frame period to the potential varying capacitance line.

3. The liquid crystal display device according to claim 1, wherein
the potential varying capacitance line is arranged to extend to a direction parallel with a direction to which the data signal line extends,
the first scanning signal line is arranged to pass between the first pixel electrode and the second pixel electrode in each row in the pixel matrix,
the second scanning signal line is arranged to pass between adjacent two rows in the pixel matrix, and
the first pixel electrode and the second pixel electrode included in a pixel formation portion in each column in the pixel matrix are laid out between the data signal line and the potential varying capacitance line.

4. The liquid crystal display device according to claim 1, wherein
the potential varying capacitance line is arranged to extend to a direction parallel with a direction to which the data signal line extends,
the first scanning signal line and the second scanning signal line are arranged to pass between adjacent two rows in the pixel matrix, and
the first pixel electrode and the second pixel electrode included in a pixel formation portion in each column in the pixel matrix are laid out between the data signal line and the potential varying capacitance line.

5. The liquid crystal display device according to claim 1, wherein
the potential varying capacitance line is arranged to extend to a direction parallel with a direction to which the first scanning signal line extends,
the first scanning signal line is arranged to pass between the first pixel electrode and the second pixel electrode in each row in the pixel matrix,
the second scanning signal line and the potential varying capacitance line are arranged to pass between adjacent two rows in the pixel matrix, and
the first pixel electrode and the second pixel electrode included in a pixel formation portion in each column in the pixel matrix are laid out between adjacent two of the data signal lines.

6. The liquid crystal display device according to claim 5, wherein
the potential varying capacitance electrode included in a pixel formation portion in each row in the pixel matrix is laid out such that a capacitance is formed between the potential varying capacitance electrode and the first pixel electrode included in a pixel formation portion in the next row of the each row,
in each column in the pixel matrix, a data signal line arranged at one side of the each column and a data signal line arranged at the other side in the each column are alternately connected for each one row to the second electrodes of the first switching element and the second switching element in the pixel formation portion, and
a second scanning signal line corresponding to each row in the pixel matrix is selected after a first scanning signal line corresponding to the next row of the each row is selected.

7. The liquid crystal display device according to claim 1, wherein
the data signal line includes a first data signal line and a second data signal line in each column in the pixel matrix,
the potential varying capacitance line is arranged to extend to a direction parallel with a direction to which the first scanning signal line extends,
the first scanning signal line is arranged to pass between the first pixel electrode and the second pixel electrode in each row in the pixel matrix,
the second scanning signal line and the potential varying capacitance line are arranged to pass between adjacent two rows in the pixel matrix,
the first pixel electrode and the second pixel electrode included in a pixel formation portion in each column in the pixel matrix are laid out between the first data signal line and the second data signal line,
in each column in the pixel matrix, the first data signal line and the second data signal line are alternately connected for each one row to the second electrodes of the first switching element and the second switching element in the pixel formation portion,
the potential varying capacitance electrode included in a pixel formation portion in each row in the pixel matrix is laid out such that a capacitance is formed between the potential varying capacitance electrode and the first pixel electrode included in a pixel formation portion in the next row of the each row,
the plurality of first scanning signal lines are sequentially driven for each one set by using two first scanning signal lines as one set, and
two second scanning signal lines corresponding to two first scanning signal lines that constitute each one set are selected after two first scanning signal lines that constitute a set which is driven next to the each set are selected.

8. The liquid crystal display device according to claim 1, wherein
the potential varying capacitance line includes a first potential varying capacitance line and a second potential varying capacitance line,
the first potential varying capacitance line and the second potential varying capacitance line are provided to alternately correspond to the pixel matrix for each one row or for each one column,
a second potential of a relatively low level is provided to the second potential varying capacitance line when a first potential of a relatively high level is provided to the first potential varying capacitance line, and
the first potential is provided to the second potential varying capacitance line when the second potential is provided to the first potential varying capacitance line.

9. The liquid crystal display device according to claim 1, further comprising a plurality of holding capacitance lines to which a constant potential is provided, wherein
in the first sub-pixel portion, a capacitance is formed by the holding capacitance line and the first pixel electrode, and in the second sub-pixel portion, a capacitance is formed by the holding capacitance line and the second pixel electrode.

10. The liquid crystal display device according to claim 9, wherein
the holding capacitance line is arranged to extend to a direction parallel with a direction to which the data signal line extends.

11. The liquid crystal display device according to claim 9, wherein
the holding capacitance line is arranged to extend to a direction parallel with a direction to which the first scanning signal line extends.

12. The liquid crystal display device according to claim 10, wherein
the potential varying capacitance line
includes a first potential varying capacitance line and a second potential varying capacitance line, and
is arranged to extend to a direction parallel with a direction to which the data signal line extends,
the first potential varying capacitance line and the second potential varying capacitance line are provided to alternately correspond to the pixel matrix for each one column,
a second potential of a relatively low level is provided to the second potential varying capacitance line when a first potential of a relatively high level is provided to the first potential varying capacitance line,
the first potential is provided to the second potential varying capacitance line when the second potential is provided to the first potential varying capacitance line,
the first scanning signal line is arranged to pass between the first pixel electrode and the second pixel electrode in each row in the pixel matrix,
the second scanning signal line is arranged to pass between adjacent two rows in the pixel matrix, and
the first pixel electrode and the second pixel electrode included in a pixel formation portion in each column in the pixel matrix are laid out between the data signal line and the potential varying capacitance line.

13. The liquid crystal display device according to claim 10, wherein
the potential varying capacitance line
includes a first potential varying capacitance line and a second potential varying capacitance line, and
is arranged to extend to a direction parallel with a direction to which the data signal line extends,
the first potential varying capacitance line and the second potential varying capacitance line are provided to alternately correspond to the pixel matrix for each one column,
a second potential of a relatively low level is provided to the second potential varying capacitance line when a first potential of a relatively high level is provided to the first potential varying capacitance line,
the first potential is provided to the second potential varying capacitance line when the second potential is provided to the first potential varying capacitance line,
the first scanning signal line and the second scanning signal line are arranged to pass between adjacent two rows in the pixel matrix, and
the first pixel electrode and the second pixel electrode included in a pixel formation portion in each column in the pixel matrix are laid out between the data signal line and the potential varying capacitance line.

14. The liquid crystal display device according to claim 10, wherein
the potential varying capacitance line
includes a first potential varying capacitance line and a second potential varying capacitance line, and
is arranged to extend to a direction parallel with a direction to which the first scanning signal line extends,
the first potential varying capacitance line and the second potential varying capacitance line are provided to alternately correspond to the pixel matrix for each one row,
a second potential of a relatively low level is provided to the second potential varying capacitance line when a first potential of a relatively high level is provided to the first potential varying capacitance line,
the first potential is provided to the second potential varying capacitance line when the second potential is provided to the first potential varying capacitance line,
the first scanning signal line is arranged to pass between the first pixel electrode and the second pixel electrode in each row in the pixel matrix,
the second scanning signal line and the potential varying capacitance line are arranged to pass between adjacent two rows in the pixel matrix, and
the first pixel electrode and the second pixel electrode included in a pixel formation portion in each column in the pixel matrix are laid out between adjacent two of the data signal lines.

15. The liquid crystal display device according to claim 10, wherein
the potential varying capacitance line
includes a first potential varying capacitance line and a second potential varying capacitance line, and
is arranged to extend to a direction parallel with a direction to which the first scanning signal line extends,
the first potential varying capacitance line and the second potential varying capacitance line are provided to alternately correspond to the pixel matrix for each one row,
a second potential of a relatively low level is provided to the second potential varying capacitance line when a first potential of a relatively high level is provided to the first potential varying capacitance line,
the first potential is provided to the second potential varying capacitance line when the second potential is provided to the first potential varying capacitance line,
the data signal line includes a first data signal line and a second data signal line in each column in the pixel matrix,
the first scanning signal line is arranged to pass between the first pixel electrode and the second pixel electrode in each row in the pixel matrix,
the second scanning signal line and the potential varying capacitance line are arranged to pass between adjacent two rows in the pixel matrix,
the first pixel electrode and the second pixel electrode included in a pixel formation portion in each column in the pixel matrix are laid out between the first data signal line and the second data signal line,
in each column in the pixel matrix, the first data signal line and the second data signal line are alternately connected for each one row to the second electrodes of the first switching element and the second switching element in the pixel formation portion,
the potential varying capacitance electrode included in a pixel formation portion in each row in the pixel matrix is laid out such that a capacitance is formed between the potential varying capacitance electrode and the first pixel electrode included in a pixel formation portion in the next row of the each row, the plurality of first scanning signal lines are sequentially driven for each one set by using two first scanning signal lines as one set, and two second scanning signal lines corresponding to two first scanning signal lines that constitute each one set are selected after two first scanning signal lines that constitute a set which is driven next to the each set are selected.

16. The liquid crystal display device according to claim 11, wherein the potential varying capacitance line
includes a first potential varying capacitance line and a second potential varying capacitance line, and
is arranged to extend to a direction parallel with a direction to which the data signal line extends, the first potential varying capacitance line and the second potential varying capacitance line are provided to alternately correspond to the pixel matrix for each one row, a second potential of a relatively low level is provided to the second potential varying capacitance line when a first potential of a relatively high level is provided to the first potential varying capacitance line, the first potential is provided to the second potential varying capacitance line when the second potential is provided to the first potential varying capacitance line, the first scanning signal line is arranged to pass between the first pixel electrode and the second pixel electrode in each row in the pixel matrix, the second scanning signal line is arranged to pass between adjacent two rows in the pixel matrix, and the first pixel electrode and the second pixel electrode included in a pixel formation portion in each column in the pixel matrix are laid out between the data signal line and the potential varying capacitance line.

17. The liquid crystal display device according to claim 1, wherein the potential varying capacitance line
includes a first potential varying capacitance line and a second potential varying capacitance line, and
is arranged to extend to a direction parallel with a direction to which the first scanning signal line extends, the first potential varying capacitance line and the second potential varying capacitance line are provided to alternately correspond to the pixel matrix for each one row, a second potential of a relatively low level is provided to the second potential varying capacitance line when a first potential of a relatively high level is provided to the first potential varying capacitance line, the first potential is provided to the second potential varying capacitance line when the second potential is provided to the first potential varying capacitance line, the first scanning signal line is arranged to pass between the first pixel electrode and the second pixel electrode in each row in the pixel matrix, the second scanning signal line and the potential varying capacitance line are arranged to pass between adjacent two rows in the pixel matrix, the first pixel electrode and the second pixel electrode included in a pixel formation portion in each column in the pixel matrix are laid out between adjacent two of the data signal lines, the potential varying capacitance electrode included in a pixel formation portion in each row in the pixel matrix is laid out such that a capacitance is formed between the potential varying capacitance electrode and the first pixel electrode included in a pixel formation portion in the next row of the each row, in each column in the pixel matrix, a data signal line arranged at one side of the each column and a data signal line arranged at the other side in the each column are alternately connected for each one row to the second electrodes of the first switching element and the second switching element in the pixel formation portion, and a second scanning signal line corresponding to each row in the pixel matrix is selected after a first scanning signal line corresponding to the next row of the each row is selected.

18. The liquid crystal display device according to claim 17, further comprising a plurality of holding capacitance lines to which a constant potential is provided, wherein in the first sub-pixel portion, a capacitance is formed by the holding capacitance line and the first pixel electrode, and in the second sub-pixel portion, a capacitance is formed by the holding capacitance line and the second pixel electrode, and the holding capacitance line is arranged to extend to a direction parallel with a direction to which the data signal line extends.

19. The liquid crystal display device according to claim 1, wherein the first switching element, the second switching element, and the third switching element are thin-film transistors made of a metal oxide semiconductor.

20. The liquid crystal display device according to claim 19, wherein a driving frequency is equal to or higher than 240 Hz.

21. The liquid crystal display device according to claim 19, wherein the metal oxide semiconductor is an In—Ga—Zn—O based semiconductor (IGZO).

* * * * *